United States Patent
Awamura et al.

(10) Patent No.: US 7,387,455 B2
(45) Date of Patent: Jun. 17, 2008

(54) SUBSTRATE PROCESSING DEVICE, SUBSTRATE PROCESSING METHOD, AND DEVELOPING DEVICE

(75) Inventors: Tetsutoshi Awamura, Kikuchi-gun (JP); Yukio Kiba, Kikuchi-gun (JP); Keiichi Tanaka, Kikuchi-gun (JP); Takahiro Okubo, Kikuchi-gun (JP); Shuuichi Nishikido, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 504 days.

(21) Appl. No.: 10/515,635

(22) PCT Filed: May 16, 2003

(86) PCT No.: PCT/JP03/06149

§ 371 (c)(1),
(2), (4) Date: Dec. 7, 2004

(87) PCT Pub. No.: WO03/105201

PCT Pub. Date: Dec. 18, 2003

(65) Prior Publication Data

US 2005/0223980 A1    Oct. 13, 2005

(30) Foreign Application Priority Data

Jun. 7, 2002 (JP) ............... 2002-166941
Jun. 7, 2002 (JP) ............... 2002-167565

(51) Int. Cl.
*H01L 21/302* (2006.01)

(52) U.S. Cl. ............ 396/631; 438/8; 438/690; 438/691; 438/748; 427/240; 399/237; 399/238; 399/249; 396/564; 396/604; 396/611; 396/627

(58) Field of Classification Search ............... 399/237; 396/611, 604, 607, 609, 564, 625, 627, 631; 134/88, 94.1; 427/240
See application file for complete search history.

(56) References Cited

U.S. PATENT DOCUMENTS

| | | | | |
|---|---|---|---|---|
| 5,538,921 A | * | 7/1996 | Obeng | ............ 438/696 |
| 5,689,749 A | * | 11/1997 | Tanaka et al. | ............ 396/611 |
| 5,854,953 A | * | 12/1998 | Semba | ............ 396/611 |
| 5,866,307 A | | 2/1999 | Kiba et al. | |
| 5,871,584 A | | 2/1999 | Tateyama et al. | |
| 5,919,520 A | | 7/1999 | Tateyama et al. | |
| 6,203,218 B1 | | 3/2001 | Omori et al. | |
| 6,267,516 B1 | | 7/2001 | Nagamine et al. | |

(Continued)

FOREIGN PATENT DOCUMENTS

JP    62-187680    11/1987

(Continued)

*Primary Examiner*—W. B. Perkey
*Assistant Examiner*—Michael A Strieb
(74) *Attorney, Agent, or Firm*—Oblon, Spivak, McClelland, Maier & Neustadt, P.C.

(57) ABSTRACT

Rinsing nozzles 310a to 310e are moved on a wafer W while they are discharging rinsing solution 326. At that point, discharging openings 317a to 317e are contacted to developing solution 350 coated on the wafer W or rinsing solution 326 on the wafer W. Thus, the impact against the wafer W can be suppressed. As a result, pattern collapse can be prevented. In addition, a front portion of the developing solution 350 can push away the developing solution 350.

50 Claims, 35 Drawing Sheets

U.S. PATENT DOCUMENTS

| | | |
|---|---|---|
| 6,284,043 B1 | 9/2001 | Takekuma |
| 6,364,547 B1 | 4/2002 | Matsuyama et al. |
| 6,517,999 B1 * | 2/2003 | Oya et al. .................. 430/329 |
| 6,533,864 B1 | 3/2003 | Matsuyama et al. |
| 6,565,928 B2 | 5/2003 | Sakamoto et al. |
| 2001/0043813 A1 * | 11/2001 | Kitamura ................... 396/564 |
| 2002/0115022 A1 * | 8/2002 | Messick et al. ............ 430/311 |

FOREIGN PATENT DOCUMENTS

| | | |
|---|---|---|
| JP | 05-315240 | 11/1993 |
| JP | 07-142349 | 6/1995 |
| JP | 10-020508 | 1/1998 |
| JP | 10-092784 | 4/1998 |
| JP | 11-262718 | 9/1999 |
| JP | 2000-153210 | 6/2000 |
| JP | 2000-195773 * | 7/2000 |
| JP | 2000195773 * | 7/2000 |
| JP | 2000269110 * | 9/2000 |
| JP | 2001-284207 | 10/2001 |
| JP | 2002-260985 | 9/2002 |
| JP | 2003-218020 * | 7/2003 |
| WO | WO 01/66260 * | 9/2001 |
| WO | WO 01/66260 A2 * | 9/2001 |

* cited by examiner

SUBSTRATE PROCESSING DEVICE, SUBSTRATE PROCESSING METHOD, AND DEVELOPING DEVICE

TECHNICAL FIELD

The present invention relates to a substrate processing apparatus and a substrate processing method for performing a developing process for a semiconductor substrate at a photolithography step for producing a semiconductor device and to a developing apparatus for performing a developing process using developing solution for a substrate on which resist has been coated and a developing process has been performed.

BACKGROUND OF THE INVENTION

At a photolithography step upon production of a semiconductor device, photoresist is coated on the front surface of a semiconductor wafer (hereinafter referred to as "wafer"). Thereafter, a mask pattern is exposed on the resist and developed. As a result, a resist pattern is formed on the front surface of the wafer.

At such a photolithography step, the developing process is performed by for example a paddle method or a dip method. In the paddle method, developing solution is supplied to a wafer. On the other hand, in the dip method, a wafer is dipped in developing solution. In the state, the developing process is promoted. Thereafter, rinsing solution such as pure water as washing solution is supplied onto the wafer so as to wash away the developing solution. Finally, a drying process for blowing air to the wafer or rotating the wafer is performed so as to remove the rinsing solution from the wafer.

When the resist is for example negative type, a light-exposed portion is hardened. Thus, a non-hardened portion, namely a dissolvable portion of the resist, is dissolved with the developing solution. In contrast, when the resist is for example positive type, the light-exposed portion is dissolved with the developing solution.

Next, how for example negative type resist is developed will be described. As shown in FIG. 34, developing solution is applied onto resist 210 coated on the front surface of for example a wafer W for which an exposing process has been performed. Thereafter, the wafer W is kept for a predetermined time period. A dissolvable portion 211 dissolves in the developing solution. Thereafter, washing solution is supplied onto the front surface of the wafer W so as to wash away the developing solution from the wafer W. Thereafter, the wafer W is dried. As a result, a resist pattern 212 is obtained.

As shown in FIG. 35(a), the wafer for which the exposing process has been performed is held in a nearly horizontal position. Thereafter, the wafer W is placed on a spin chuck 213 that is rotatable around the vertical axis. In this state, the developing process is performed. First of all, developing solution D is coated on the entire front surface of the wafer W. Thereafter, the wafer W is stationary-developed for a predetermined time period, for example 60 seconds, so as to promote the developing reaction. After the predetermined time period has elapsed, as shown in FIG. 35(b), washing solution R such as pure water is supplied from a washing solution nozzle 214 that faces for example a center portion of the front surface of the wafer. In addition, the wafer W is rotated at a peripheral velocity of around 1000 rpm. With an action of centrifugal force, the developing solution D that contains a resist dissolvable component is washed away. Finally, as shown in FIG. 35(c), the wafer W is rotated at high speed so as to dry it.

However, since the size of the wafer W is becoming large in recent years, in the conventional method of which the wafer W is rotated and with an action of centrifugal force the developing solution D is washed away from the wafer W, the difference between the centrifugal force that acts at a periphery portion of the wafer W and the centrifugal force that acts at a center portion of the wafer W is large. Thus, the center portion at which the centrifugal force is weak may be insufficiently washed. In other words, the dissolvable component of the resist at a valley portion of the resist pattern has a high concentration and contains deposit of a resist component that has been dissolved, undissolved resist particles, and so forth. In other words, the dissolvable component may be in so-called muddy state. When the centrifugal force is low, frictional force of the deposit against for example the front surface of the wafer W and the wall surface of the resist pattern more strongly acts than the centrifugal force. As a result, even if the wafer W is rotated, the deposit may not be shaken off, but left. If the wafer W is dried with the deposit that adheres on the front surface of the pattern (the front surface of the resist or the front surface of the base material), there is a possibility of which a development defect takes place.

On the other hand, a method for strengthening the centrifugal force at the center portion of the wafer W with an increased number of rotations thereof has been studies. However, in this method, since the centrifugal force at the periphery portion of the wafer W is too strong, there is a possibility of which a resist pattern thereon peels off or collapses.

Moreover, in recent years, semiconductor devices are further becoming miniaturized. A resist pattern that is finely structured and that has a high aspect ratio has come out. Since a resist pattern is finely structure and has a high aspect ratio, when rinsing solution passes through patterns, surface tension of the rinsing solution causes pulling force to take place between the patterns. So-called a problem of "pattern collapse" takes place. As countermeasures against such a problem, a method of which the surface tension of rinsing solution is weakened with surfactant mixed with the rinsing solution is known. The method requires that the rinsing solution should be equally supplied onto the substrate. However, there is a problem of which the rinsing solution is not equally replaced with the developing solution.

If surfactant contains impurities such as particles, when the rinsing solution that contains the surfactant is supplied onto the substrate, there is a possibility of which a product defect takes place.

DISCLOSURE OF THE INVENTION

The present invention was made under such a situation. An object of the present invention is to provide a technology that allows a development defect to decrease and developing solution to be washed away in a short time.

Another object of the present invention is to provide a substrate processing apparatus and a substrate processing method that allow rinsing solution to be equally supplied onto a substrate so as to wash away processing solution such as developing solution.

Another object of the present invention is to provide a substrate processing apparatus and a substrate processing method that allow for example dissolvable substance of resist contained in processing solution or impurities contained in rinsing solution to be prevented from adhering to a substrate.

To accomplish the foregoing object, a first aspect of a substrate processing apparatus according to the present invention comprises an elongated washing nozzle, having a discharging opening, for discharging washing solution onto the front surface of a substrate on which processing solution has been coated; and distance keeping means for keeping the distance between the discharging opening and the front surface of the substrate constant so as to contact the discharging opening to the processing solution when the washing solution is discharged from the washing nozzle.

According to the present invention, the washing nozzle is formed in an elongated shape. In this case, a plurality of for example nearly circular discharging openings are disposed in a longitudinal direction of the washing nozzle. Alternatively, an elongated discharging opening is disposed in the longitudinal direction of the washing nozzle. Alternatively, a nearly circular discharging opening and an elongated discharging opening may be disposed in one washing nozzle. These apply to the following description. According to the present invention, when the washing nozzle discharges washing solution onto the substrate on which processing solution has been supplied, the washing solution can be equally spread onto the substrate. As a result, the pattern collapse can be prevented. In addition, since the washing nozzle can discharge washing solution in a wide area at a time, the washing time period can be shortened. The processing solution is for example developing solution. However, the processing solution conceptually includes for example pure water that is supplied onto the substrate on which the developing solution has been supplied. In this case, after the developing solution is replaced with the pure water, the washing solution of the present invention can be supplied onto the substrate so as to equally replace the pure water with the washing solution. In addition, according to the present invention, while the discharging opening of the washing nozzle is in contact with the processing solution, the washing solution can be supplied. Since the discharging opening is in contact with the processing solution, the washing solution discharged from the discharging opening is continuously unified with the processing solution. The washing solution that flows spreads in the entire processing solution. As a result, the impact of the washing solution against the substrate can be suppressed. Thus, since the impact against the substrate can be suppressed, the pattern collapse can be prevented. According to the present invention, "washing" conceptually includes rinse. Thus, "washing solution" conceptually includes rinsing solution. They apply to the following description.

According to an aspect of the present invention, the distance keeping means is configured to keep the distance between the discharging opening and the front surface of the substrate at 0.4 mm or less.

Such a structure securely causes the discharging opening to be in contact with the processing solution.

An aspect of the present invention further comprises moving means for moving the washing nozzle nearly in parallel with the front surface of the substrate and nearly perpendicular to the elongated washing nozzle while the washing nozzle is discharging the washing solution.

With such a structure, when the discharging nozzle discharges the washing solution while it is being moved, a convection current takes place on the substrate. Thus, the washing solution can be spread. Since the washing solution is spread, impurities can be removed. However, the convection current may circulate the processing solution or impurities on the substrate. As a result, the impurities may not be washed away. When the discharging opening is in contact with the processing solution, the impurities that circulate can be pushed away. As a result, the impurities can be removed from the substrate. Thus, the substrate can be effectively washed.

According to an aspect of the present invention, a plurality of washing nozzles are disposed. The plurality of washing nozzles are disposed at nearly constant intervals in the direction of which the washing muzzles are moved by the moving means.

When the washing nozzle discharges the washing solution while the washing nozzle is being moved, a convection current takes place on the substrate. As a result, the washing solution can be spread. Since the washing solution is spread, impurities can be removed. When a plurality of washing nozzles discharge washing solution, an convection current that takes place with washing solution that one washing nozzle discharges may cancel a convection current that takes place with washing solution that the adjacent washing nozzle discharges. According to the present invention, since washing nozzles are disposed at nearly constant intervals in the direction of which they are moved, convection currents of washing solution can be prevented from being cancelled. Thus, the impurities can be effectively removed.

An aspect of the present invention further comprises flow amount adjusting means for adjusting the flow amounts of the washing solutions discharged from the washing nozzles.

With such a structure, the flow amount of washing solution can be adjusted for each washing nozzle. Thus, the substrate can be effectively washed.

According to an aspect of the present invention, the flow amounts of the washing solution discharged from the plurality of washing nozzles are gradually increased in the order from the forward washing nozzle to the backward washing nozzle in the direction of which the washing nozzles are moved.

When the flow amount of washing solution discharged from a discharge nozzle is large, the washing effect becomes large. On the other hand, when the processing solution is developing solution, it is alkaline solution whose pH value is normally around 12. Thus, if pure water whose pH value as washing solution is around 7 is suddenly discharged into such developing solution, a pH shock will take place. The pH shock is a phenomenon of which when two types of solutions whose pH values are largely different, for example developing solution and pure water, are mixed, impurities re-adhere to the substrate. With the structure according to the present invention, the flow amounts can be gradually increased in the order from the forward washing nozzle to the backward washing nozzle in the moving direction thereof. Thus, the high pH value of the processing solution can be gradually decreased. As a result, since the pH value is not suddenly varied, the pH shock can be suppressed. Consequently, the substrate can be effectively washed.

According to an aspect of the present invention, pH values of the washing solutions discharged from the plurality of washing nozzles are gradually decreased in the order from the forward washing nozzle to the backward washing nozzle in the direction of which the washing nozzles are moved.

With such a structure, since the pH values of the washing solutions are gradually decreased in the order from the forward washing nozzle to the backward washing nozzle in the moving direction thereof, the pH values of the processing solution can be gradually decreased. When the processing solution is developing solution, if the pH value of the developing solution that is normally used is alkaline solution whose pH value is around 12, the pH value is not suddenly varied. Thus, the pH shock can be suppressed. As a result, the substrate can be effectively washed.

According to an aspect of the present invention, the length of the washing nozzle is nearly the same as the diameter of the substrate.

With such a structure, the amount of the washing solution that is used can be decreased. In addition, the size of the washing nozzle can be decreased. Thus, the cost of the apparatus can be reduced.

An aspect of the present invention further comprises a sucking nozzle for sucking the washing solution that has been discharged by the washing nozzle and that resides on the substrate.

As described above, impurities may drift in washing solution that has been discharged from the washing nozzle and that resides on the substrate. After time elapses, the impurities will deposit and reside on the front surface of the wafer. According to the present invention, since the impurities can be sucked along with the washing solution, the impurities can be prevented from residing on the front surface of the substrate. Thus, the substrate can be effectively washed.

According to an aspect of the present invention, a plurality of washing nozzles are disposed. The washing nozzles and the sucking nozzle are alternately disposed in the direction of which the washing nozzles and the sucking nozzle are moved.

With such a structure, processing solution, washing solution, impurities that deposit on the front surface of the substrate, impurities that are dispersed by impact of discharged washing solution, and so forth can be immediately sucked. In addition, when the washing solution is sucked, the substrate can be easily dried. Moreover, when the washing nozzles and sucking nozzles are alternately disposed, the distance between two washing nozzles can be kept. Thus, the processes can be effectively performed.

According to an aspect of the present invention, a plurality of washing nozzles are disposed. The plurality of washing nozzles are disposed in the direction of which the washing nozzles are moved. The sucking nozzle is preceded by the washing nozzles in the direction of which the sucking nozzle and the washing nozzles are moved.

In such a manner, a plurality of washing nozzles and a plurality of sucking nozzles can be disposed as respective blocks.

According to an aspect of the present invention, the washing solution contains non-ionic surfactant that weakens surface tension of the washing solution.

With such a structure, since washing solution containing non-ionic surfactant is discharged, the surface tension of the washing solution can be suppressed. Thus, the pattern collapse can be prevented.

A second aspect of a substrate processing apparatus according to the present invention comprises means for supplying processing solution onto a substrate; and an elongated nozzle for discharging rinsing solution containing first processing agent that weakens surface tension of the rinsing solution onto the substrate on which the processing solution has been supplied.

According to the present invention, since the elongated nozzle discharges the rinsing solution whose surface tension is weakened onto the substrate on which the processing solution has been supplied, the rinsing solution can be equally spread onto the substrate. As a result, the pattern collapse can be prevented. The processing solution is for example developing solution. However, the processing solution conceptually includes for example pure water that is supplied onto the substrate on which the developing solution has been supplied. In this case, after the developing solution is replaced with the pure water, the rinsing solution of the present invention can be supplied onto the substrate so as to equally replace the pure water with the washing solution. In addition, as the first processing agent, non-ionic surfactant can be used.

According to an embodiment of the present invention, the rinsing solution contains second processing agent that disperses impurities that reside in the processing solution and the rinsing solution. Conventionally, when rinsing solution that contains impurities is supplied onto a substrate, there is a high possibility of which the impurities gather and adhere to a resist pattern. However, according to the present invention, since the second processing agent disperses the impurities, the rinsing solution flows from the substrate along with impurities. Thus, such a problem does not take place. In this example, as the second processing agent, negative-ionic surfactant can be used.

An aspect of the present invention further comprises a mechanism for moving the nozzle at least horizontally on the substrate in a direction perpendicular to the longitudinal direction of the nozzle. The rinsing solution is discharged while the nozzle is being moved by the moving mechanism. Thus, while the processing solution is gradually replaced with the rinsing solution, it can be equally supplied onto the entire surface of the substrate. When the length of the nozzle is nearly the same as the diameter of the substrate or larger than the diameter of the substrate, the rinsing solution can be more equally supplied. It is preferred that a discharging amount of the rinsing solution should be in the range from 40 ml to 500 ml per substrate. If the discharging amount of the rinsing solution exceeds 500 ml, the flow rate thereof may increase. As a result, the pattern collapse tends to take place. In contrast, if the discharging amount of the rinsing solution is smaller than 40 ml, there is a possibility of which the rinsing solution is not equally supplied onto the entire surface of the substrate. The discharging amount of the rinsing solution is more preferably in the range from 100 ml to 200 ml.

According to an aspect of the present invention, the nozzle is configured to discharge the rinsing solution while the nozzle is in contact with the processing solution. Thus, the impact of the rinsing solution against the substrate can be suppressed in comparison with the case that the nozzle discharges the rinsing solution while the nozzle is not in contact with the processing solution on the substrate. As a result, the pattern collapse can be effectively prevented. In addition, the nozzle is moved on the substrate while the nozzle is in contact with the processing solution. Thus, while the nozzle is pushing out the processing solution to some extent, the nozzle can replace the processing solution with the rinsing solution. Thus, the processing solution can be effectively replaced with the rinsing solution.

In addition, since the nozzle has such a height, while the nozzle is discharging rinsing solution, it is continuously unified with rinsing solution that has been discharged. Thus, the impact of the developing solution against the substrate does not almost take place.

According to an aspect of the present invention, the nozzle has a right-angle portion that is formed on the forward side in the direction of which the nozzle is moved and that upwardly extends from a lower end portion that is in contact with the processing solution on the substrate; and a curved portion that is formed on the opposite side in the direction of which the nozzle is moved and that upwardly extends from the lower end portion. According to the present invention, when the nozzle is moved while it is in contact with the processing solution, the right-angle portion formed on the forward side in the moving direction of the nozzle causes the processing solution to be pushed away and removed. In addition, the curved portion on the opposite side in the moving direction of the nozzle causes the rinsing solution that has been discharged to be smoothened.

According to an aspect of the present invention, the nozzle has means for discharging the rinsing solution with an angle to the direction of which the nozzle is moved. Thus, since the processing solution on the substrate is pushed away in the moving direction of the nozzle and removed, the processing solution can be effectively replaced with the rinsing solution.

An aspect of the present invention further comprises a mechanism for rotating the nozzle on a plane in parallel with the front surface of the substrate. The rinsing solution is discharged while the nozzle is being rotated by the rotating mechanism. For example, if the length of the nozzle is nearly the same as the diameter of the substrate, when the nozzle is rotated by 180° or more, the rinsing solution can be equally supplied onto the entire surface of the substrate.

According to an aspect of the present invention, the nozzle is configured so that the discharging direction of the rinsing solution from the center portion of the nozzle to one end portion thereof and the discharging direction of the rinsing solution from the center portion of the nozzle to the other end portion thereof have an angle to the direction of which the nozzle is rotated. Thus, when the nozzle discharges the rinsing solution while the nozzle is being rotated around the center portion thereof, since the rinsing solution can be discharged in the direction of which the nozzle is rotated, the processing solution on the substrate is pushed away in the moving direction of the nozzle and the processing solution is removed. As a result, the processing solution can be effectively replaced with the rinsing solution.

According to an aspect of the present invention, the nozzle has means for discharging the rinsing solution so that the discharging angle of the rinsing solution to the substrate is gradually increased in the direction from the center portion of the nozzle to the end portion thereof. Thus, the processing solution can be spread from the center portion of the substrate to the periphery portion thereof and removed. Consequently, the rinsing solution can be equally supplied. When the rinsing solution is discharged so that the discharging amount is gradually decreased from the center portion of the nozzle to the end portion thereof, the rinsing solution flows from the center portion of the substrate to the periphery portion thereof. Thus, the processing solution can be effectively removed. The rinsing solution can be equally supplied onto the entire surface of the substrate.

A third aspect of a substrate processing apparatus according to the present invention comprises a rotatably holding portion for rotatably holding a substrate; means for supplying processing solution onto the substrate held by the rotatably holding portion; and an elongated nozzle for discharging rinsing solution that contains a first processing agent that weakens surface tension of the rinsing solution onto the substrate on which processing solution has been supplied and that is being rotated by the rotatably holding portion.

According to the present invention, since the elongated nozzle discharges the rinsing solution whose surface tension is weakened onto the substrate on which the processing solution has been supplied, the rinsing solution can be equally spread onto the substrate. As a result, the pattern collapse can be prevented. In particular, since the elongated nozzle discharges the rinsing solution while the elongated nozzle is being rotated, the rinsing solution can be equally discharged onto the entire surface of the substrate. The elongated nozzle has for example a plurality of nearly circular discharging openings or an elongated discharging opening in the longitudinal direction of the washing nozzle. It is preferred that the length of the nozzle should be nearly the same as the diameter of the substrate or smaller than the diameter of the substrate. If the length of the nozzle is nearly the same as the diameter of the substrate, when the substrate is rotated by 180° or more, the washing solution can be supplied onto the entire surface of the substrate. If the length of the nozzle is nearly the same as the radius of the substrate, when the substrate is rotated by one turn or more, the rinsing solution can be supplied onto the entire surface of the substrate.

According to an aspect of the present invention, when the number of rotations of the substrate is 500 rpm or less, the pattern collapse can be prevented. The number of rotations is more preferably 100 rpm or less.

When the length of the nozzle is nearly the same as the diameter of the substrate, the discharging direction of the rinsing solution from the center portion of the nozzle to one end portion thereof and the discharging direction of the rinsing solution from the center portion of the nozzle to the other end portion thereof have an angle to a relative direction of which the nozzle is rotated against the substrate. Thus, since the rinsing solution can be discharged in the direction of which the nozzle is rotated, an operation of which the processing solution on the substrate can be pushed away in the moving direction of the nozzle and removed works. Thus, the processing solution can be effectively replaced with the rinsing solution.

According to an aspect of the present invention, the nozzle has means for discharging the rinsing solution so that the discharging angle of the rinsing solution to the substrate is gradually increased in the direction from the center portion of the nozzle to the end portion thereof when the length of the nozzle is nearly the same as the diameter of the substrate. Thus, since the processing solution can be removed in such a manner that the processing solution flows from the center portion of the substrate to the periphery portion thereof, the rinsing solution can be equally supplied.

A first aspect of a substrate processing method according to the present invention comprises the steps of supplying processing solution onto a substrate; and while an elongated nozzle having a discharging opening is being moved on the substrate on which the processing solution has been supplied so that the discharging opening is in contact with the processing solution, discharging rinsing solution containing a first processing agent that weakens surface tension of the rinsing solution through the discharging opening.

According to the present invention, since the elongated nozzle discharges rinsing solution whose surface tension is weakened onto the substrate on which the processing solution has been supplied, the rinsing solution can be equally spread onto the substrate. As a result, the pattern collapse can be prevented. In addition, according to the present invention, the nozzle can discharge the rinsing solution while the discharging opening is in contact with the processing solution. Since the discharging opening is in contact with the processing solution, the washing solution discharged from the discharging opening is continuously unified with the processing solution. The rinsing solution that flows spreads in the entire processing solution. As a result, the impact of the washing solution against the substrate can be suppressed. Thus, since the impact against the substrate can be suppressed, the pattern collapse can be prevented.

A second aspect of a substrate processing method according to the present invention comprises the steps of supplying processing solution onto a substrate; and while the substrate on which the processing solution has been supplied is being rotated, discharging rinsing solution containing first processing agent that weakens surface tension of the rinsing solution onto the substrate through a discharging opening of an elongated nozzle in the state that the discharging opening is in contact with the processing solution.

According to the present invention, since the stationary elongated nozzle discharges the rinsing solution while the substrate is being rotated, the rinsing solution can be equally discharged onto the entire surface of the substrate. In addition, according to the present invention, the nozzle can discharge the rinsing solution while the discharging opening is in contact with the processing solution. Since the discharging opening is in contact with the processing solution, the washing solution discharged from the discharging opening is continuously unified with the processing solution. The rinsing solution that flows spreads in the entire processing solution. As a result, the impact of the washing solution against the substrate can be suppressed. Thus, since the impact against the substrate can be suppressed, the pattern collapse can be prevented.

A first aspect of a developing apparatus according to the present invention is a developing apparatus for developing a substrate on which resist has been coated and an exposing process has been performed, comprising a substrate holding portion for horizontally holding the substrate; a developing solution supplying nozzle for supplying developing solution onto the front surface of the substrate held by the substrate holding portion; a washing solution supplying nozzle, having a discharging opening formed with a length equal to or larger than the width of an effective area of the substrate, for supplying washing solution onto the front surface of the substrate on which the developing solution has been coated; and a moving mechanism for moving the washing solution supplying nozzle from one end side of the substrate to the other end side in such a manner that a lower end portion of the discharging opening is lower than the surface of the developing solution and the separation distance between the lower end portion of the discharging opening and the front surface of the substrate is 0.4 mm or less.

With the developing apparatus according to the present invention, lateral pushing force that takes place due to collision of the washing solution discharged form the discharging opening of the washing solution supplying nozzle and pushing force of the washing solution supplying nozzle against the side wall surface are combined to drain developing solution containing a resist component on the front surface of the substrate. Thus, since the developing solution and the resist component can be prevented from residing on the front surface of the substrate, a pattern whose development defects are small can be obtained.

A second aspect of a developing apparatus according to the present invention is a developing apparatus for developing a substrate on which resist has been coated and an exposing process has been performed, comprising a substrate holding portion for horizontally holding the substrate; a developing solution supplying nozzle for supplying developing solution onto the front surface of the substrate held by the substrate holding portion; a washing solution supplying nozzle, having a discharging opening formed with a length equal to or larger than the width of an effective area of the substrate, for supplying washing solution onto the front surface of the substrate on which the developing solution has been coated; a gas blowing opening disposed on a side portion in the direction of which the washing solution supplying nozzle is moved and is inclined on the forward side; and a moving mechanism for moving the washing solution supplying nozzle from one end side of the substrate to the other end side in such a manner that a lower end portion of the discharging opening is lower than the surface of the developing solution.

The washing solution supplying nozzle may have a plurality of discharging openings disposed in the direction of which the washing solution supplying nozzle is moved. A flow amount adjusting portion may be disposed at each of the discharging openings. In addition, after the substrate on which the developing solution has been coated is rotated for a predetermined time period, the washing solution may be supplied. Moreover, after the substrate is washed by moving the washing solution supplying nozzle from one end side of the substrate to the other end side thereof while the washing solution is being discharged from the discharging opening thereof, the substrate may be washed by rotating the substrate while the washing solution is being supplied to a center portion of the substrate.

BEST MODES FOR CARRYING OUT THE INVENTION

Next, with reference to the accompanying drawings, embodiments of the present invention will be described.

First Embodiment

Figure 1:
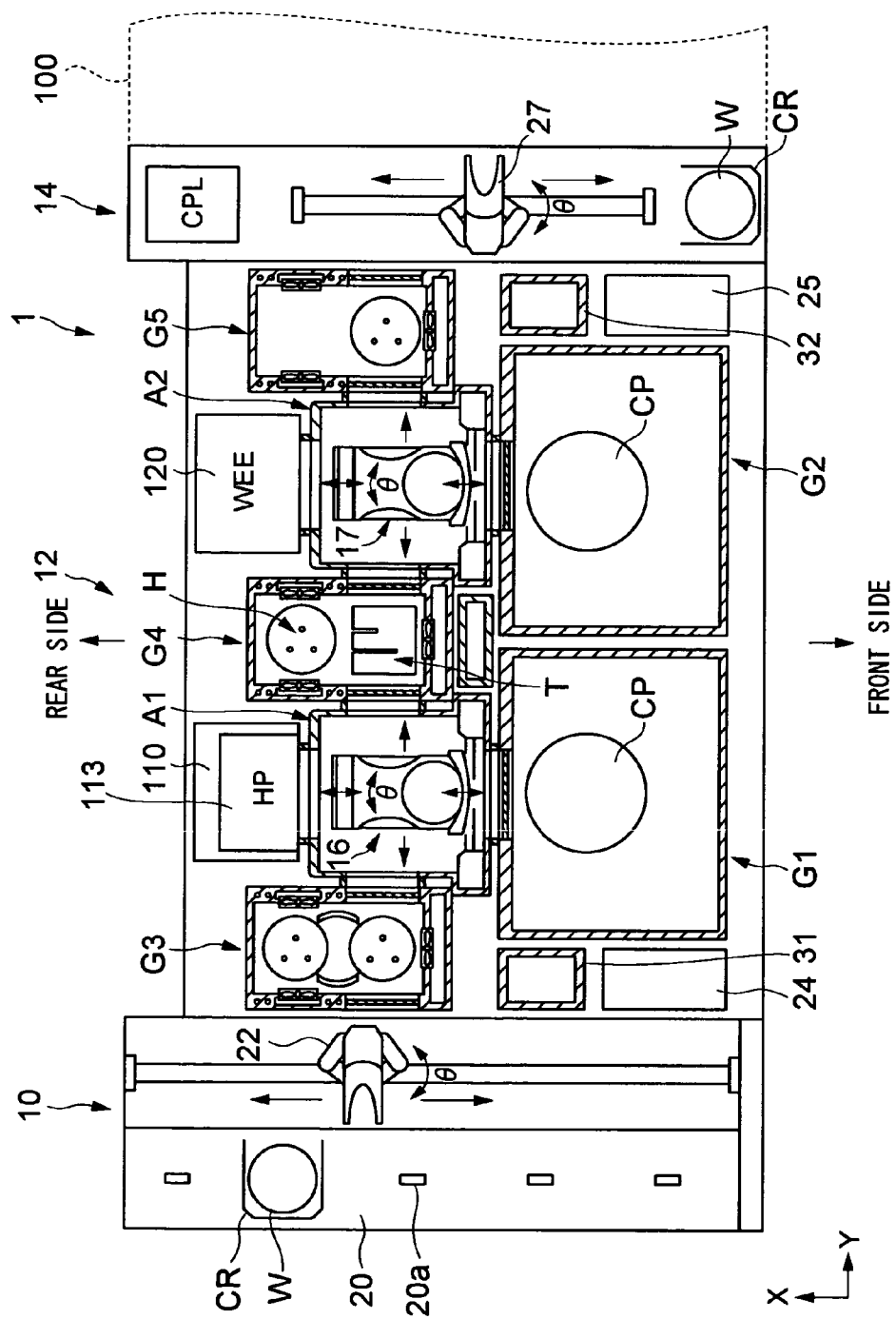
FIG. 1 is a plan view showing a coating/developing processing apparatus according to the present invention.
Figure 2:
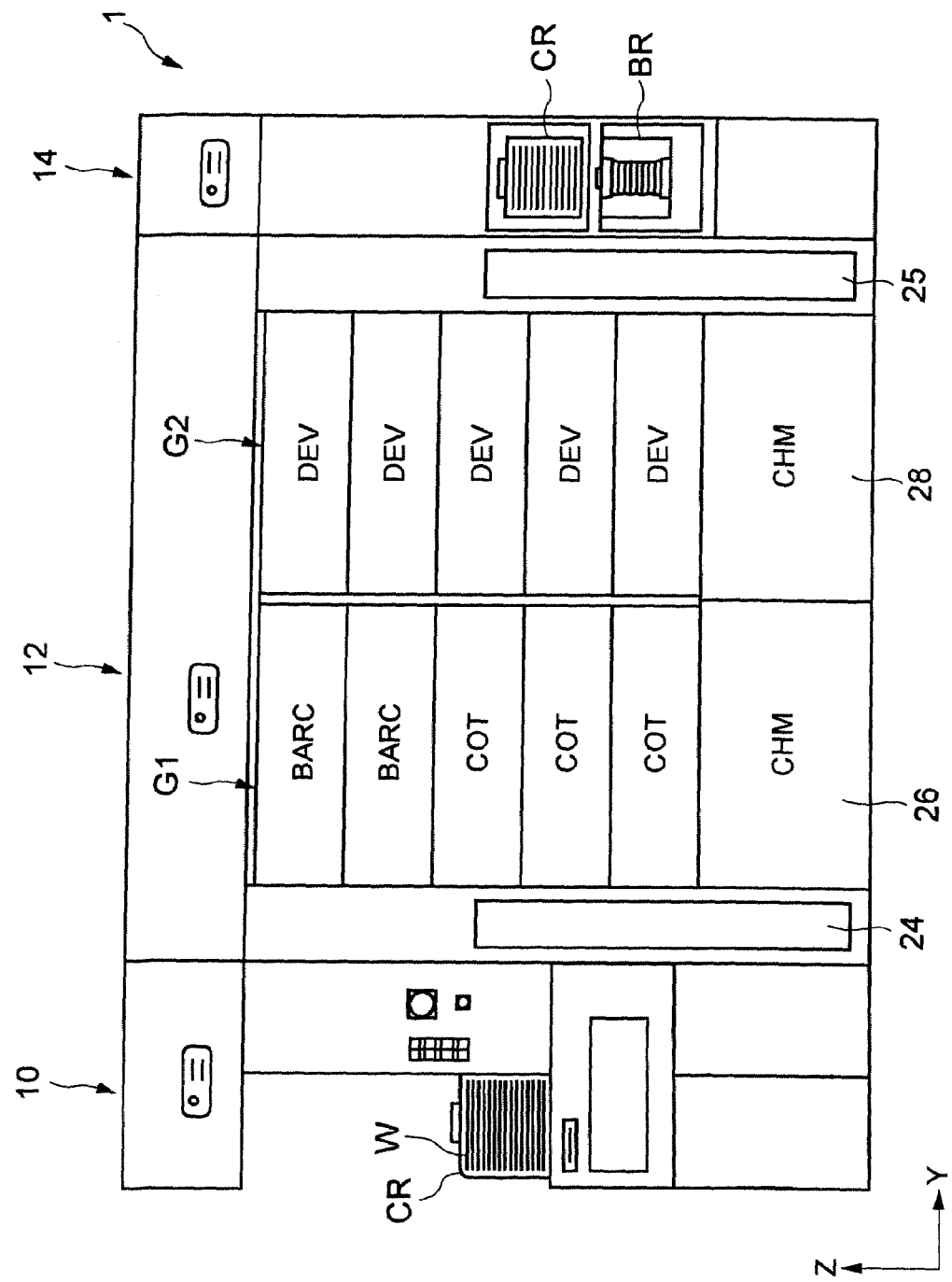
FIG. 2 is a front view showing the coating/developing processing apparatus shown in FIG. 1.
Figure 3:
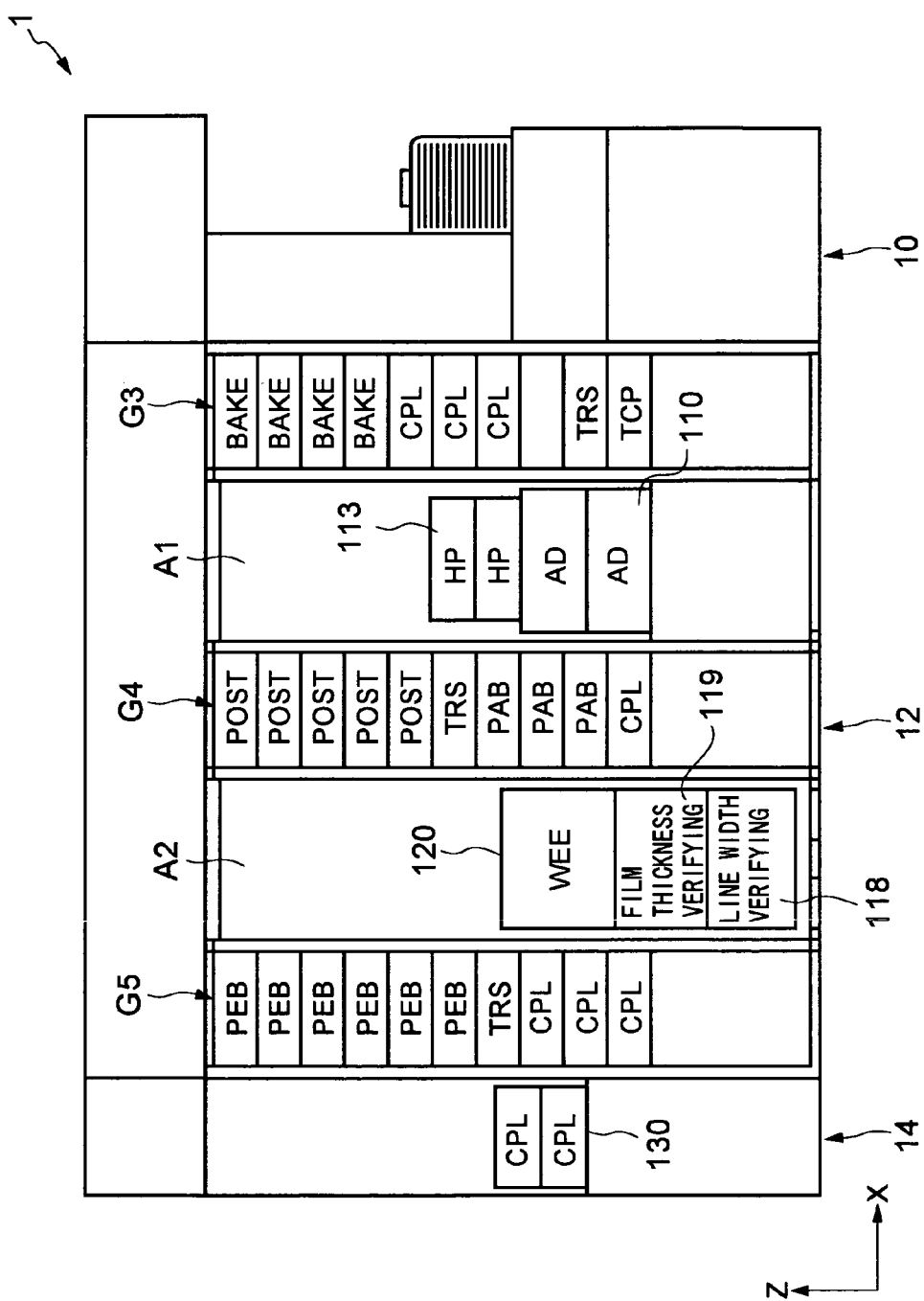
FIG. 3 is a rear view showing the coating/developing processing apparatus shown in FIG. 1.

FIG. 1 to FIG. 3 are schematic diagrams showing an overall structure of a coating/developing processing apparatus according to a first embodiment of the present invention, where FIG. 1 is a plan view and FIG. 2 and FIG. 3 are a front view and a rear view, respectively.

The coating/developing processing apparatus denoted by reference numeral 1 has a cassette station 10, a processing station 12, and an interface portion 14 that are integrally connected. The cassette station 10 loads and unloads a wafer cassette CR from and to the outside of the apparatus 1. A wafer cassette CR contains a plurality of semiconductor wafers W, for example 25 wafers W. In addition, the cassette station 10 loads and unloads a wafer W to and from a wafer cassette CR. The processing station 12 has single-wafer processing units that are multiply piled at predetermined positions and that perform predetermined processes for wafers W one by one at coating/developing steps. The interface portion 14 transfers a wafer W to and from an exposing apparatus 100 disposed next to the processing station 12.

As shown in FIG. 1, in the cassette station 10, a plurality of wafer cassettes CR, for example five wafer cassettes CR, are placed at positions of protrusions 20a on a cassette holding table 20 so that they are arranged in X direction and their wafer access openings face the processing station 12. A wafer conveying member 22 that is movable in the direction of which the cassettes are arranged (X direction) and in the direction of which wafers are arranged in each wafer cassette CR (Z direction) can selectively access each wafer cassette CR. In addition, the wafer conveying member 22 is rotatable in θ direction. Moreover, the wafer conveying member 22 can access a heating processing unit that belongs to a multiply piled third processing unit portion G3 shown in FIG. 3 (that will be described later).

As shown in FIG. 1, in the processing station 12, on the rear side of the apparatus (an upper portion of the drawing), the cassette station 10, the third processing unit portion G3, a fourth processing unit portion G4, and a fifth processing unit portion G5 are disposed. A first main wafer conveying device A1 is disposed between the third processing unit portion G3 and the fourth processing unit portion G4. The first main wafer conveying device A1 is disposed so that a first main wafer conveying member 16 can selectively access a first processing unit portion G1, the third processing unit portion G3, the fourth processing unit portion G4, and so forth. A second main wafer conveying device A2 is disposed between the fourth processing unit portion G4 and the fifth processing unit portion G5. Like the first main wafer conveying device A1, the second main wafer conveying device A2 is disposed so that a second main wafer conveying member 17 can selectively access a second processing unit portion G2, the fourth processing unit portion G4, the fifth processing unit portion G5, and so forth.

In addition, on the rear side of the first main wafer conveying device A1, a heating processing unit is disposed. For example, in the heating processing unit, as shown in FIG. 3, an adhesion unit (AD) 110 that performs a hydrophobic process for a wafer W and a heating unit (HP) 113 that heats a wafer W are multiply piled. The adhesion unit (AD) may also have a mechanism that adjusts the temperature of a wafer W. On the rear side of the second main wafer conveying device A2, a peripheral exposing unit (WEE) 120 that selectively exposes only an edge portion of a wafer W, a film thickness verifying unit 119 that verifies the film thickness of resist coated on a wafer W, and a line width verifying unit 118 that verifies the line width of a resist pattern are multiply piled. The film thickness verifying unit 119 and the line width verifying unit 118 may be disposed outside the coating/developing processing apparatus 1, not therein. Like the first main wafer conveying device A1, on the rear side of the second main wafer conveying device A2, a heating processing unit (HP) 113 may be disposed.

As shown in FIG. 3, in the third processing unit portion G3, an open type processing unit that places a wafer W on a holding table and performs a predetermined process, a high temperature heating processing unit (BAKE) that performs a predetermined heating process for a wafer W or the like, a total of for example 10 units that are a cooling processing unit (CPL) that accurately controls temperature of a wafer W, a transition unit (TRS) that is a transferring portion that transfers a wafer W from the wafer conveying member 22 to the main wafer conveying member 16, and a transferring/cooling processing unit (TCP) having a transferring portion as an upper unit and a cooling unit as a lower unit are successively piled from the top. According to the present embodiment, in the third processing unit portion G3; the third lowest unit is a blank for a spare unit. In the fourth processing unit portion G4, a total of for example ten units that are a post baking unit (POST), a transition unit (TRS) as a wafer transferring portion, a pre baking unit (PAB) that performs a heating process for a wafer W on which a resist film has been formed, and a cooling processing unit (CPL) are successively piled from the bottom. In the fifth processing unit portion G5, a total of for example 10 units that are a post exposure baking unit (PEB) as heating processing means that performs a heating process for a wafer W that has been exposed, a cooling processing unit (CPL), and a transition unit (TRS) are successively piled from the top.

In the fourth processing unit portion G4 shown in FIG. 1, a temperature adjusting plate T that adjusts the temperature of a wafer W is disposed on the front side of a heating processing unit. A heating plate H that heats a wafer W is disposed on the rear side of a heating processing unit.

On the front side (a lower portion of the drawing) of the processing station 12 shown in FIG. 1, the first processing unit portion G1 and the second processing unit portion G2 are disposed in Y direction. Solution temperature adjusting pumps 24 and 25 that adjust temperatures of processing solutions supplied to the first processing unit portion G1 and the second processing unit portion G2 are disposed between the first processing unit portion G1 and the cassette station 10 and between the second processing unit portion G2 and the interface portion 14, respectively. In addition, ducts 31 and 32 that supply clean air from an air conditioner (not shown) disposed outside the coating/developing processing apparatus 1 to each of the processing unit portions G1 to G5 are disposed.

As shown in FIG. 2, in the first processing unit portion G1, five spinner type processing units each of which places a cup CP that holds a wafer W on a spin chuck and performs a predetermined process for the wafer W are successively piled. For example, three resist coating processing units (COT) as resist film forming portions and two bottom coating units (BARC) each of which forms a reflection protection film that prevents exposed light from being reflected are successively piled from the bottom. Likewise, in the second processing unit portion G2, five spinner type processing units for example developing processing units (DEV) as developing processing portions are successively piled. Since it is difficult to drain resist solution in the resist coating processing units (COT) from view points of mechanism and maintenance, it is preferred that they should be disposed as lower units. Of course, when necessary, they can be disposed as upper units.

The lowest units of the first and second processing unit portions G1 and G2 are chemical chambers (CHM) 26 and 28 that supply the foregoing predetermined processing solution to the processing unit portions G1 and G2.

A pickup cassette CR that can be conveyed and a fixed type buffer cassette BR are piled as two units at a front side portion of the interface portion 14. A wafer conveying member 27 is disposed at a center portion of the interface portion 14. The wafer conveying member 27 can move in the X and Z directions and access the cassettes CR and BR. In addition, the wafer conveying member 27 can rotate in θ direction. Thus, the wafer conveying member 27 can also access the fifth processing unit portion G5. In addition, at a rear side portion of the interface portion 14 shown in FIG. 3, a plurality of high accuracy cooling processing units (CPL), for example two units, are piled. The wafer conveying member 27 can also access the cooling processing units (CPL).

Figure 4:
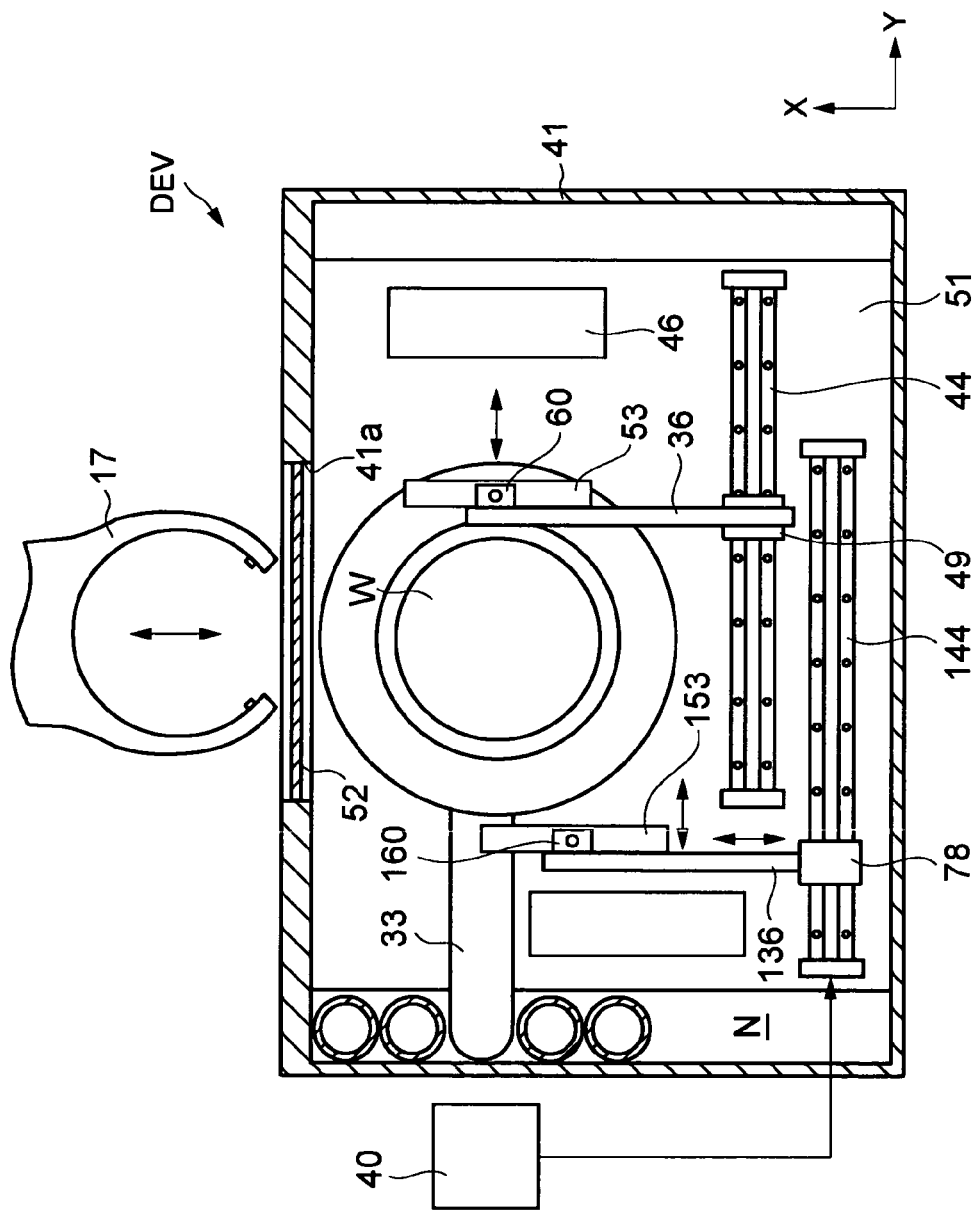
FIG. 4 is a plan view showing a developing processing unit according to an embodiment of the present invention.
Figure 5:
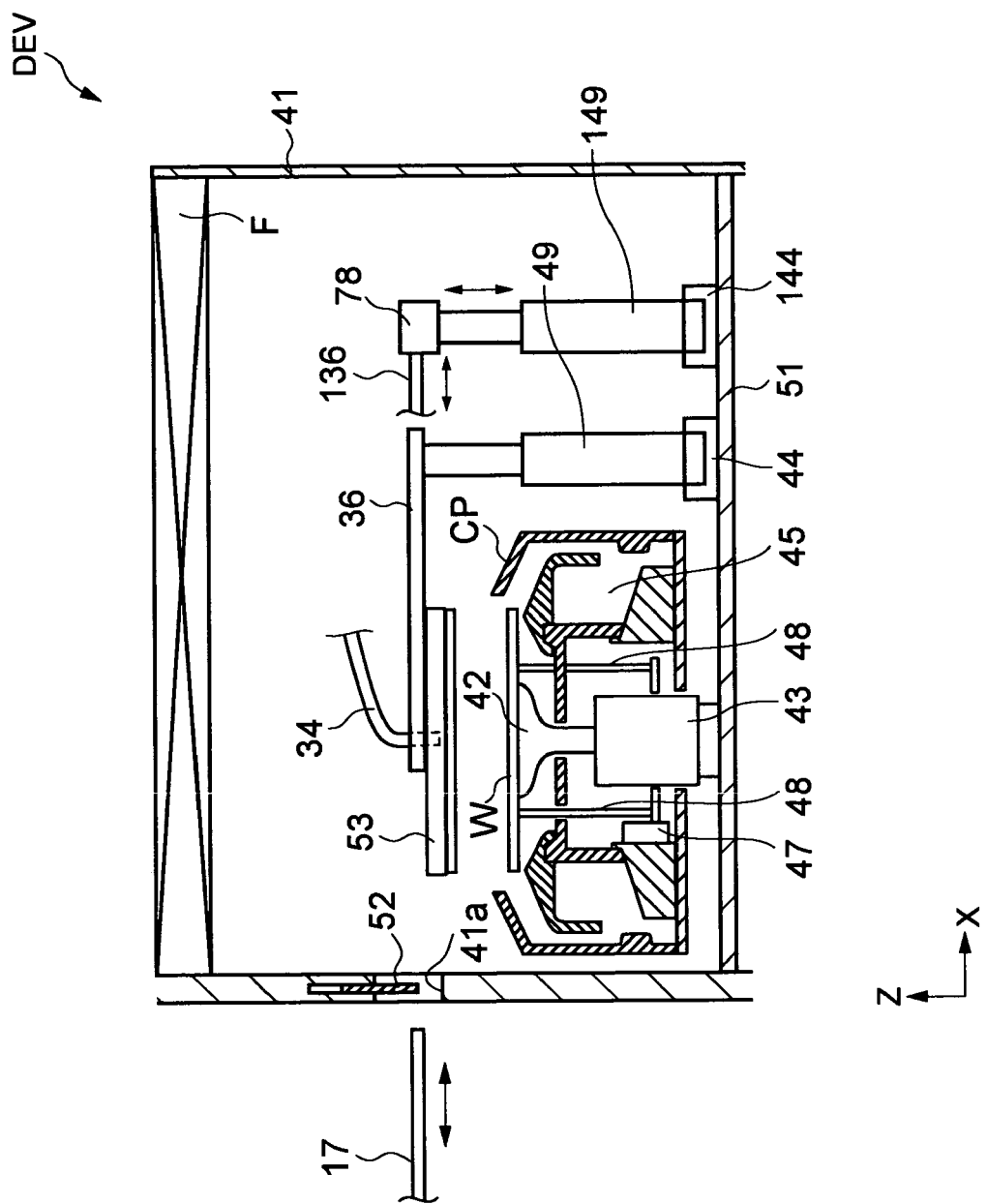
FIG. 5 is a sectional view showing the developing processing unit shown in FIG. 4.

Next, the developing processing unit (DEV) according to the present invention will be described in detail. FIG. 4 and FIG. 5 are a plan view and a sectional view showing the developing processing unit (DEV) according to an embodiment of the present invention.

In the unit, a fan filter unit F is disposed at an upper position of a housing 41. The fan filter unit F supplies clean air into the housing 41. Below the fan filter unit F and nearly at a center position of a unit bottom plate 51 that is smaller than the housing 41 in Y direction, a ring-shaped cup CP is disposed. A spin chuck 42 is disposed inside the cup CP. While the spin chuck 42 is vacuum-sucking a wafer W, the spin chuck 42 is rotated by rotation driving force of a motor 43.

Pins 48 that transfer a wafer W are disposed in the cup CP. The pins 48 are raised and lowered by a driving device 47 such as an air cylinder. Thus, while a shutter 52 that can be opened and closed is open, a wafer can be transferred to and from the main wafer conveying member 17 through an opening portion 41a. At a bottom position of the cup CP, a drain opening 45 through which drain solution flows is disposed. A drain pipe 33 is connected to the drain opening 45. The drain pipe 33 is connected to another drain opening (not shown) using a space N formed between the unit bottom plate 51 and the housing 41.

A developing solution nozzle 53 that supplies developing solution onto the front surface of a wafer W is formed in an elongated shape having nearly the same length as the diameter of the wafer W. The developing solution nozzle 53 is connected to a developing solution tank (not shown) in the chemical chamber (CHM) (see FIG. 2) through a supplying pipe 34. The developing solution nozzle 53 is connectable and disconnectable to and from a nozzle holding member 60 of a nozzle scanning arm 36. The nozzle scanning arm 36 is mounted on an upper end portion of a vertical supporting member 49 that is horizontally movable on a guide rail 44 that is placed on the unit bottom plate 51 and that extends in one direction (Y direction). For example, the nozzle scanning arm 36 is movable in the Y direction along with the vertical supporting member 49 by for example a belt driving mechanism. Thus, unless the developing solution nozzle 53 supplies the developing solution, the developing solution nozzle 53 stands by in a developing solution nozzle bath 46 disposed outside the cup CP. When the developing solution nozzle 53 supplies the developing solution, the developing solution nozzle 53 is moved so that it is placed above the wafer W. The developing solution nozzle 53 has a plurality of discharging holes (not shown) at an lower end portion thereof. Developing solution is discharged from the plurality of discharging holes.

In addition, a guide rail 144 through which a rinsing nozzle is moved is disposed beside the cup CP along the foregoing guide rail 44. A vertical supporting member 149 is movably disposed on the guide rail 144 in the Y direction by for example a belt driving mechanism. A motor 78 is mounted on an upper portion of the vertical supporting member 149. A rinsing nozzle arm 136 is mounted on the motor 78 by for example a ball screw mechanism so that the rinsing nozzle arm 136 is movable in the X direction. A rinsing nozzle 153 is mounted on the rinsing nozzle arm 136 through a nozzle holding member 160.

The rinsing nozzle arm 136 is for example movable in upper and lower directions (Z direction) by the vertical supporting member 149 that has for example an air cylinder mechanism. Thus, the height of the rinsing nozzle 153 is adjusted by the rinsing nozzle arm 136. In reality, the height of a wafer W held by the spin chuck 42 is adjusted by the rinsing nozzle arm 136. An X-Y-Z moving mechanism that moves the rinsing nozzle 153 is controlled by a moving mechanism controller 40. Thus, the rinsing nozzle 153 can be moved from the rinsing nozzle bath 146 in which the rinsing nozzle 153 stands by to the wafer W held in the cup CP. With rinsing solution discharged from the rinsing nozzle 153 to the wafer, developing solution on the wafer is washed away. In FIG. 5, the rinsing nozzle 153 is omitted.

Figure 6:
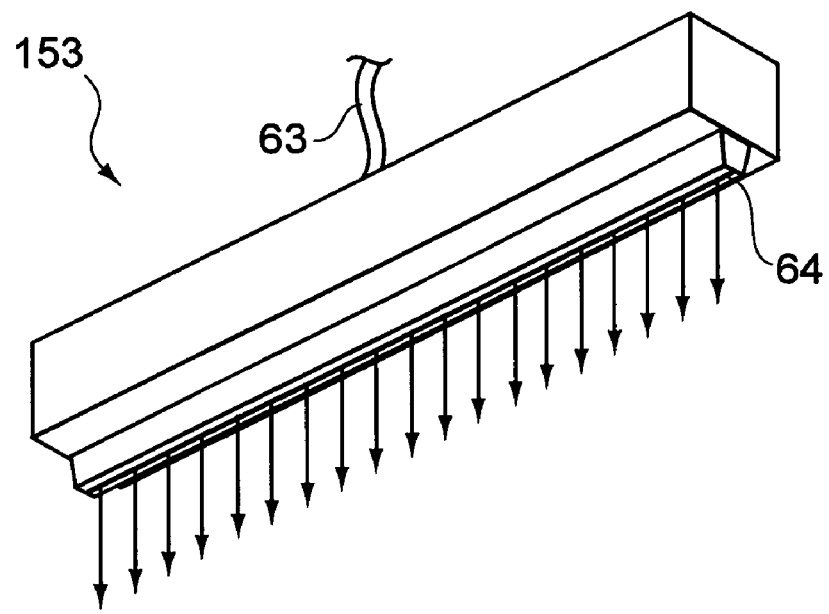
FIG. 6 is an upwardly seen perspective view showing a rinsing nozzle according to a first embodiment.
Figure 7:
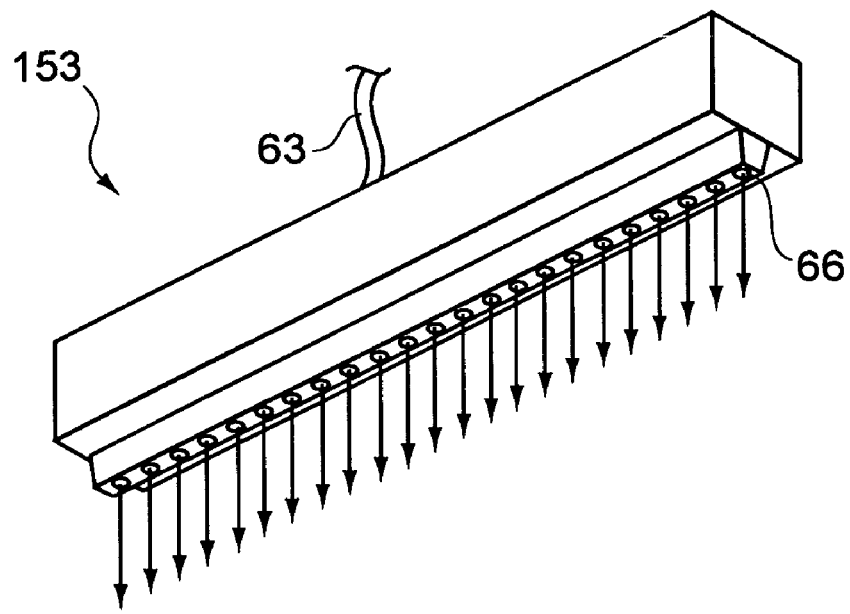
FIG. 7 is an upwardly seen perspective view showing another example of the rinsing nozzle shown in FIG. 6.

FIG. 6 and FIG. 7 are upwardly seen perspective views showing the rinsing nozzle 153 according to the first embodiment. Like the developing solution nozzle 53, the rinsing nozzle 153 is formed in an elongated shape. As shown in FIG. 6, at a lower position of the rinsing nozzle 153, a slit-shaped discharging opening 64 that discharges rinsing solution supplied from a supplying pipe 63 onto a wafer W is formed. FIG. 7 shows a rinsing nozzle according to another embodiment. Likewise, the rinsing nozzle has a plurality of holes 66 from which rinsing solution supplied from the supplying pipe 63 is discharged onto a wafer.

Figure 8:
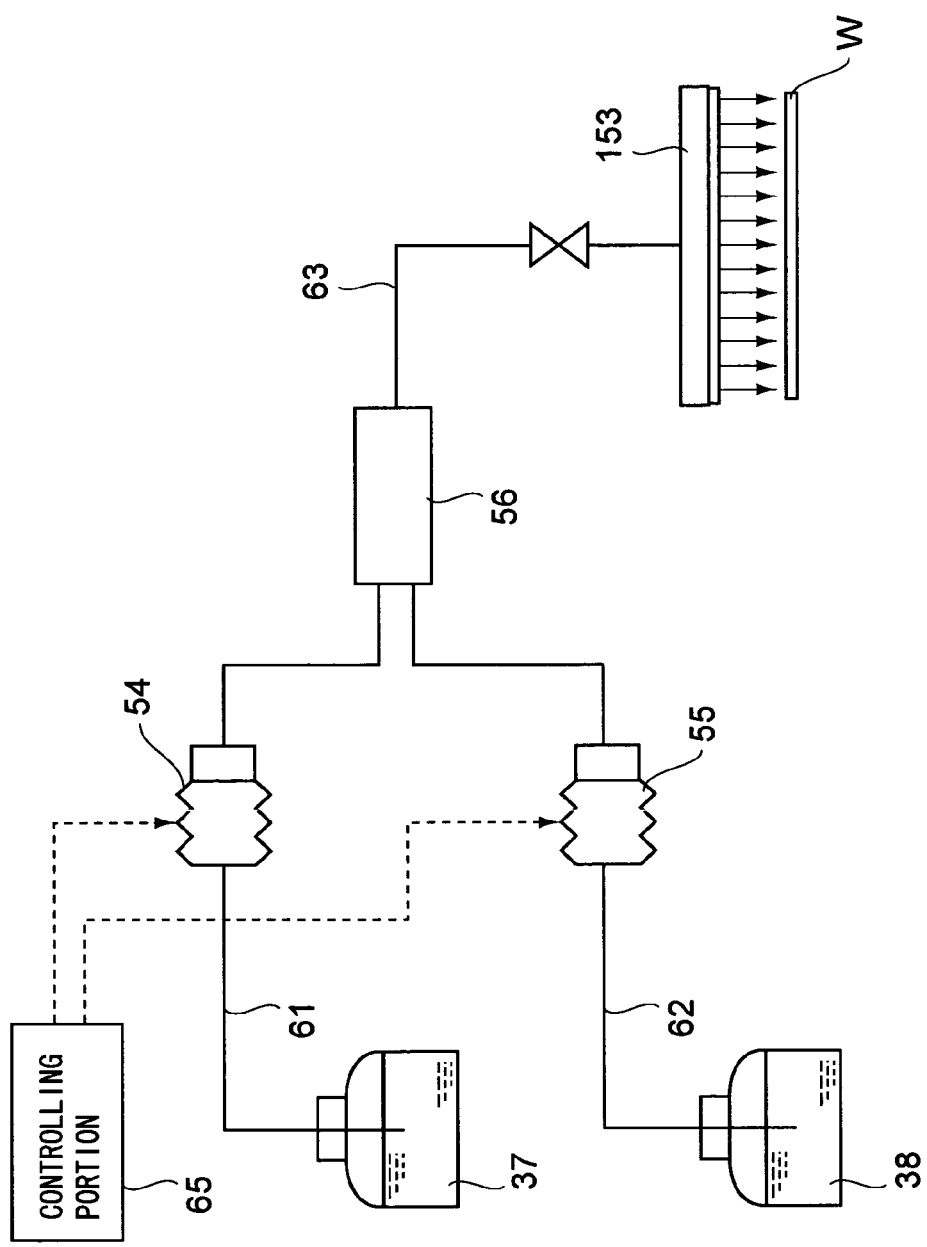
FIG. 8 is a schematic diagram showing a structure of a rinsing solution supplying mechanism according to an embodiment.

FIG. 8 is an outlined schematic diagram showing a supplying mechanism that supplies rinsing solution.

A first supplying pipe 61 is connected to a pure water tank 37 that stores pure water. A surfactant tank 38 stores for example surfactant that weakens the surface tension of pure water. A second supplying pipe 62 is connected to the surfactant tank 38. According to the present embodiment, as surfactant, for example non-ionic surfactant is used. The supplying pipes 61 and 62 are connected to for example a static mixer 56. The static mixer 56 is connected to the rinsing nozzle 153 through the supplying pipe 63. A first bellows pump 54 is connected between the pure water tank 37 and the static mixer 56. The first supplying pipe 61 connects the pure water tank 37 and the first bellows pump 54. The first bellows pump 54 causes pure water to be supplied to the static mixer 56. A second bellows pump 55 is connected between the surfactant tank 38 and the static mixer 56. The second supplying pipe 62 connects the surfactant tank 38 and the second bellows pump 55. The second bellows pump 55 causes surfactant to be supplied to the static mixer 56. Operation amounts of the first bellows pumps 54 and 55 are controlled by a controlling portion 65. The static mixer 56 mixes the pure water and the surfactant and produces rinsing solution that has a predetermined concentration whose surface tension is lower than pure water. The produced rinsing solution is supplied to the rinsing nozzle 153 through the supplying pipe 63.

Next, an example of steps of a process of the coating/developing processing apparatus 1 that has the foregoing structure will be described.

In the cassette station 10, the wafer conveying member 22 accesses on the cassette holding table 20 a cassette CR that contains wafers W that have not been processed and takes out one wafer W therefrom. The wafer W is transferred to the first main conveying device A1 through the transferring/cooling processing unit (TCP). The wafer W is loaded into for example the adhesion unit (AD) 110. The adhesion unit (AD) 110 performs a hydrophobic process for the wafer W. Thereafter, the wafer W is conveyed to for example the bottom coating unit (BARC). The bottom coating unit (BARC) may form a reflection protection film on the wafer W so as to prevent exposed light from being reflected from the wafer.

Thereafter, the wafer W is loaded into the resist coating processing unit (COT). The resist coating processing unit (COT) forms a resist film on the wafer W. After the resist film has been formed on the wafer W, the first main conveying device A1 conveys the wafer W to the prebaking unit (PAB). In the prebaking unit (PAB), the wafer W is placed on the temperature adjusting plate T. While the temperature of the wafer W is being adjusted, it is moved toward the heating plate H. The wafer W is placed on the heating plate H. A heating process is performed for the wafer W on the heating plate H. After the heating process has been performed for the wafer W, it is transferred to the first main conveying device A1 through the temperature adjusting plate T. Thereafter, a cooling process is performed for the wafer W at a predetermined temperature by the cooling processing unit (CPL).

Thereafter, the wafer W is taken out by the second main conveying device A2. The wafer W may be conveyed to the film thickness verifying unit 119. The film thickness verifying unit 119 measures the film thickness of resist on the wafer W. Thereafter, the wafer W is transferred to the exposing apparatus 100 through the transition unit (TRS) of the fifth processing unit portion G5 and the interface portion 14. The exposing apparatus 100 performs an exposing process for the wafer. W. After the exposing process has been performed, the wafer W is transferred to the second main conveying device A2 through the interface portion 14 and the transition unit (TRS) of the fifth processing unit portion G5. Thereafter, the wafer W is conveyed to the post exposure baking unit (PEB). The post exposure baking unit (PEB) performs a temperature adjusting process and a heating process for the wafer W. After the exposing process has been completed for the wafer W, it may be temporarily placed in a buffer cassette BR in the interface portion 14.

Thereafter, the wafer W is conveyed to the developing processing unit (DEV). The developing processing unit (DEV) performs a developing process for the wafer W. After the developing process has been performed, a predetermined heating process (post baking) may be performed for the wafer W. After the developing process has been performed, the cooling unit (COL) performs a predetermined cooling process for the wafer W. Thereafter, the wafer W is returned to the cassette CR through an extension unit (EXT).

Next, an operation of the developing processing unit (DEV) will be described.

Figure 9:
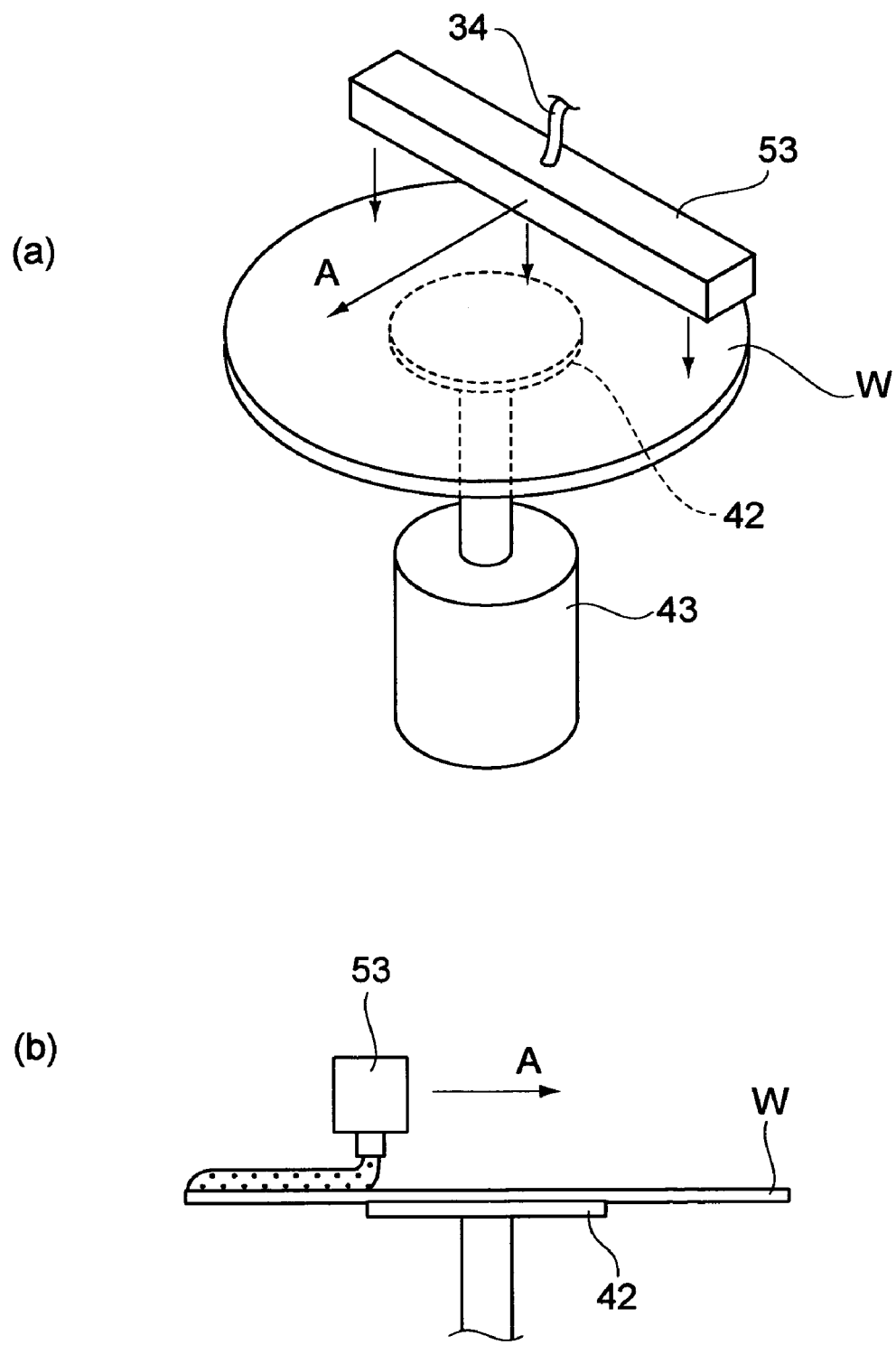
FIG. 9 is a schematic diagram showing an operation for supplying developing solution in a developing process.
Figure 10A:
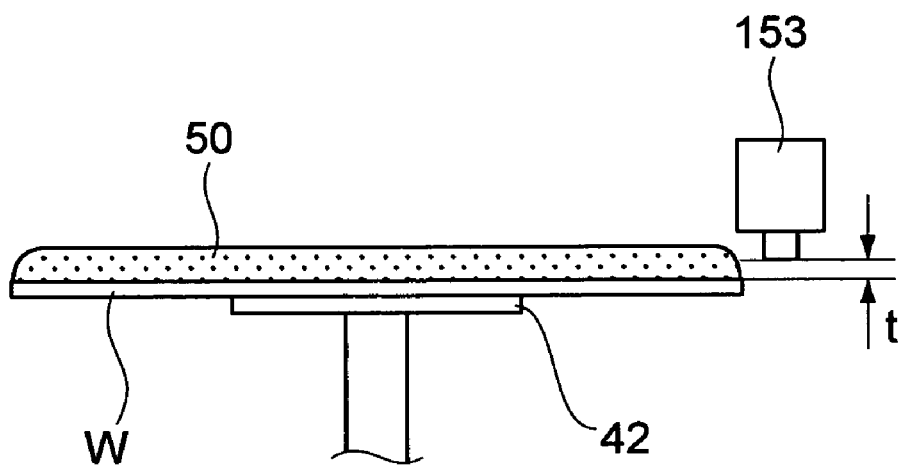
FIG. 10 is a schematic diagram showing an operation for supplying rinsing solution in the developing process.
Figure 10B:
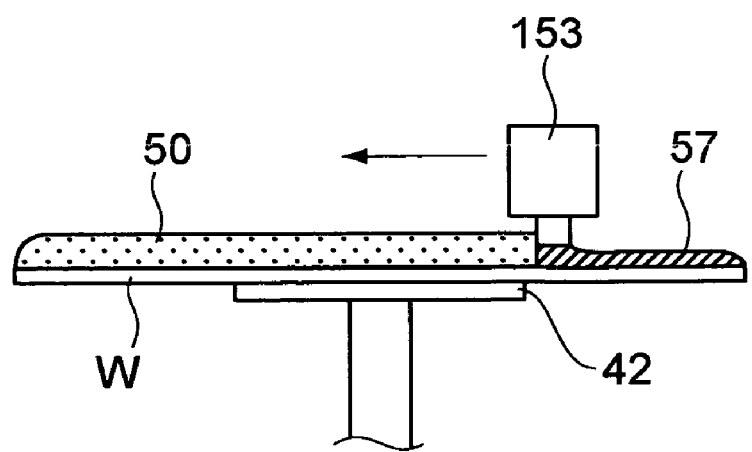

First of all, as shown in FIG. 9(a) and (b), while the developing solution nozzle 53 is moving in the direction denoted by arrow A on a wafer W that is stationary, the developing solution nozzle 53 discharges developing solution onto the wafer W. As a result, the developing solution is deposited on the wafer W. While the developing solution is deposited on the entire surface of the wafer, a developing process is performed for a predetermined time period, for example 60 seconds. Thereafter, as shown in FIG. 10(a), the rinsing nozzle 153 is placed at a predetermined position outside the periphery portion of the wafer W. At that point, the rinsing nozzle 153 is placed at a position of which the distance t between the lower end portion of the rinsing nozzle 153 and the front surface of the wafer W is smaller than the thickness of the developing solution denoted by reference numeral 50. The rinsing nozzle 153 is placed at a position around 4 mm apart from the front surface of the wafer W. Like the developing solution nozzle 53 shown in FIG. 9(a), while the rinsing nozzle 153 is being moved above the wafer so that the distance t is kept, the rinsing nozzle 153 discharges rinsing solution onto the wafer as shown in FIG. 10(b).

Since the rinsing nozzle 153 is moved while it is in contact with the developing solution 50, the impact of the rinsing solution against the wafer is lower than the impact in the case that rinsing solution is discharged from the rinsing nozzle 153 that is not in contact with the developing solution. Thus, the pattern collapse can be effectively prevented. In addition, when an elongated rinsing nozzle is used, since rinsing solution can be discharged onto a wide area of the wafer at a time. Thus, the washing time period can be shortened. Moreover, since the rinsing nozzle 153 is moved while it is in contact with the developing solution, the rinsing nozzle 153 can push away and remove the developing solution to some extent and replace it with the rinsing solution. Thus, the developing solution can be effectively replaced with the rinsing solution.

In addition, since the rinsing nozzle 153 is placed at such a position, while the rinsing nozzle 153 is discharging rinsing solution, it is continuously unified with rinsing solution that has been discharged on the wafer. Thus, the impact of the rinsing solution against the wafer does not almost take place.

It is preferred that the discharging amount of rinsing solution should be 40 ml to 500 ml per wafer. If the discharging amount of rinsing solution exceeds 500 ml, the flow rate of discharged rinsing solution may increase. Thus, the pattern collapse is apt to take place. In contrast, if the discharging amount of rinsing solution is smaller than 40 ml, there is a possibility of which rinsing solution is not be equally discharged on the entire surface of the wafer. The rinsing nozzle 153 may be reciprocally moved above the wafer so as to supply a predetermined amount of rinsing solution onto the wafer.

After the rinsing solution has been supplied onto the entire surface of the wafer W, it is rotated so as to shake off the rinsing solution from the wafer W using centrifugal force and dry the wafer W. Since the surface tension of the rinsing solution weakens, when the wafer W is shake-dried, the pattern collapse does not take place.

As described above, according to the present embodiment, since rinsing solution whose surface tension weakens is discharged by the elongated rinsing nozzle 153 having nearly the same length as the diameter of the wafer W, the rinsing solution can be equally spread on the substrate. Thus, the pattern collapse can be prevented. It should be noted that the length of the rinsing nozzle 153 may be larger than the diameter of the wafer W.

Figure 11:
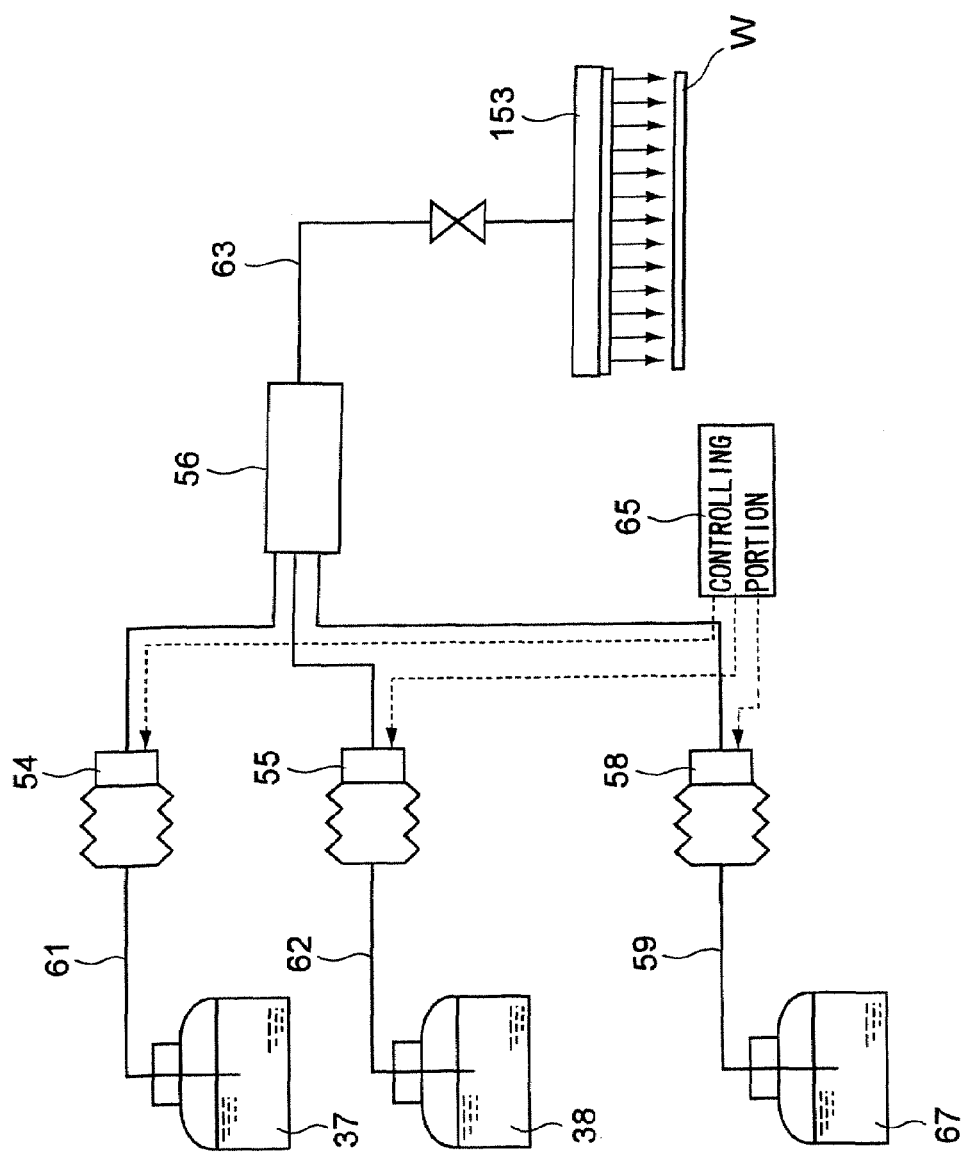
FIG. 11 is a schematic diagram showing a structure of a rinsing solution supplying mechanism according to another embodiment.

FIG. 11 is a schematic diagram showing a structure of a rinsing solution supplying mechanism according to another embodiment. In FIG. 11, structural elements similar to those in FIG. 8 are denoted by similar reference numerals and their description will be omitted.

The rinsing solution supplying mechanism also has a dispersant tank 67 that stores dispersant. A third supplying pipe 59 is connected to the dispersant tank 67. The third supplying pipe 59 is connected to the static mixer 56. A third bellows pump 58 is disposed between the dispersant tank 67 and the static mixer 56. Dispersant stored in the dispersant tank 67 is for example negative ionic surfactant. The controlling portion 65 controls the operation of the third bellows pump 58 so as to mix dispersant with a mixture of pure water and surfactant and produce rinsing solution.

When rinsing solution containing impurities such as particles is supplied onto a wafer, there is a possibility of which the impurities gather and adhere to a resist pattern. However, according to the present embodiment, since the dispersant causes impurities to disperse, the impurities can be washed away along with rinsing solution that flows from the wafer in the shake-drying process.

Figure 12:
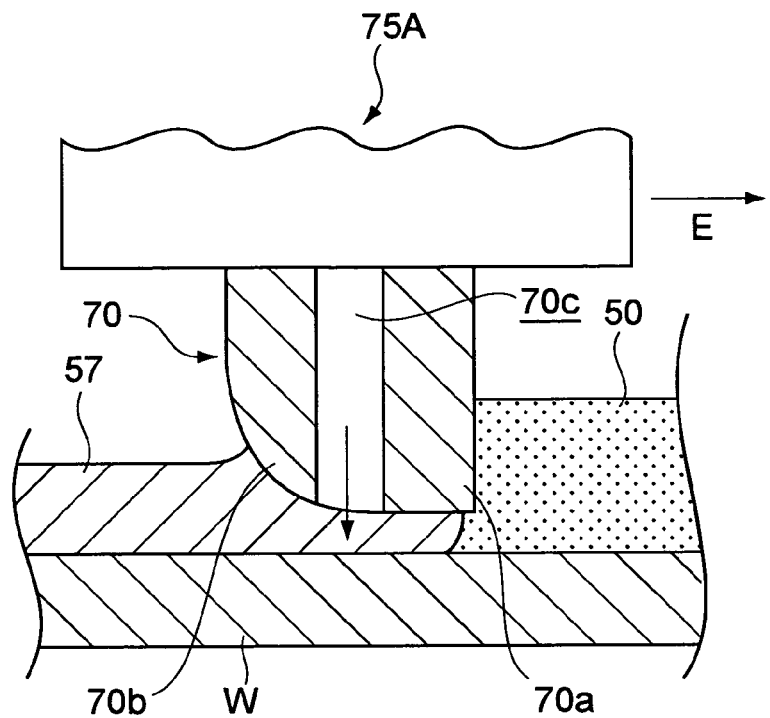
FIG. 12 is an enlarged view showing a rinsing nozzle according to another embodiment of the present invention.
Figure 13:
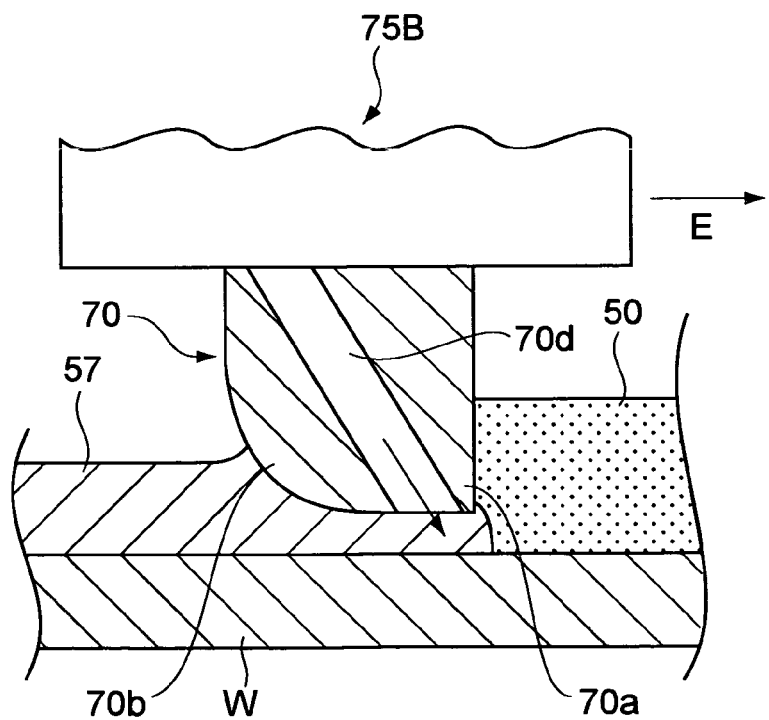
FIG. 13 is an enlarged view showing another example of the rinsing nozzle shown in FIG. 12.

FIG. 12 and FIG. 13 are enlarged sectional views showing rinsing nozzles according other embodiments.

In a rinsing nozzle 75A shown in FIG. 12, a lower end portion of a discharging portion 70 that discharges rinsing solution has a forward side 70a and an opposite side 70b in the direction denoted by arrow E. The forward side 70a is formed in a right-angle shape, whereas the opposite side 70b is formed in a curved shape. Reference numeral 70c represents a flow path of rinsing solution. Since the nozzle 75A has such a shape, when the nozzle 75A is moved while it is in contact with the developing solution 50, the right-angle portion 70a can promote an operation for pushing out and removing the developing solution 50. In addition, the curved portion 70b can promote an operation for equally flattening discharged rinsing solution.

In a rinsing nozzle 75B shown in FIG. 13, a discharging flow path 70d is formed with angle against the moving direction of the rinsing nozzle 75B (denoted by arrow E). Thus, since the nozzle 75B has an operation for pushing out developing solution 50 on the wafer in the moving direction of the nozzle. Thus, the developing solution 50 can be effectively replaced with rinsing solution 57.

The discharging flow paths 70c and 70d of the rinsing nozzles 75A and 75B may be composed of a plurality portions or formed in a slit shape.

Next, with reference to FIG. 14 and FIG. 15, an example of which while a wafer W is being rotated, rinsing solution is discharged will be described.

Figure 14:
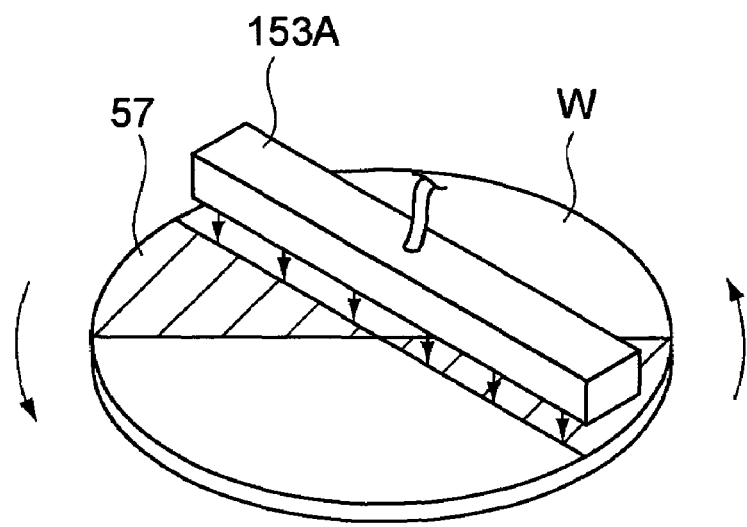
FIG. 14 is a perspective view showing an embodiment of which rinsing solution is discharged while a substrate is being rotated.

In FIG. 14, a rinsing nozzle 153A that has nearly the same length as the diameter of the wafer W is placed at a center portion of the wafer W. In the state, while the wafer W is being rotated, the rinsing nozzle 153A discharges the rinsing solution. Thus, when the wafer W is rotated for 180° or more, rinsing solution 57 can be equally supplied onto the entire surface of the wafer W. As a result, since the rinsing solution is not discharged to the outside of the wafer W, the amount of rinsing solution that is used can be reduced in comparison with the foregoing embodiment of which the nozzle is moved.

Figure 15:
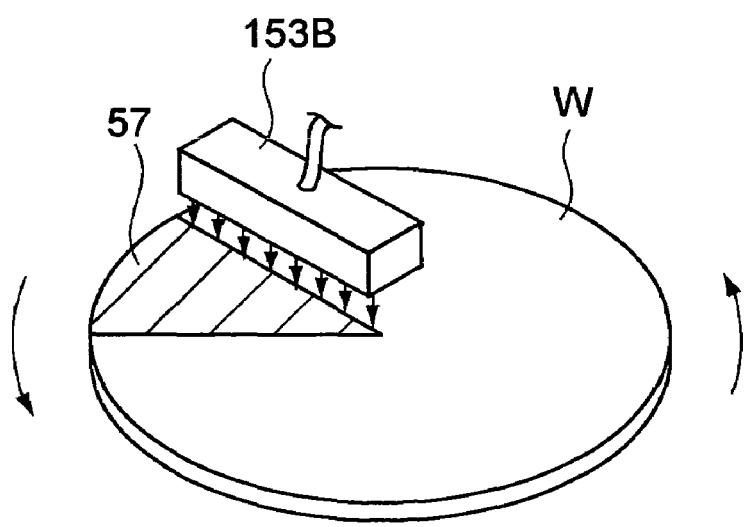
FIG. 15 is a perspective view showing the embodiment of which the rinsing solution is discharged while the substrate is being rotated.

In FIG. 15, one end of a rinsing nozzle 153B that has nearly the same length as the radius of the wafer W is placed at a center portion of the wafer W. While the wafer W is being rotated, the rinsing nozzle 153B discharges rinsing solution onto the wafer W. Thus, when the wafer W is rotated for 360° or more, the rinsing solution 57 can be equally supplied onto the entire surface of the wafer W. Likewise, in this example, since the rinsing solution is not discharged outside the wafer W, the amount of rinsing solution that is used can be reduced in comparison with the foregoing embodiment of which the nozzle is moved. In addition, since the length of the rinsing nozzle 153B can be decreased, the production cost can be reduced.

In addition, in the embodiments shown in FIG. 14 and FIG. 15, the number of rotations of the wafer W is 500 rpm or less. Since the wafer W is rotated as a relatively low number of rotations, the impact of the rotations against the wafer can be suppressed. Thus, the pattern collapse can be prevented. In this example, it is preferred that the number of rotations of the wafer W should be 100 rpm or less.

Figure 16:
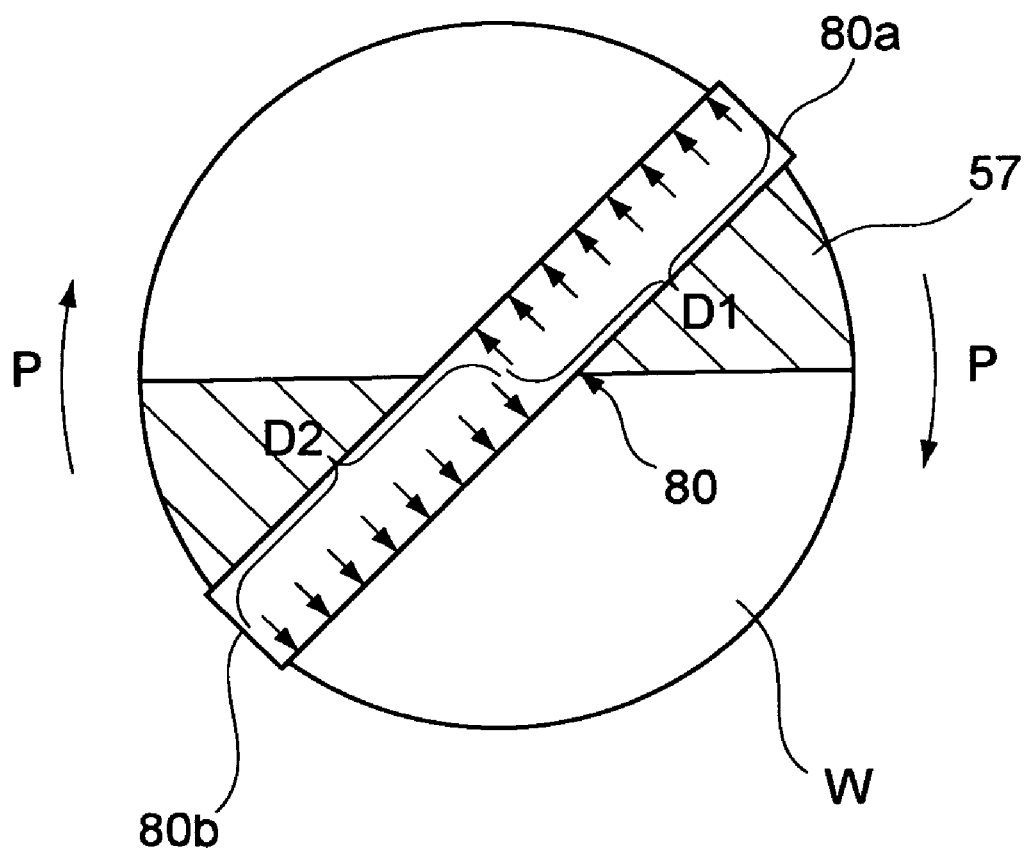
FIG. 16 is a plan view describing a rinsing nozzle according to another embodiment of the present invention.

Next, with reference to FIG. 16, a rinsing nozzle according to another embodiment will be described. Like the example shown in FIG. 14, according to this embodiment, while a wafer is being rotated, a rinsing nozzle 80 that is stationary discharges rinsing solution onto the wafer. The rinsing nozzle 80 has the inclined flow path 70d as shown in FIG. 13. Discharging direction D1 of rinsing solution from a center portion of the rinsing nozzle 80 to one end portion 80a is opposite to discharging direction D2 of rinsing solution from the center portion to another end portion 80b as denoted by arrows. This is because when the wafer W is rotated in the direction of arrow P, rinsing solution is discharged in the relative rotating direction of the rinsing nozzle 80 against the wafer W. Thus, the rinsing nozzle 80 has an operation for pushing out and removing developing solution on the wafer. As a result, developing solution can be effectively replaced with rinsing solution.

Figure 17A:
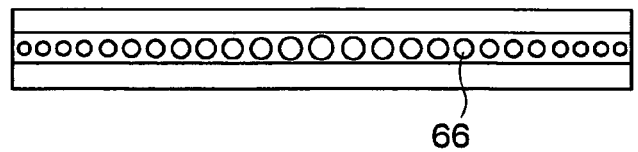
FIG. 17 is an upward plan view showing a rinsing nozzle according to another embodiment of the present invention.
Figure 17B:
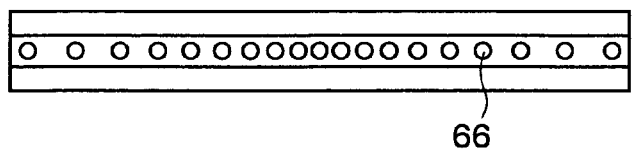

Next, rinsing nozzles according to other embodiments will be described. FIG. 17 is bottom views showing the rinsing nozzles. In the rinsing nozzle shown in FIG. 17(a), a plurality of discharging holes 66 are formed so that the diameters thereof are gradually decreased from the center portion of the nozzle to the end portions thereof. In the rinsing nozzle shown in FIG. 17(b), a plurality of discharging holes 66 are formed so that the pitches thereof are gradually increased from the center portion of the nozzle to the end portions thereof. When rinsing solution is discharged by these rinsing nozzles, the flow amount of rinsing solution discharged from the center portion of the wafer is larger than the flow amount of rinsing solution discharged from the periphery portion of the wafer. Thus, since the rinsing solution flows from the center portion of the wafer to the periphery portion thereof, the developing solution can be effectively removed and the rinsing solution can be equally supplied onto the entire surface of the wafer. These nozzles are especially effective when rinsing solution is discharged while the wafer is being rotated as shown in FIG. 14.

Figure 18A:
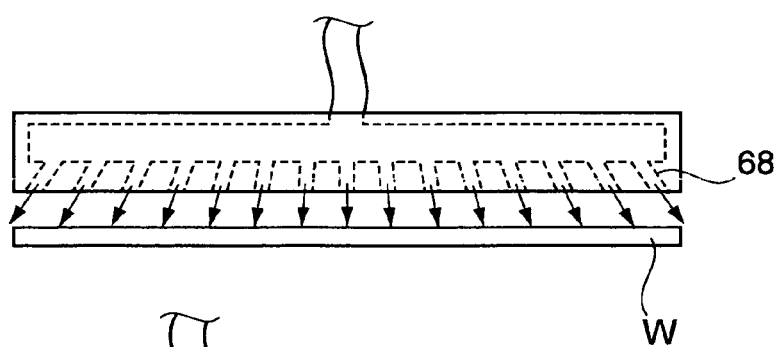
FIG. 18 is a plan view showing the rinsing nozzle according to another embodiment of the present invention.
Figure 18B:
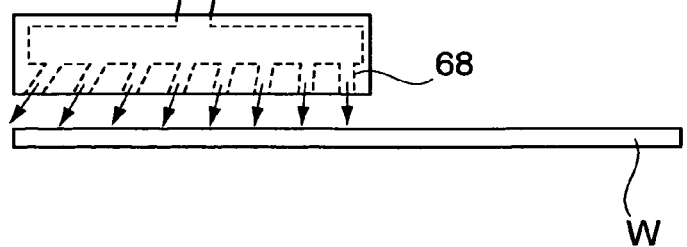

FIG. 18 is front views showing rinsing nozzles according to other embodiments. A rinsing nozzle shown in FIG. 18(a) has a plurality of discharging holes 68 that discharge rinsing solution onto the wafer W. The discharging holes 68 are bent with angles that are gradually and outwardly increased from the center portion of the nozzle to the end portions thereof. A rinsing nozzle shown in FIG. 18(b) has a length that is nearly the same as the radius of the wafer W. The rinsing nozzle shown in FIG. 18(b) has a plurality of discharging holes 68 that discharge rinsing solution onto the wafer W. The discharging holes 68 are bent with angles that are gradually and outwardly increased from the center portion of the nozzle to the periphery portion thereof. When each of these rinsing nozzles discharges rinsing solution onto the wafer W, processing solution can be removed so that it is spread from the center portion to the wafer W to the periphery portion thereof. As a result, the rinsing solution can be equally supplied onto the wafer W. These nozzles are especially useful when they discharge rinsing solution while the wafer is being rotated as shown in FIG. 14.

The present invention is not limited to the foregoing embodiments. Instead, various modifications of the present invention can be made.

According to the foregoing embodiments, rinsing solution whose surface tension weakens is supplied onto a wafer on which developing solution has been supplied. Alternatively, after developing solution is replaced with pure water, rinsing solution whose surface tension weakens may be supplied onto the wafer so as to replace the pure water with the rinsing solution.

The rinsing nozzle shown in FIG. 13 has the discharging flow path 70d that is inclined against the wafer. Alternatively, the rinsing nozzle shown in FIG. 12 that discharge rinsing solution may be inclined.

According to the embodiments shown in FIG. 14 and FIG. 15, while the wafer W is being rotated, rinsing solution is discharged. Alternatively, with rotating mechanisms disposed in the rinsing nozzles 153A and 153B, the nozzles 153A and 153b may be rotated on a plane in parallel with the surface of the wafer.

In addition, the temperature of pure water used for rinsing solution may be adjusted. In this case, it is preferred that the temperature of pure water should be kept in the range from 50° C. to 60° C. When the temperature of pure water is relatively high, the surface tension thereof can be suppressed. As a result, the surface tension of the rinsing solution can be suppressed. Thus, the amount of surfactant to be added can be decreased. The upper limit of the temperature of the pure water is designated at 60° C. because if the temperature of the pure water exceeds 60° C., resist on the wafer may melt.

According to the foregoing embodiments, the rinsing nozzle is moved while it is in contact with developing solution on the wafer. However, when resist having a low aspect ratio free from the pattern collapse is processed, the rinsing nozzle may discharge rinsing solution while the rinsing nozzle is not in contact with developing solution.

In addition, according to the foregoing embodiments, a semiconductor wafer is used as a substrate. Alternatively, a glass substrate used for a liquid crystal device may be used.

Second Embodiment

Figure 19:
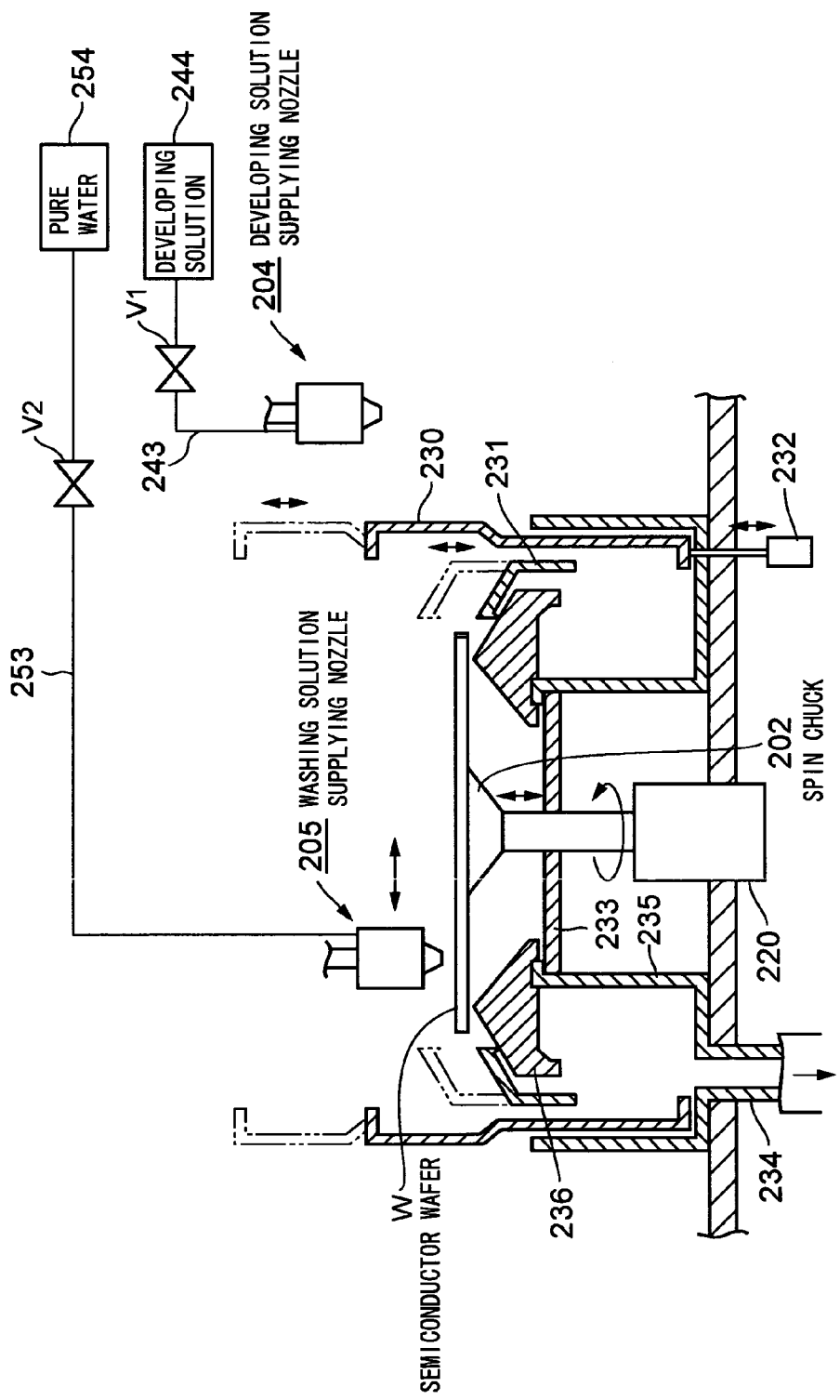
FIG. 19 is a vertical sectional view showing a developing apparatus according to a second embodiment of the present invention.
Figure 20:
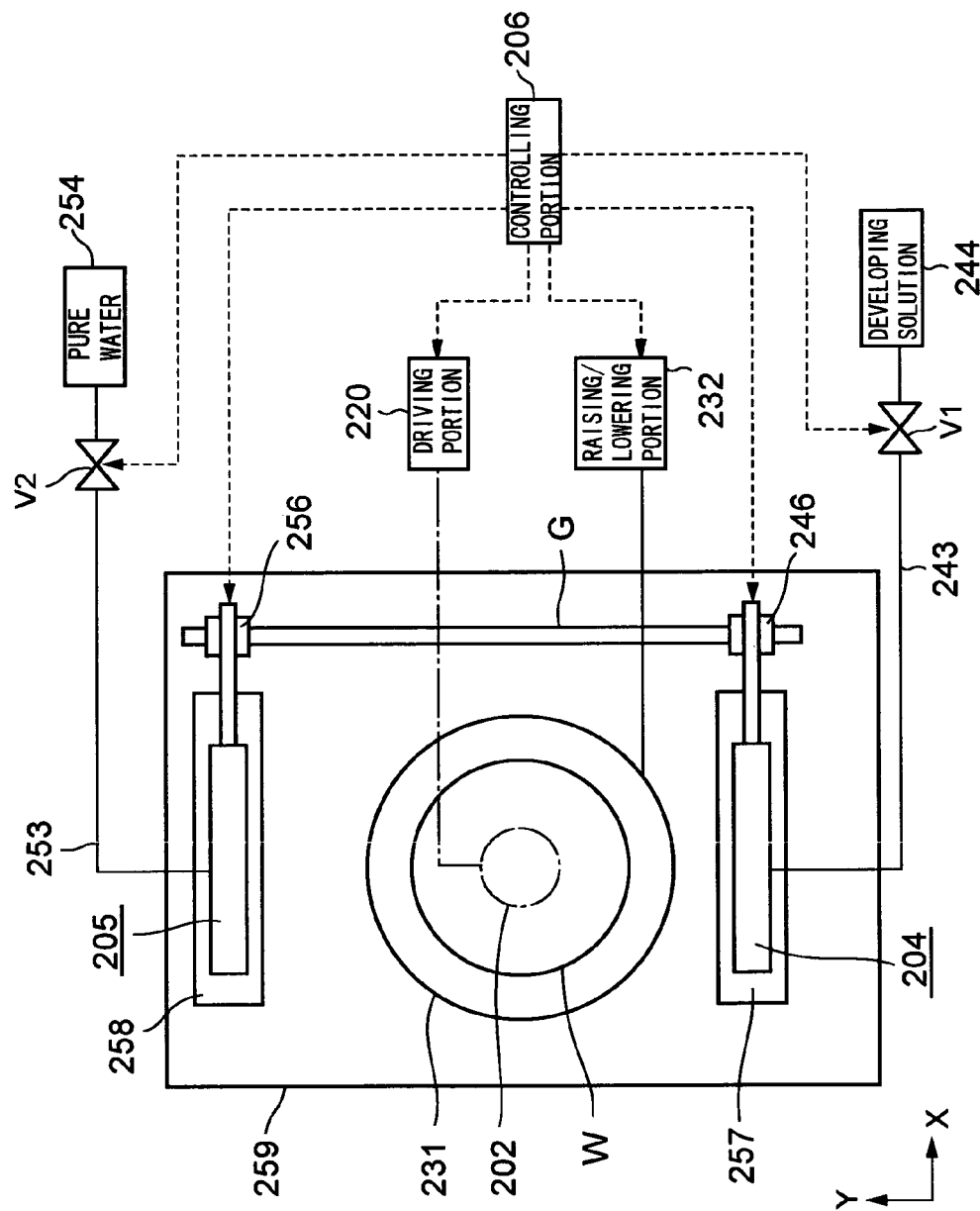
FIG. 20 is a plan view showing the developing apparatus according to the second embodiment of the present invention.

Next, a second embodiment of the present invention will be described. FIG. 19 is an outlined sectional view showing a developing apparatus and FIG. 20 is an outlined plan view thereof. In the drawings, reference numerals 202 represents a spin chuck that vacuum-sucks and almost horizontally holds the center portion on the rear side of for example an 8-inch wafer W as a substrate. The spin chuck 202 is structured so that it is rotated, raised, and lowered by a driving portion 220. While the wafer W is being sucked and held by the spin chuck 202, an outer cup 230 and an inner cup 231 surround the periphery of the wafer W. An upper cylinder portion of the inner cup 231 is inclined inwardly so that an upper opening portion thereof is narrower than a lower opening portion thereof. When the outer cup 230 is raised and lowered by a raising/lowering portion 232, the inner cup 231 is raised and lowered in a part of the moving range of the outer cup 230. A disc 233 that surrounds a rotating shaft of the spin chuck 202 is disposed below the spin chuck 202. In addition, a solution receiving portion 235 has a concave portion formed around the entire periphery of the disc 233. The solution receiving portion 235 also has a bottom drain opening 234. A ring member 236 that approaches the rear surface of the wafer W is disposed at the periphery portion of the disc 233. The ring member 236 has a section formed in a mountain shape.

Figure 21:
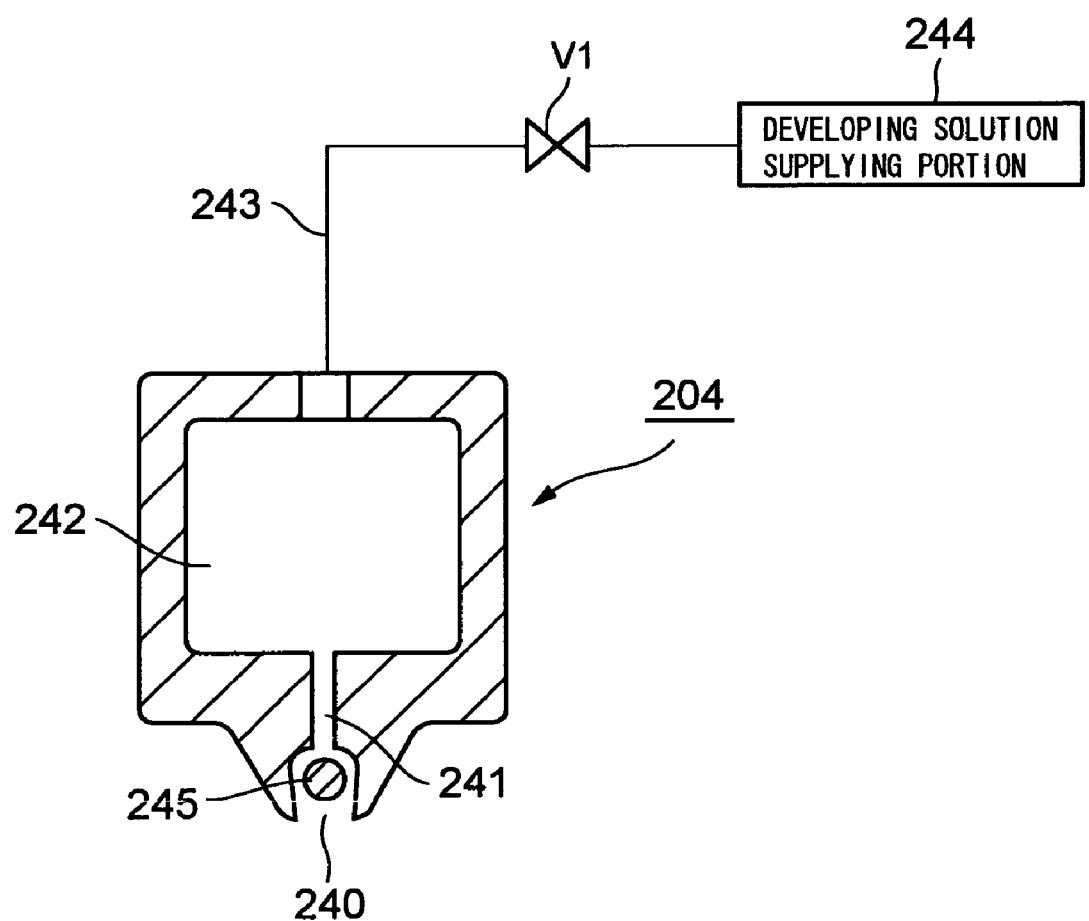
FIG. 21 is a vertical sectional view showing a developing solution supplying nozzle used in the developing apparatus.

Next, a developing solution supplying nozzle 204 as developing solution supplying means that supplies (coats)

developing solution onto a wafer W that is sucked and held by the spin chuck 202 will be described. As shown in FIG. 19 and FIG. 21, the developing solution supplying nozzle 204 has a discharge opening 240 formed in for example a slit shape and a developing solution reservoir portion 242. The discharging opening 240 is disposed in the longitudinal direction of the nozzle so as to form a discharging area of developing solution for a length that is equal to or larger than the width of the effective area (device forming area) of the wafer W. The developing solution reservoir portion 242 is connected to the discharging opening 240 through a developing solution flow path 241. The developing solution reservoir portion 242 is connected to a developing solution supplying portion 244 through a supplying path 243, for example a pipe. An open/close valve V1 is disposed in the middle of the supplying path 243. In the drawing, reference numeral 245 represents a buffering rod that is for example a quartz rod or a porous member disposed in the discharging opening 240. The buffering rod 245 allows the discharging pressure of the developing solution in the flow path 241 to become equal in the longitudinal direction of the developing solution supplying nozzle 204. In addition, the buffering rod 245 prevents developing solution from leaking out from the discharging opening 240. As shown in FIG. 20, the developing solution supplying nozzle 204 can be raised and lowered by a first moving mechanism 246. In addition, the developing solution supplying nozzle 204 can be moved in the lateral direction along a guide rail G disposed outside the outer cup 230. The developing solution supplying nozzle 204 is not limited to the foregoing structure. In other words, the developing solution supplying nozzle 204 may have only the slit-shaped discharging opening 240, not the buffering rod 245.

Figure 22:
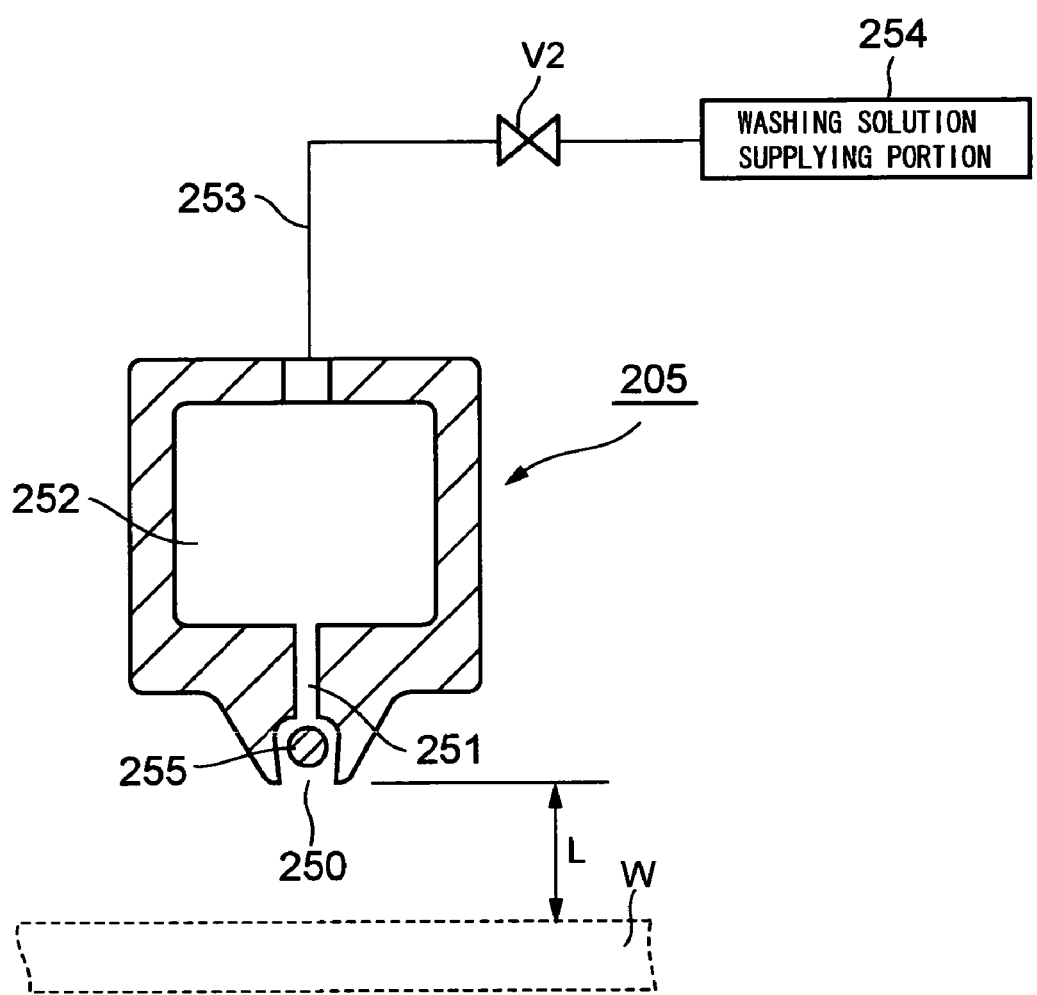
FIG. 22 is a vertical sectional view showing a washing solution supplying nozzle used in the developing apparatus.

Next, a washing solution supplying nozzle 205 as washing solution supplying means that supplies washing solution onto a wafer W will be described. As shown in FIG. 22, the washing solution supplying nozzle 205 has a discharging opening 250 and a washing solution reservoir portion 252. The discharging opening 250 is formed in a slit shape and extends in the longitudinal direction of the nozzle so as to form a discharging area of washing solution for a length that is equal to or larger than an effective area (device forming area) of the wafer W. The washing solution reservoir portion 252 is connected to the discharging opening 250 through a washing solution flow path 251. The washing solution reservoir portion 252 is connected to a washing solution supplying portion 254 through a supplying path 253, for example a pipe. An open/close valve V2 is disposed in the middle of the supplying path 253. In the drawing, reference numeral 255 represents a buffering rod having the foregoing function.

The washing solution supplying nozzle 205 can be raised and lowered by a second moving mechanism 256. In addition, the washing solution supplying nozzle 205 can be horizontally moved from a standby position, for example a position of one end of the guide rail G, to a position opposite thereto through the wafer W. In FIG. 20, the positions of the first moving mechanism 246 and the second moving mechanism 256 are standby positions of the developing solution supplying nozzle 204 and the washing solution supplying nozzle 205 that are placed when they do not operate. In the drawing, standby portions 257 and 258 of the first moving mechanism 246 and the second moving mechanism 256 are disposed. The standby portions 257 and 258 are composed of plate members that can be raised and lowered. The outer cup 230, the inner cup 231, the raising/lowering portion 232, the first moving mechanism 246, and the second moving mechanism 256 compose one unit surrounded by a box-shaped housing 259. A wafer W is loaded and unloaded into and from the housing 259 by a conveying arm (not shown) through a conveying opening (not shown).

The driving portion 220, the raising/lowering portion 232, the first moving mechanism 246, the second moving mechanism 256, and the open/close valves V1 and V2 are connected to a controlling portion 206. The controlling portion 206 controls each portion so when the spin chuck 202 is raised and lowered by the driving portion 220, the open/close valves V1 and V2 are opened and closed, the developing solution supplying nozzle 204 is moved by the first moving mechanism 246, and the washing solution supplying nozzle 205 is moved by the second moving mechanism 256. At that point, the controlling portion 206 controls timings of opening/closing operations of the valves V1 and V2, timings of start and stop of movement of the first moving mechanism 246 and the second moving mechanism 256, and moving speeds thereof in accordance with a process recipe that has been set.

Next, with reference to FIG. 23, steps of a developing process of the foregoing developing apparatus will be described. When the outer cup 230 and the inner cup 231 have been placed at their lower positions, the spin chuck 202 is raised to a position above the outer cup 230. A wafer on which resist has been coated at the preceding step and for which an exposing process has been performed is transferred from a conveying arm (not shown) to the spin chuck 202. Thereafter, the spin chuck 202 is lowered so that the wafer W is placed at a predetermined position denoted by for example a dotted line shown in FIG. 19.

Figure 23A:
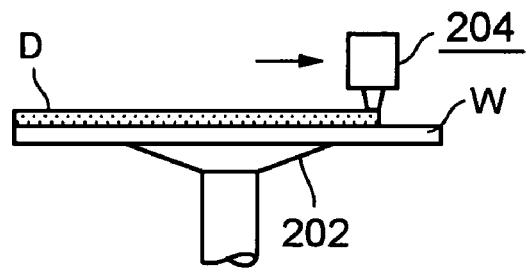
FIG. 23 is a schematic diagram describing steps of a developing process of the developing apparatus.
Figure 23B:
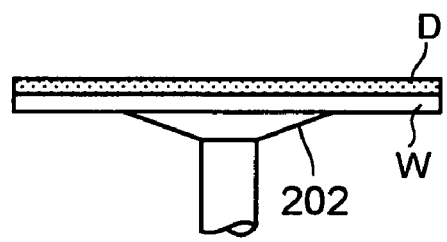

Thereafter, the developing solution supplying nozzle 204 is guided to a discharging start position between the outer cup 230 and the periphery of the wafer W by the first moving mechanism 246. Thereafter, the discharging opening 240 is placed at a position higher than the level of the front surface of the wafer W by around 1 mm. Thereafter, the open/close valve V1 is opened. While developing solution D is being discharged from the discharging opening 240, as shown in FIG. 23(a), the developing solution supplying nozzle 204 is moved from the one end side of the wafer W to the other end side thereof at a scanning speed of for example around 65 mm/second. The developing solution supplying nozzle 204 discharges the developing solution D onto the front surface of the wafer W so as to form a developing solution film of around 1 mm. Thereafter, as shown in FIG. 23(b), this state is kept for a predetermined time period, for example around 60 seconds. In other words, a stationary development is performed so as to promote the development reaction for the wafer W. After the developing solution supplying nozzle 204 has passed through the other end side of the wafer W, the open/close valve V1 is closed so as to stop discharging developing solution D. Thereafter, the developing solution supplying nozzle 204 is returned to the standby portion 257.

Figure 23C:
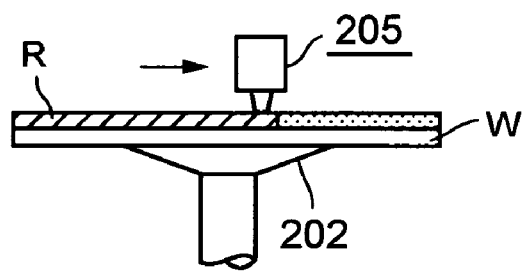

Thereafter, the washing solution supplying nozzle 205 is guided to the discharging start position by the second moving mechanism 256. Thereafter, the washing solution supplying nozzle 205 is lowered so that the separate distance L between the tip of the discharging opening 250 as the lower end portion of the nozzle and the front surface of the wafer W becomes 0.4 mm or less, for example 0.3 mm. The front surface of the wafer W means the front surface of a resist film. However, the thickness of a resist film in which a development defect concerned in the present invention normally takes place is around 0.5 µm. Thus, the thickness of the resist film is sufficiently smaller than the separate distance L. Thereafter, as shown in FIG. 23(c), the open/ close valve V2 is opened and washing solution R, for example pure water, is discharged from the discharging opening 250 with a flow amount of for example 2.0 litters/minute (flow speed of 0.05 m/second), for example a discharging pressure of 1.7 kgf/cm$^2$ (0.17 MPa). In addition, the washing solution supplying nozzle 205 is moved from the one end side of the wafer W to the other end side thereof at a scanning speed of for example around 120 mm/second. Hereinafter this operation is referred to as scan-washing. Thereafter, the scan-washing is repeatedly performed two times. In other words, a total of three times the scan-washing is performed. In the example, since it takes around 1.7 seconds to scan an 8-inch wafer W from the one end to the other end, the scan-washing takes around 5.1 seconds. The open/close valve V2 is closed. The washing solution supplying nozzle 205 stops discharging the rinsing solution R. Thereafter, the washing solution supplying nozzle 205 is returned to the standby portion 258.

Figure 24:
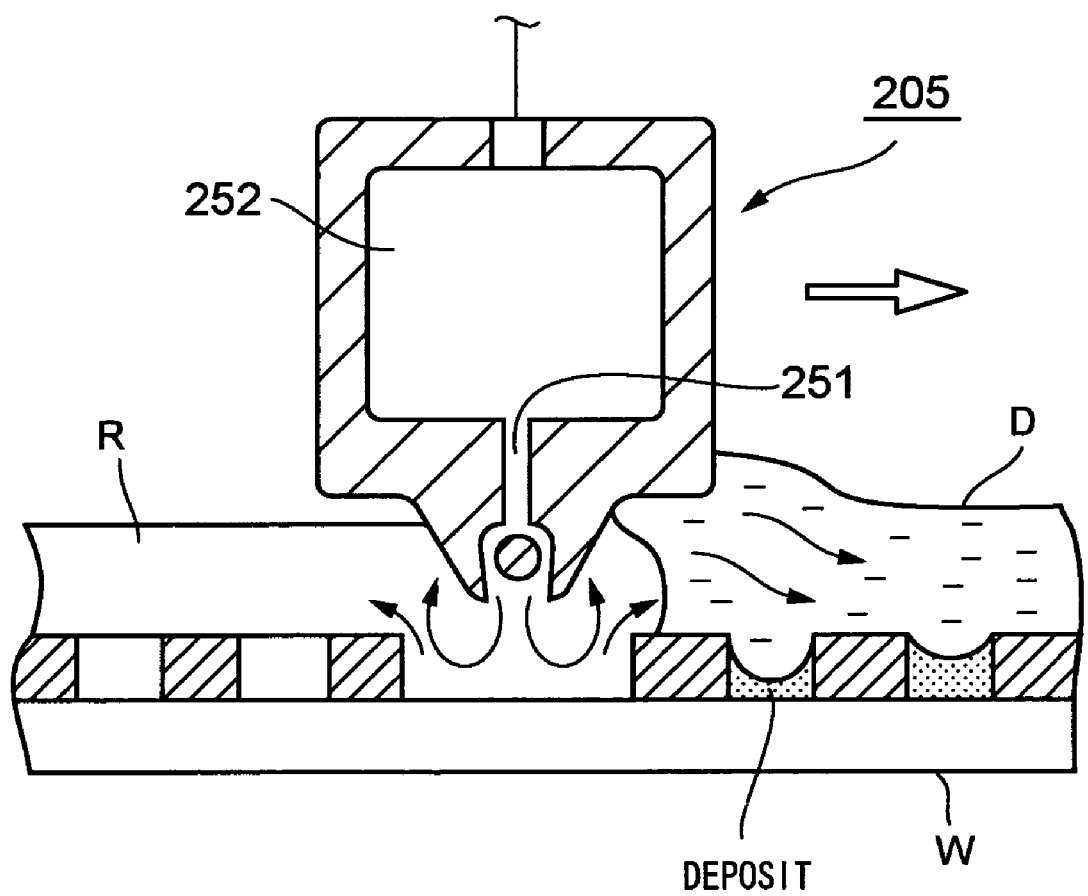
FIG. 24 is a schematic diagram describing a washing step of the developing apparatus.

Next, how the front surface of the wafer W is washed will be described in detail. As shown in FIG. 24, when the washing solution supplying nozzle 205 scans the wafer W, the side wall of the washing solution supplying nozzle 205 pushes the developing solution D on the wafer W in the forward direction. As a result, a flow of solution takes place. This flow sweeps out a front layer portion of deposit (development paddle) of resist in a valley portion of a pattern on the forward side. Thereafter, the washing solution R discharged at a predetermined discharging pressure from the discharging opening 250 of the washing solution supplying nozzle 205 sweeps out remaining deposit that adheres to the bottom portion and corner portion of the pattern. The deposit swept away from the valley portion of the pattern is diluted with the washing solution R supplied to the wafer W. At a later step, the diluted deposit is removed from the wafer W along with the washing solution R. When the scan-washing is performed first time, most of deposit may be removed. When the scan-washing is performed second time and later, the wafer W may be rotated at for example 10 to 1000 rpm. Of course, when the scan-washing is performed, the number of rotations of the wafer W may be varied.

Figure 23D:
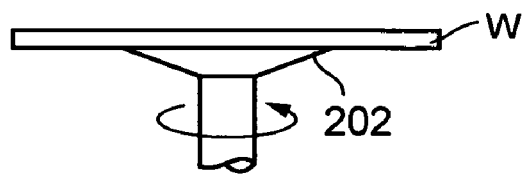

Returning to FIG. 23, after the developing solution D on the front surface of the wafer W is replaced with the washing solution R, the outer cup 230 and the inner cup 231 are placed at their upper positions by the raising/lowering portion 232. As shown in FIG. 23(d), the wafer W is spin-dried by rotating the wafer W at for example around 4000 rpm so as to shake off the washing solution R. Thereafter, the wafer W is unloaded from the developing apparatus by a conveying arm (not shown).

According to the foregoing embodiment, a lateral push-out operation of which the washing solution R discharged from the discharging opening 250 collides with the front surface of the wafer W and a push-out operation of the side wall of the washing solution supplying nozzle 205 are combined to produce strong exhaust force that laterally acts and cause the developing solution D containing a resist component on the wafer W to be discharged. As a result, exhaust force superior to the adhesive force (frictional force the developing solution D against the wafer W and the wall surface of the pattern) acts for deposit at a bottom portion and a corner portion of a pattern. Thus, developing solution and a resist component can be prevented from remaining on the front surface of the wafer W. As a result, a resist pattern whose development defects are small can be obtained.

Third Embodiment

Figure 25:
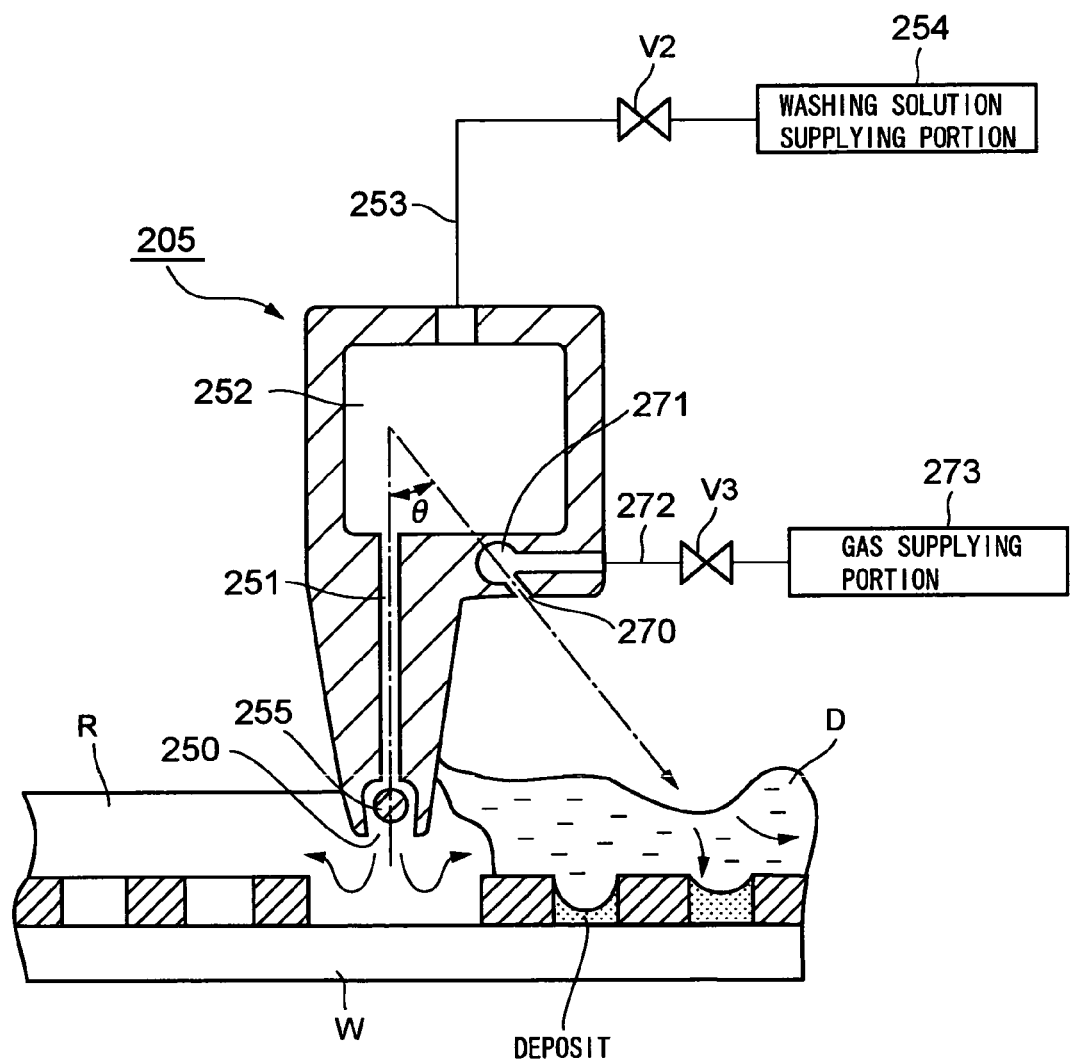
FIG. 25 is a vertical sectional view showing a washing solution supplying nozzle used in a developing apparatus according to a third embodiment of the present invention.

Next, a third embodiment of the present invention will be described. According to the third embodiment, air supplying means is added to the washing solution supplying nozzle 205 shown in FIG. 22. The discharging opening 250 of the nozzle 205 according to the present embodiment is longer than that according to the foregoing embodiments. As shown in FIG. 25, the air supplying means has a blowing opening 270 that blows gas, for example air, to the front surface of the wafer W. The blowing opening 270 is disposed at a side wall portion in the moving direction of the washing solution supplying nozzle 205. The blowing opening 270 is disposed above the surface of the developing solution D. The blowing opening 270 is inclined against the axial line (discharging direction) of the discharging opening 250 by an angle of .theta., for example 0° to 60°. In addition, the blowing opening 270 is composed of a plurality of air supplying holes each having a diameter of 0.4 mm. The air supplying holes are disposed at predetermined intervals in the longitudinal direction of the washing solution supplying nozzle 205. In addition, the blowing opening 270 is connected to one end of an air supplying path 272, for example a pipe, through an air reservoir portion 271 in the washing solution supplying nozzle 205. A gas supplying portion 273 is connected to an opposite end of the air supplying path as the air reservoir portion 271. An open/close valve V3 is connected in the middle of the air supplying path 272. In this case, after the wafer W has been stationary-developed at the steps shown in FIG. 23(a) and (b), the washing solution R is supplied to the wafer W from the washing solution supplying nozzle 205 in the same condition as the foregoing example. In addition, air is blown from the blowing opening 270 to the wafer W with a flow amount of for example 2.0 litters/minute. The blowing opening 270 may be disposed below the surface of the developing solution D. However, in this case, since the discharging opening 250 of the washing solution supplying nozzle 205 becomes dirty, it is preferred that it should be frequently cleaned. Thus, it is desired that the blowing opening 270 should be disposed above the surface of the developing solution D. supplying nozzle 205 scans the wafer W, gas blown from the blowing opening 270 disposed in the scanning direction to the developing solution D placed in the forward direction causes the developing solution D on the wafer W to flow, the flow of the developing solution D to fling up deposit of the resist, and the washing solution R discharged from the discharge opening 250 that preceded by the air blowing opening 270 to sweep away the deposit of the resist. In addition, the washing solution R discharged from the discharging opening 250 sweeps out the deposit. As a result, the washing effect is improved. Thus, deposit that resides on the front surface of the wafer W is suppressed. Thus, according to the present embodiment, the same effect as the foregoing embodiments can be obtained.

Figures 26A, 26B:
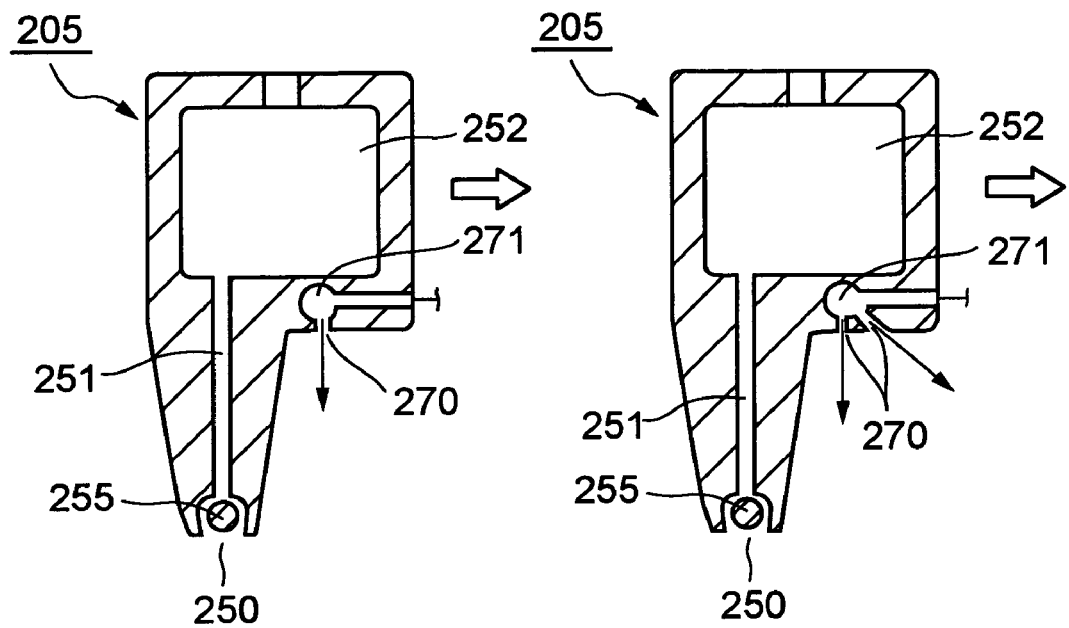
FIG. 26 is a vertical sectional view showing another washing solution nozzle used in the developing apparatus according to the other embodiment.
Figure 26C:
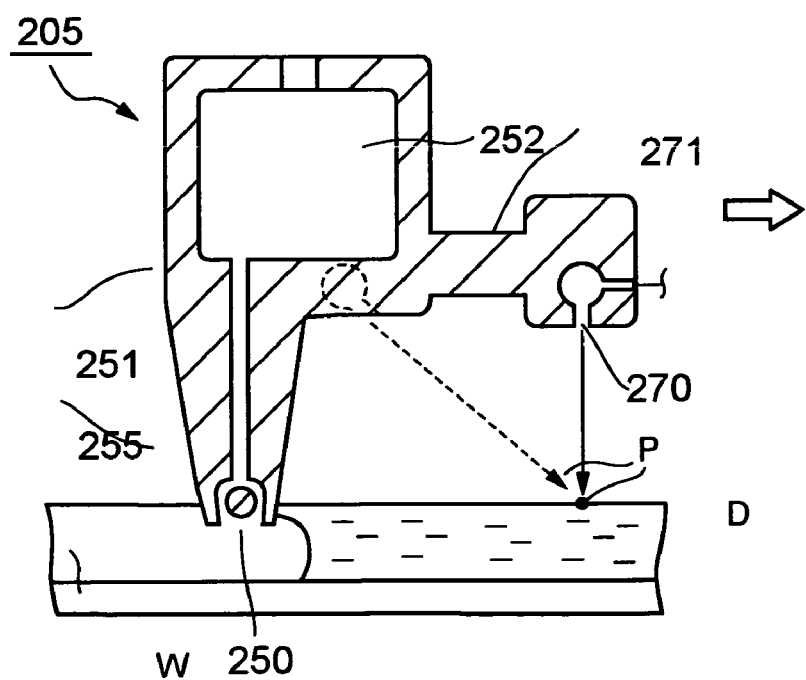

The blowing opening 270 is not limited to the foregoing structure of which it is inclined. Alternatively, the blowing opening 270 may be vertically formed so that it blows gas to a position immediately followed by the discharging opening 250 of the washing solution R as shown in FIG. 26(a). In addition, as shown in FIG. 26(b), the blowing opening 270 may be formed in both vertical and diagonal directions. Alternatively, as shown in FIG. 26(c), the blowing opening 270 may blow air to a position (point P in the drawing) to which air is blown from the inclined blowing opening 270 shown in FIG. 25. In such structures, since air is blown to the developing solution D, deposit of resist is flung up. Thus, according to the present embodiment, the same effect as the foregoing embodiments can be obtained.

Figure 27:
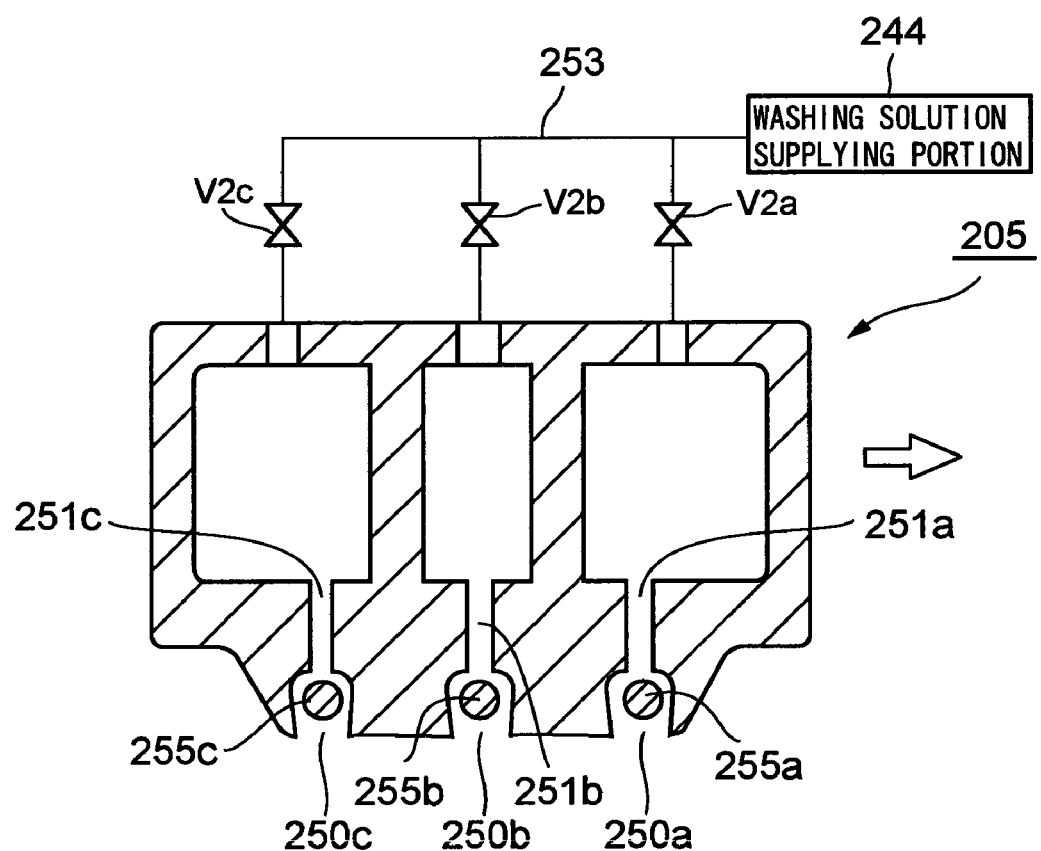
FIG. 27 is a vertical sectional view showing another washing solution nozzle used in the developing apparatus according to the present invention.

According to the present invention, the washing solution supplying nozzle 205 is not limited to the structure of which only one slit-shaped discharging opening is disposed. Alternatively, as shown in FIG. 27, the washing solution supplying nozzle 205 may have a plurality of slit-shaped discharging openings 250a, 250b, and 250c disposed in the moving direction of the washing solution supplying nozzle 205. The discharge openings 250a, 250b, and 250c are respectively connected to the washing solution flow paths 251a, 251b, and 251c. In FIG. 27, reference numerals 255a, 255b, and 250c represent buffering rods that are respectively disposed in the discharge openings 250a, 250b, and 250c. In addition, flow amount adjusting portions, for example flow amount adjusting valves V2a, V2b, and V2c, may be disposed so as to allow flow amounts of the discharging openings 250a, 250b, and 250c to be adjusted. In this case, although the flow amounts of the discharging openings may be the same, it is preferred that the flow amount of the forward discharging opening 250a should be the lowest and the flow amounts of the discharging openings 250b and 250c should be gradually increased in the range from for example 0.5 to 4.0 liters/minute so that after deposit of small particles is swept away, deposit of large particles are swept away. In such a structure, the same effect as the foregoing structure can be obtained. When the supplying amount of the washing solution R is increased, the wafer W can be washed in a short washing time period.

Figure 28:
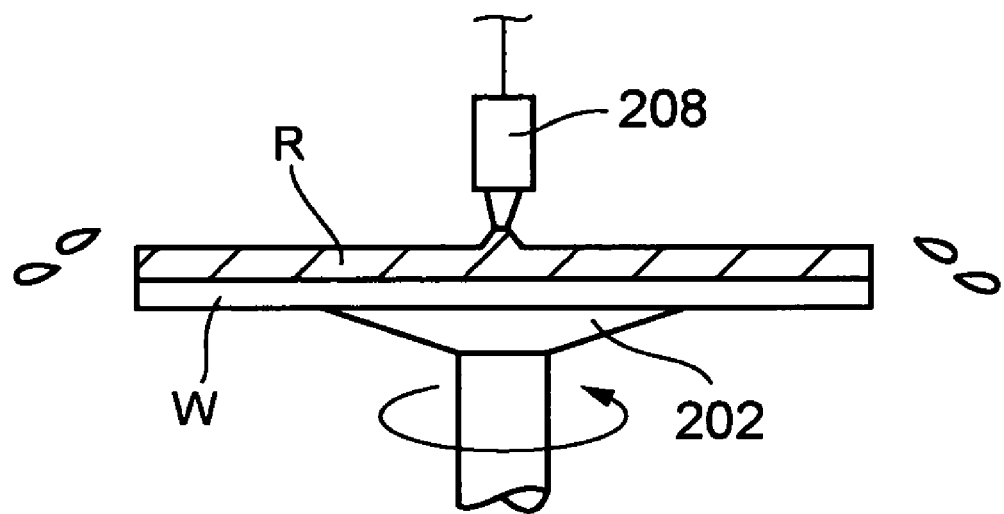
FIG. 28 is a schematic diagram describing another washing method for the developing apparatus according to the present invention.

In addition, according to the present invention, after the wafer W is washed as shown in FIG. 23(c), the wafer W may be spin-washed as shown in FIG. 28. In other words, after the wafer W is washed with the washing solution supplying nozzle 205 in the same condition as the foregoing embodiments and the washing solution supplying nozzle 205 is returned, another washing solution supply nozzle 208 that supplies the washing solution R to the center portion of the wafer W is placed at a position opposite to the center portion of the wafer W and apart therefrom by for example around 2 mm. Thereafter, the wafer W is rotated at for example around 100 to 1000 rpm. In addition, the washing solution R is supplied onto the front surface of the wafer W with a flow amount of 1 litter/minute. After a predetermined time period, for example 5 seconds, has elapsed, the washing solution R is stopped and the wafer W is spin-dried. In this case, the conventional scan-washing operation and the spin-washing operation using centrifugal force are combined to improve the washing effect and obtain the same effect as the foregoing embodiments.

Alternatively, according to the present invention, after the developing solution D has been supplied onto the front surface of the wafer W and the stationary development has been completed, before the washing solution R is supplied, the spin chuck 202 may rotate the wafer W at for example around 100 rpm to 1000 rpm for a predetermined time period, for example 0.5 to 3 seconds. In this case, before the washing solution R is supplied, the developing solution D on the wafer W can be shaken off to some extent by centrifugal force. Thus, in addition to the washing operation of the washing solution R that is performed next, the washing effect is further improved. As a result, the same effect as the foregoing embodiments can be obtained.

Figure 29:
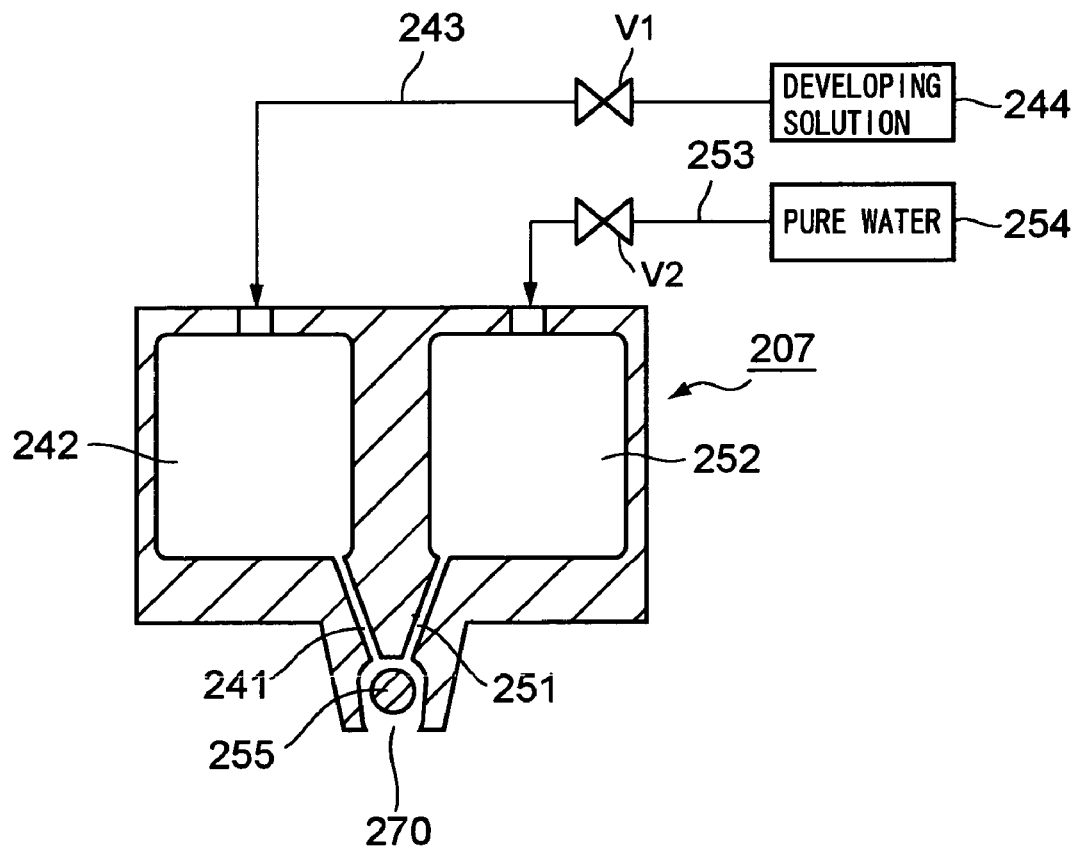
FIG. 29 is a vertical sectional view showing another washing solution nozzle used in the developing apparatus according to the present invention.

In addition, according to the present invention, the discharging opening 250 is not limited to the slit shape. Alternatively, discharging holes having a diameter of around 0.4 mm each may be disposed at intervals in the longitudinal direction on the lower surface side of the nozzle. In addition, the washing solution supplying nozzle 205 and the developing solution supplying nozzle 204 may not be separate nozzles. For example, as shown in FIG. 29, a common nozzle 207 having a common discharging opening 270 may be connected to the developing solution supplying portion 244 and the washing solution supplying portion 254 through the supplying paths 243 and 253. By switching the valves V1 and V2, the developing solution D or the washing solution R may be supplied.

Figure 30:
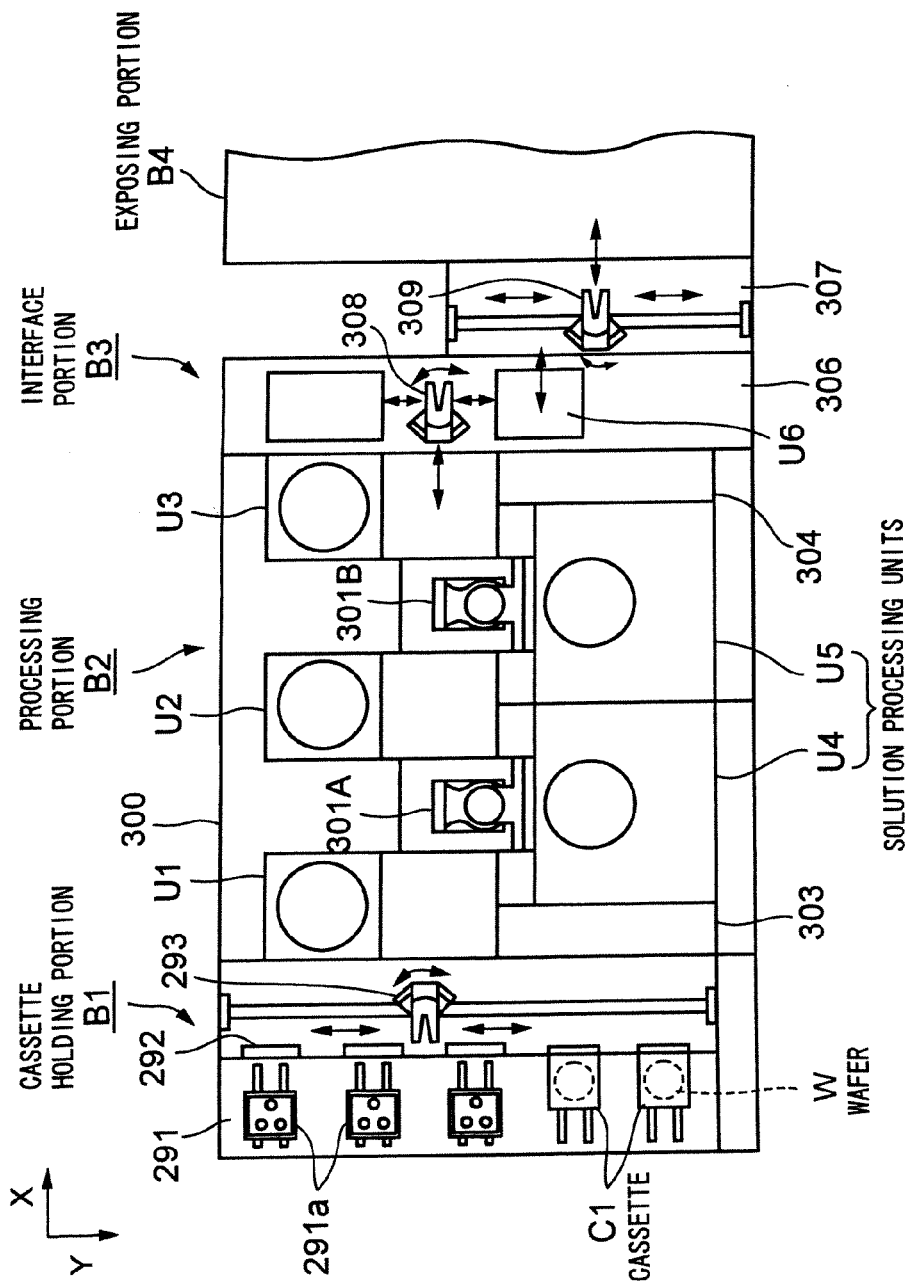
FIG. 30 is a perspective view showing an example of a coating apparatus that contains the developing apparatus according to the present invention.

Next, with reference to FIG. 30 and FIG. 31, an example of a coating/developing apparatus of which the foregoing developing apparatus is incorporated into a developing unit will be described. In the drawings, reference letter B1 represents a cassette holding portion that air-tightly loads and unloads to and from the coating/developing apparatus a cassette C that contains for example 13 wafers W as substrates. The cassette holding portion B1 has a holding table 291, an open/close portion 292, and transferring means 293. The. holding table 291 has a holding portion 291a that can hold a plurality of cassettes C. The open/close portion 292 is disposed on a front wall surface of the holding table 291. The transferring means 293 takes a wafer W from a cassette C through the open-close portion 292.

A far side of the cassette holding portion B1 is connected to a processing portion B2 surrounded by a housing 300. In the processing portion B2, shelf units U1, U2, and U3 and main conveying means 301A and 301B are alternately disposed in the order viewed from the near side. Each of the shelf units U1, U2, and U3 has heating units and cooling units that are multiply piled. Each of the main conveying means 301A and 301B transfers a wafer W among individual processing units including a coating/developing unit that will be described later. In other words, the shelf units U1, U2, and U3 and the main conveying means 301A and 301B are disposed in a row viewed from the cassette holding portion B1. Each connecting portion has an opening portion (not shown) through which a wafer is conveyed. The wafer W can be freely conveyed from the shelf unit U1 on one end side of the processing portion B2 to the shelf unit U2 on the other end side thereof. The main conveying means 301A and 301B are disposed in a space surrounded by partition walls 32 composed of one surface portion of the shelf units U1, U2, and U3 disposed in the near and far directions viewed from the cassette holding portion B1, one surface portion of solution processing units U4 and U5 (that will be described later) on the right, and a rear surface portion on the left. In the drawings, reference numerals 303 and 304 are temperature/humidity adjusting units having a temperature adjusting unit, a temperature/humidity adjusting duct, and so forth. The temperature adjusting unit adjusts processing solutions used in each unit.

Figure 31:
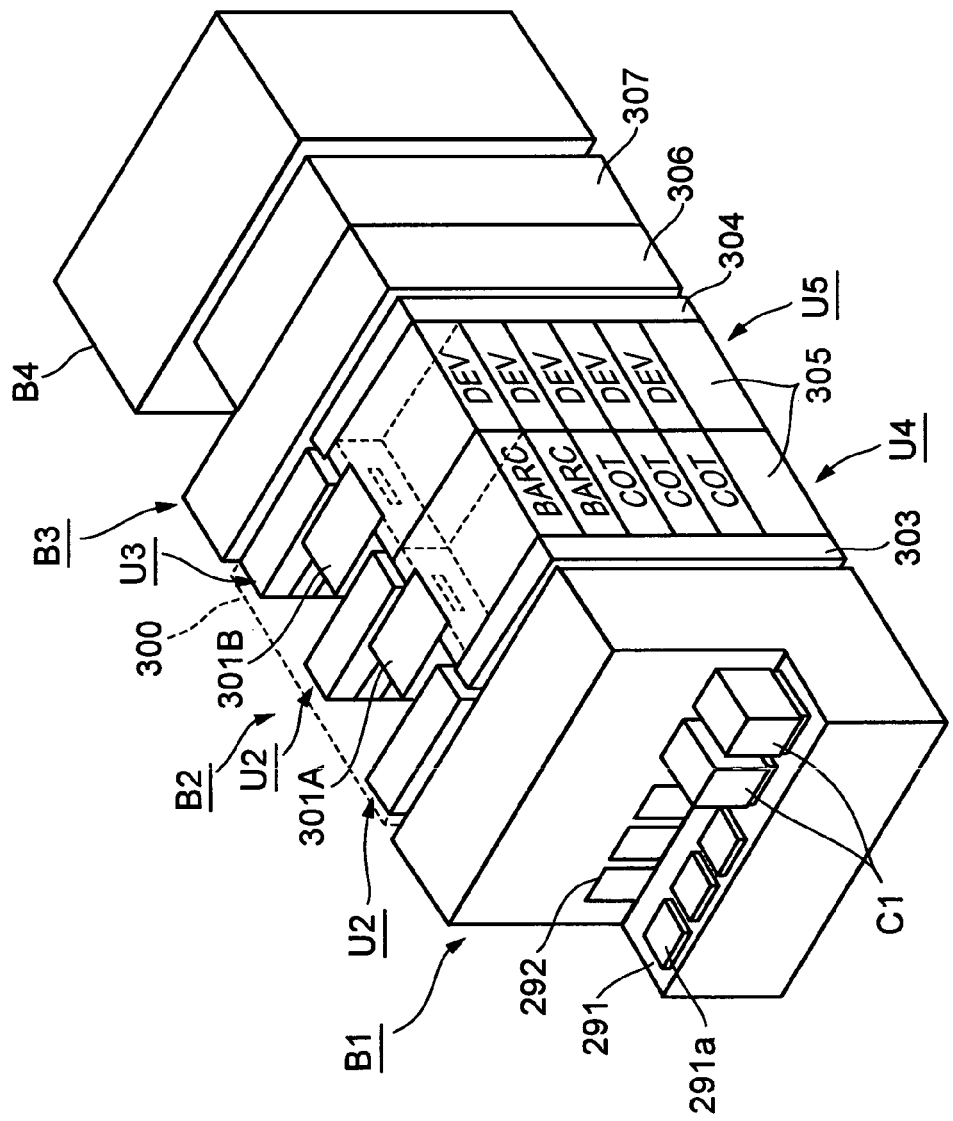
FIG. 31 is a plan view showing an example of the coating apparatus that contains the developing apparatus according to the present invention.

As shown in FIG. 31, the solution processing units U4 and U5 have a structure of which a plurality of units, for example five units, that are a coating unit COT, a developing unit DEV into which the developing apparatus shown in FIG. 19 and FIG. 20 is incorporated, a reflection protection file forming unit BARC, and so forth are piled on an accommodating portion 305 for a space for coating solution (resist solution) and developing solution. On the other hand, the shelf units U1, U2, and U3 have a structure of which a plurality of units, for example 10 units, that perform pre-processes and post-processes for the solution processing units U4 and U5 are piled.

A far side of the shelf unit U3 of the processing portion B2 is connected to an exposing portion B4 through an interface portion B3 composed of a first conveying chamber 306 and a second conveying chamber 307. The interface portion B3 has a shelf unit U6 and a buffer cassette CO as well as two transferring means 308 and 309 that transfer a wafer W between the processing portion B2 and the exposing portion B4.

Next, an example of a flow of a wafer in the apparatus will be described. First of all, a cassette C that contains wafers W is conveyed from the outside of the apparatus and placed on the holding table 291. At that point, the open/close portion 292 and the lid of the cassette C are opened. A wafer W is taken from the cassette C by the transferring means 293. The wafer W is transferred to the main conveying means 301A through a transferring unit (not shown) as one shelf of the shelf unit U1. One shelf of the shelf units U1 to U3 performs for example a hydrophobic process and a cooling process as pre-processes of a coating process. Thereafter, the coating unit COT coats resist solution onto the wafer W. After the resist film has been coated onto the front surface of the wafer W, it is heated by a heating unit as one shelf of the shelf units U1 to U3. Thereafter, the wafer W is cooled. After the wafer W has been cooled, it is loaded into the interface portion B3 through the transferring unit of the shelf unit U3. In the interface portion B3, the wafer W is conveyed to the exposing portion B4 in a path of for example the transferring means 308->shelf unit U6->transferring means 309. The wafer W is exposed in the exposing portion B4. After the wafer W has been exposed, the wafer W is conveyed to the main conveying means 301A in the reverse path. The developing unit DEV develops the wafer W. As a result, a resist mask is formed on the wafer W. Thereafter, the wafer W is returned to the original cassette C on the holding table 291.

It should be noted that the present invention can be applied to as workpiece substrates, for example a LCD substrate and a photo mask reticle substrate, other than a semiconductor wafer.

Next, examples conducted to confirm the effect of the present invention will be described.

First Example

This example is a first example using the developing apparatus according to the second embodiment of the present invention.

In the first example, the developing process shown in FIG. 23 was performed for a substrate on which resist had been coated and for which an exposing process had been performed. Separation distance L and washing time period T of the washing solution supplying nozzle 205 were varied as various set values. Surface defects were measured (using a test device made by KLA-tencor) for the front surface of the substrate on which the developing process had been performed so as to measure the number of development defects. In the verification, development defects that exceed 0.08 μm each were counted. Practical test conditions of the first example are as follows:

Substrate: 8-inch semiconductor wafer
Solution film thickness of developing solution D: 1.5 mm
Time period of stationary development: 60 seconds
Scanning speed of washing solution supplying nozzle 205: 120 mm/second
Flow amount of washing solution R: 2.0 litters/second
Separation distance L: 0.3 mm, 0.4 mm, (0.6 mm), (1.0 mm), 1.5 mm, 5 mm (values in parentheses were obtained under condition of which washing time period was 5 seconds)
Number of times of scan-washing was performed (washing time period): (for each value of separation distance L) 3 times (5 seconds), 6 times (10 seconds)

Result and Consideration of First Example

Figure 32:
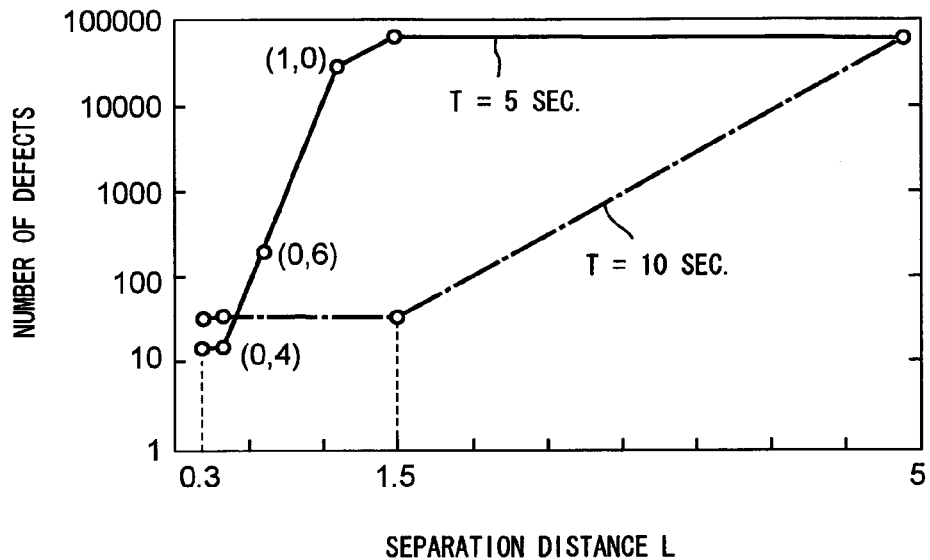
FIG. 32 is a characteristic chart showing an example performed to confirm an effect of the present invention.

FIG. 32 shows the test result of the first example. First, the wafer W was washed for five seconds. When the value of the separation distance L was larger than 1.5 mm, the number of defects counted was 65000 (detected upper limit value). When the value of the separation distance L was 1.5 mm or less, the number of defects decreased. When the value of the separation distance L was 0.6 mm or less, the separation distance L sharply decreased. When the values of the separation distance L were 0.3 mm and 0.4 mm, the number of defects was around 20. Next, the washing time period was set to 10 seconds. When the values of the separation distance L were 0.3 mm and 0.4 mm, the number of defects was around 50. When the value of the separation distance L was 1.5 mm, the number of defects was around 50. Thus, the number of defects was not largely varied. However, when the value of the separation distance L was larger than 1.5 mm, the number of defects increased. In other words, it was confirmed that when the tip of the discharging opening 250 of the washing solution supplying nozzle 205 dips in the developing solution D and the value of the separation distance L is 0.4 mm or less, the number of defects can be decreased.

Second Example

This example is a second example of which the developing apparatus according to the third embodiment was used. In the second example, the developing process shown in FIG. 23 was performed for the substrate on which the resist had been coated and for which the exposing process had been performed. However, in the second example, the washing solution R was supplied using the washing solution supplying nozzle 205 shown in FIG. 25. Development defects were measured in the same manner as the first example. Practical test conditions of the second example are as follows.

Substrate: 8-inch semiconductor wafer
Film thickness of developing solution D: 1.5 mm
Time period of stationary development: 60 seconds
Scanning speed of washing solution supplying nozzle 205: 120 mm/second
Flow amount of washing solution R: 2.0 litters/second
Separation distance L: 0.4 mm, 1.5 mm
Flow amount of air: 2.0 litters/second
Inclination angle θ: 60°
Number of times scan-washing is performed (washing time period): 9 times (15 seconds)

First Comparison

This example is a second comparison performed in the same conditions as the second example except that gas was not supplied.

Results and Considerations of Second Example and First Comparison

Figure 33:
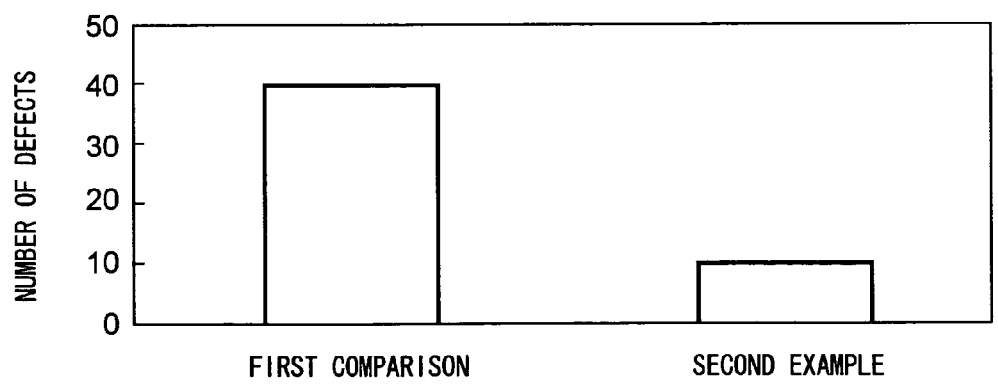
FIG. 33 is a characteristic chart showing an example performed to confirm an effect of the present invention.
Figure 34:
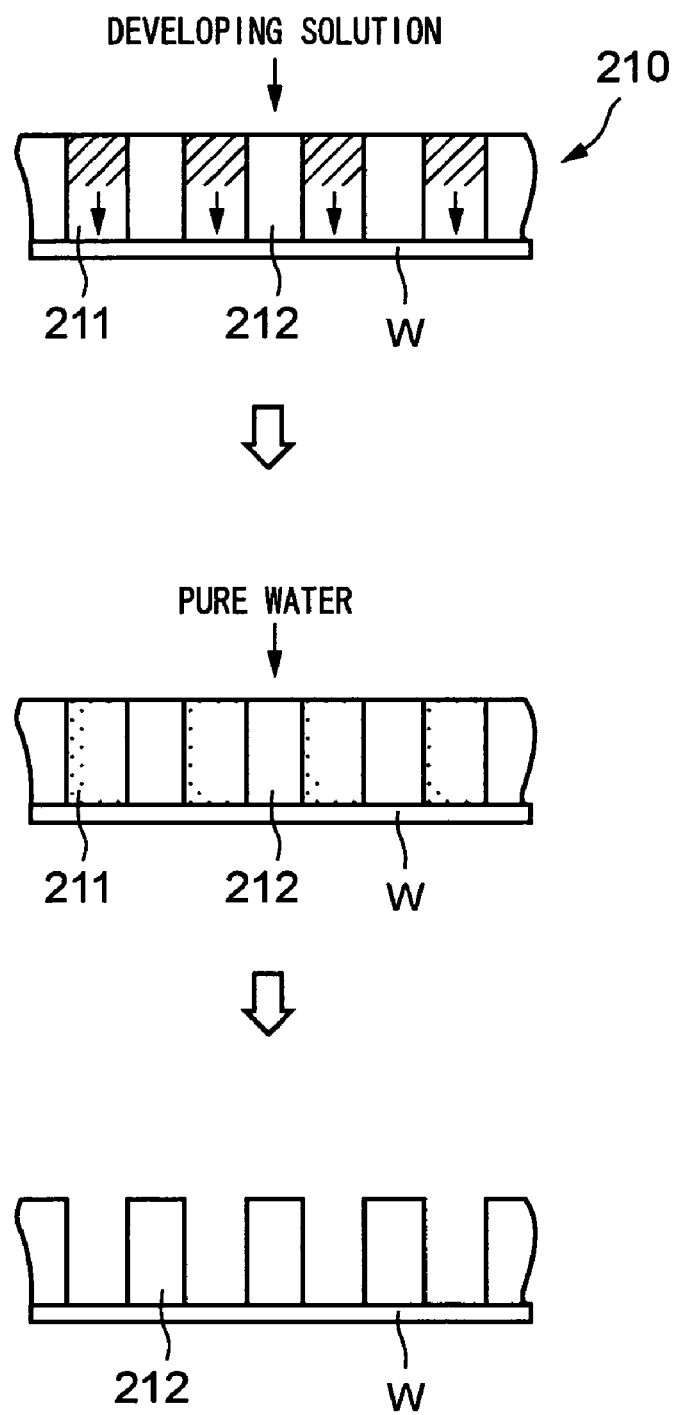
FIG. 34 is a schematic diagram describing a flow of steps of the developing process.
Figure 35A:
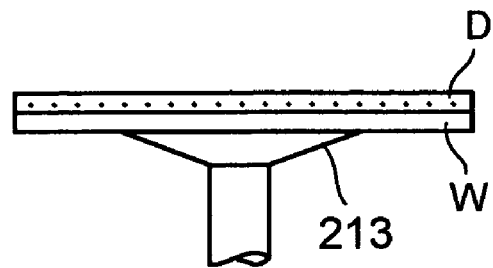
FIG. 35 is a schematic diagram describing steps of a developing process of a conventional developing apparatus.
Figure 35B:
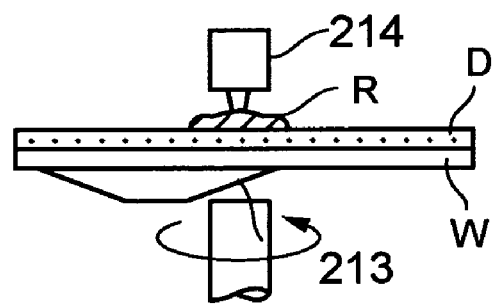
Figure 35C:
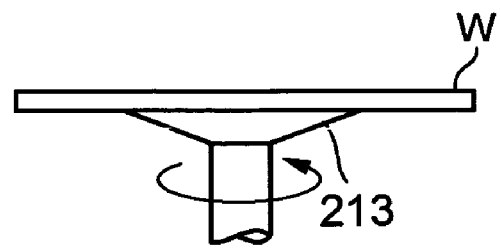

FIG. 33 shows the results of the second example and the first comparison. As a result of the first comparison of which gas was not supplied, the number of development defects was around 40. In contrast, the number of development defects of the second example of which gas was supplied was suppressed to around 10. In other words, it was confirmed that since gas is supplied, a flow of the developing solution D takes place, the flow of the developing solution D sweeps away deposit, and the washing solution R sweeps away the developing solution D, then the washing effect is improved.

Fourth Embodiment

Figure 36:
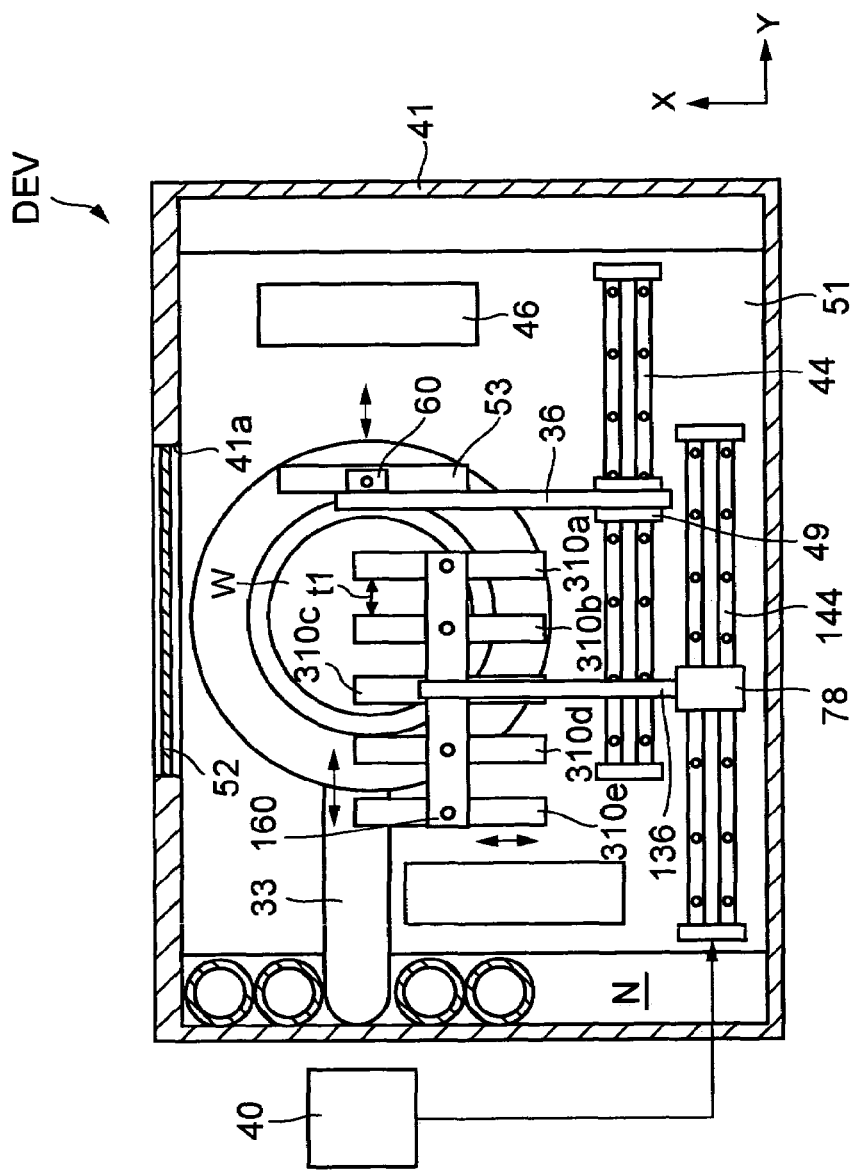
FIG. 36 is a plan view showing a developing processing unit according to a fourth embodiment of the present invention.
Figure 37:
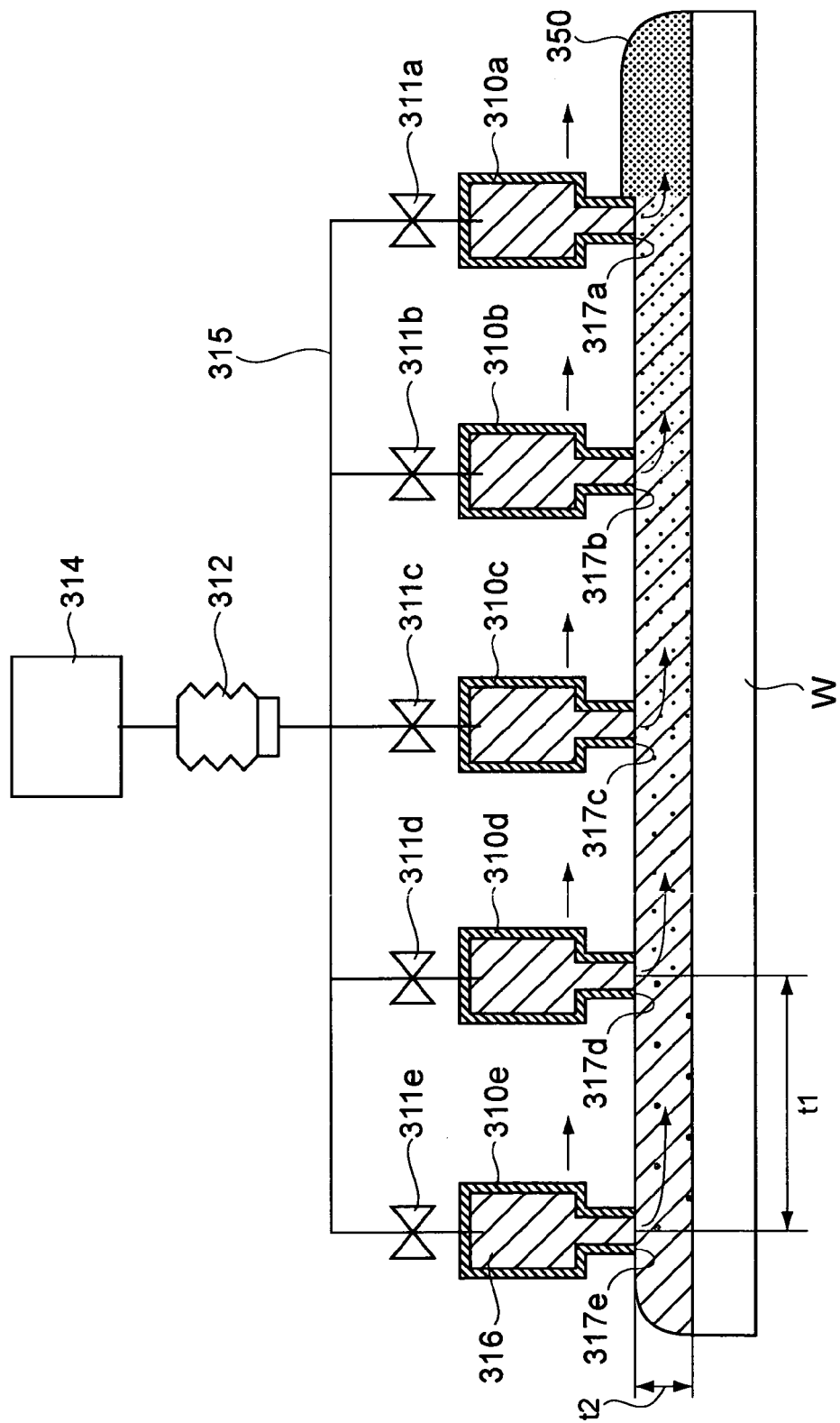
FIG. 37 is a side view showing the front surface of a wafer in the case that a plurality of nozzles are disposed.

Next, with reference to FIG. 36 to FIG. 38, a fourth embodiment of the present invention will be described. FIG. 36 is a plan view showing a developing processing unit (DEV) having a plurality of rinsing nozzles. FIG. 37 is a side view schematically showing the front surface of a wafer in the case that a plurality of rinsing nozzles are disposed. For convenience of description, the diameter of a wafer, the thickness of developing solution, the height of nozzles, and so forth shown in the drawing are different from those that are practically used.

As shown in FIG. 36, a plurality of rinsing nozzles, for example five rinsing nozzles 310a to 310e, are disposed in the moving direction thereof on the wafer W, namely in Y direction shown in FIG. 36. The rinsing nozzles 310a to 310e are held by a holding member 160 at intervals of t1. It is preferred that the value of t1 should be for example in the range from 1 cm to 10 cm. Of course, the value of t1 may be out of the range. The holding member 160 is held by a rinsing nozzle arm 136. The rinsing nozzle arm 136 is mounted on a motor 78. In the structure, as the motor 78 moves on a guide rail 144, the rinsing nozzles 310a to 310e can be moved on the wafer W.

As shown in FIG. 37, the rinsing nozzles 310a to 310e are connected to a rinsing solution supplying portion 314 through a pipe 315. Rinsing solution 316 stored in the rinsing solution supplying portion 314 is for example pure water. A bellows pump 312 is mounted on the pipe 315. Pressure of the bellows pump 312 causes the rinsing solution 316 to flow from the rinsing solution supplying portion 314 into the pipe 315. The bellows pump 312 causes the rinsing solution 316 that flows in the pipe 315 to be discharged from the rinsing nozzles 310a to 310e. Valves 311a to 311e are mounted on the pipe 315. The valves 311a to 311e adjust flow amounts of rinsing solution 316 that is discharged from the rinsing nozzles 310a to 310e.

Next, how the wafer W is rinsed using the rinsing nozzles 310a to 310e will be described. The motor 78 and the bellows pump 312 are operated so that while the rinsing nozzles 310a to 310e are discharging the rinsing solution 316, they are moved on the wafer W. At that point, discharging openings 317a to 317e are contacted with the developing solution 350 coated on the wafer W or the rinsing solution 316 on the wafer W so that the distance from the front surface of the wafer W to the tips of the rinsing nozzles 310a to 310e is kept at t2. Thus, the impact against the wafer W can be suppressed. As a result, the pattern collapse can be prevented. It is preferred that the value of t2 should be for example 0.4 mm or less.

When the rinsing nozzles 310a to 310e are moved, their front portions can push away the developing solution 350. Thus, the rinsing solution 316 discharged on the wafer W spreads on the wafer W. When the rinsing solution 316 spreads, a convection current may take place. The discharged rinsing solution 316 sinks nearly in the bottom of the developing solution 350 and spreads therein. As a result, the rinsing solution 316 causes impurities in the bottom of the developing solution 350 to be washed away and removed. On the other hand, the developing solution 350 pushes the rinsing solution 316. As a result, the rinsing solution 316 rises to around the front surface of the developing solution 350. The rinsing solution 316 that has risen flows on around the front surface of the developing solution 350. As a result, the rinsing solution 316 returns to around the discharging openings 317a to 317e. This convection current causes the developing solution, impurities, and so forth to circulate on the wafer W. As a result, the rinsing solution 316 cannot wash away the developing solution, impurities, and so forth. However, when the discharging openings 317a to 317e are contacted with the developing solution 350, the circulated impurities and so forth can be pushed away. As a result, the impurities and so forth can be removed from the substrate. Thus, the wafer W can be effectively washed.

When the rinsing solution 316 is discharged, the flow amounts of the rinsing nozzles 310a to 310e are gradually increased in the order from the forward rinsing nozzle 310a to the backward rinsing nozzle 310e in the moving direction thereof. The flow amounts of the rinsing solution 316 of the rinsing nozzles 310a to 310e are adjusted by the valves 311a to 311e, respectively. The rinsing effect is proportional to the flow amount of the rinsing solution 316 discharged from the rinsing nozzles 310a to 310e. On the other hand, the developing solution 350 is normally alkaline solution whose pH value is around 12. Thus, when for example neutral pure water as the rinsing solution 316 is suddenly discharged to the alkaline developing solution 350, a pH shock takes place. The pH shock is a phenomenon of which when two types of solutions whose pH values are largely different are mixed, impurities take place and adhere to a wafer W. Thus, when the flow amounts of the forward rinsing nozzle 310a to the backward rinsing nozzle 310e are gradually increased in the order in the moving direction thereof, the developing solution 350 can be gradually diluted. As a result, the pH values do not suddenly vary. Thus, since the pH shock can be suppressed, the wafer W can be effectively rinsed.

Next, with reference to FIG. 38, an example of which alkaline solutions whose pH values are different discharged from the rinsing nozzles 310a to 310e will be described.

Figure 38:
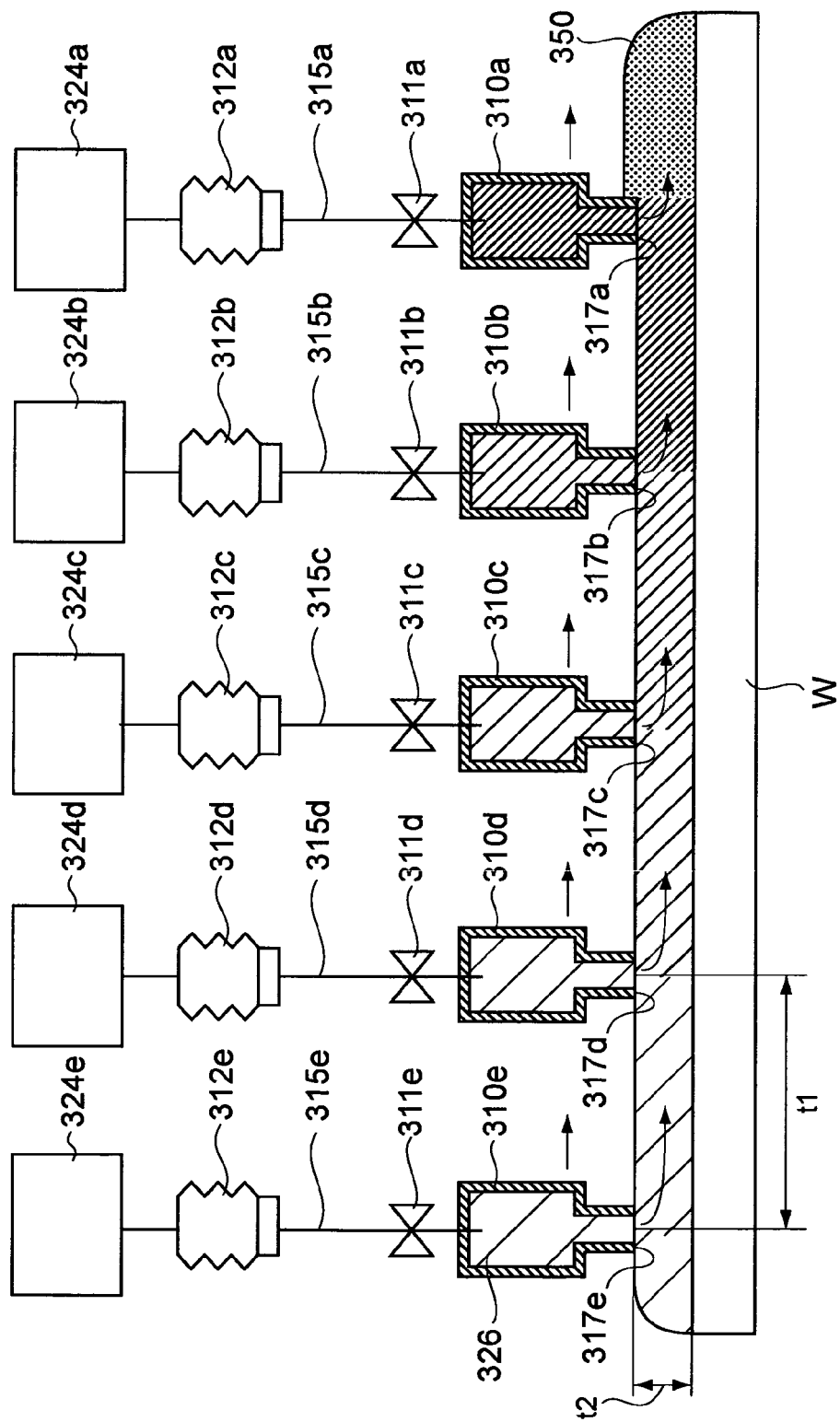
FIG. 38 is a schematic diagram showing a modification of an embodiment shown in FIG. 38.

FIG. 38 is a schematic diagram showing the front surface of a wafer in the case that a plurality of rinsing nozzles are disposed. For convenience of description, the diameter of a wafer, the thickness of developing solution, the height of nozzles, and so forth shown in FIG. 38 are different from those that are practically used. In FIG. 38, structural elements similar to those in the fourth embodiment are denoted by similar reference numerals.

As shown in FIG. 38, the rinsing nozzles 310a to 310e are connected to rinsing solution supplying portions 324a to 324e through pipes 315a to 315e, respectively. Alkaline solutions whose pH values are different, for example diluted developing solutions as rinsing solutions 326, are stored in the rinsing solution supplying portions 324a to 324d. On the other hand, for example neutral pure water as rinsing solution 326 is stored in the rinsing solution supplying portion 324e. Alkaline solution whose pH value is in the range from 9 to 10 is stored in the rinsing solution supplying portion 324a. Alkaline solution whose pH value is lower than the rinsing solution stored in the rinsing solution storing portion 324a is stored in the rinsing solution supplying portion 324b. Likewise, alkaline solutions whose pH values are gradually decreased are stored in the rinsing solution supplying portions 324c and 324d, respectively. Thus, the pH values of the rinsing solutions 326 discharged from the rinsing nozzles 310a to 310e are gradually decreased so that the pH value of the rinsing solution 326 discharged from the rinsing nozzle 310a is the highest and the pH value of the rinsing solution 326 discharged from the rinsing nozzle 310e is the lowest. Bellows pumps 312a to 312e are mounted on the pipes 315a to 315e, respectively. Pressures of the bellows pumps 312a to 312e cause the rinsing solutions 326 to flow from the rinsing solution supplying portions 324a to 324e into the pipes 315a to 315e, respectively. The bellows pumps 312a to 312e cause the rinsing solutions 326 that have flowed in the pipes 315a to 315e to be discharged from the rinsing nozzles 310a to 310e, respectively. In addition, valves 311a to 311e are mounted on the pipes 315a to 315e, respectively. The valves 311a to 311e can adjust the flow amounts of the rinsing solutions 326 discharged from the rinsing nozzles 310a to 310e, respectively.

Next, how a wafer W is rinsed using the rinsing nozzles 310a to 310e will be described. The motor 78 and the bellows pumps 312a to 312e are operated. While the rinsing nozzles 310a to 310e are discharging the rinsing solution 326, the rinsing nozzles 310a to 310e move on the wafer W. At that point, the discharging openings 317a to 317e are contacted with the developing solution 350 coated on the wafer W or the rinsing solution 326 on the wafer W. As a result, the impact against the wafer W can be suppressed. Thus, the pattern collapse can be prevented. In addition, as shown in FIG. 38, the front portion of the rinsing nozzle 310a can push away the developing solution 350.

When the wafer W is rinsed in such a manner, the rinsing nozzles 310a to 310e can discharge rinsing solutions whose pH values different. At that point, the rinsing solution discharged from the forward rinsing nozzle 310a in the moving direction of the rinsing nozzles 310a to 310e is alkaline solution whose pH value is around 10. The pH values of the rinsing solutions discharged from the rinsing nozzles 310a to 310e are gradually decreased in the order. The pH value of the rinsing solution discharged from the backward rinsing nozzle 310e is the lowest. Thus, while impurities are prevented from depositing, the rinsing solution can be gradually diluted. Finally, the wafer W can be washed with pure water without the pH shock.

According to the present embodiment, likewise, the flow amounts of rinsing solutions discharged from the rinsing nozzles 310a to 310e may be gradually increased in the order. In addition, before the rinsing solution is discharged, dispersant such as non-ionic surfactant may be mixed with the rinsing solution. For example, a surfactant tank that stores non-ionic surfactant is disposed. The surfactant tank is connected to a pipe. The rinsing solution and the non-ionic surfactant are mixed by a static mixer or the like. Thus, the surface tension of the rinsing solution can be suppressed. As a result, the pattern collapse can be more effectively prevented than the foregoing embodiments.

Fifth Embodiment

Next, with reference to FIG. 39 and FIG. 40, a fifth embodiment of the present invention will be described.

Figure 39:
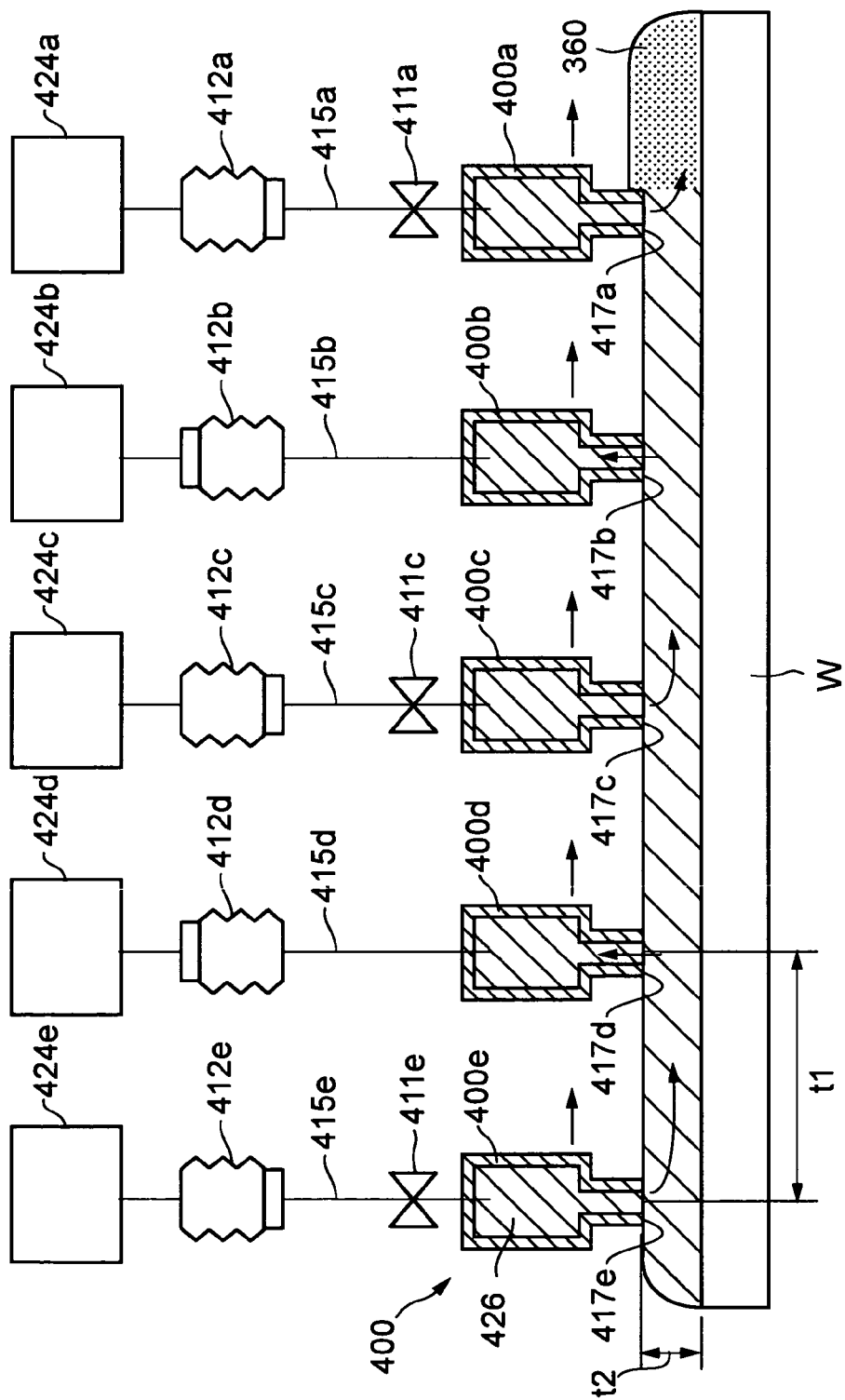
FIG. 39 is a schematic diagram according to a fifth embodiment of the present invention.

FIG. 39 is a schematic diagram showing a front surface of a wafer in the case that a plurality of rinsing nozzles are disposed. Like the foregoing embodiments, for convenience of description, the diameter of a wafer, the thickness of developing solution, the height of nozzles, and so forth are different from those that are practically used.

As shown in FIG. 39, a nozzle block 400 has a plurality of nozzles, for example five nozzles, that are disposed at predetermined intervals in the moving direction of the nozzle block 400. Among these nozzles, the nozzles 400a, 400c, and 400e are rinsing nozzles that discharge for example pure water, alkaline solution, or the like onto a wafer W. On the other hand, the nozzles 400b and 400d are sucking nozzles that suck impurities, residual developing solution, and residual rinsing solution on the wafer W.

The nozzles 400a to 400e are disposed at constant intervals of t1 and held by a holding member or the like (not shown). It is preferred that t1 should be in the range from 1 cm to 10 cm. Of course, t1 may be out of the range. Discharging openings 417a to 417e of the nozzles 400a to 400e are held so that the distance from the front surface of the wafer W to each of the discharging openings 417a to 417e is kept at t2. It is preferred that the value of t2 should be for example 0.4 mm or less. However, t2 may be any value as long as each of the nozzles 400a to 400e can contact the developing solution.

As shown in FIG. 39, the rinsing nozzles 400a, 400c, and 400e are connected to rinsing solution supplying portions 424a, 424c, and 424e through pipes 415a, 415c, and 415e, respectively. The rinsing solution supplying portions 424a, 424c, and 424e store pure water as rinsing solution 426. Bellows pumps 412a, 412c, and 412e are mounted on the pipes 415a, 415c, and 415e, respectively. Pressures of the bellows pumps 412a, 412c, and 412e cause the rinsing solution 426 to flow from the rinsing solution supplying portions 424a, 424c, and 424e into the pipes 415a, 415c, and 415e, respectively. The bellows pumps 412a, 412c, and 412e cause the rinsing solution 426 that has flowed in the pipes 415a, 415c, and 415e to be discharged from the rinsing nozzles 400a, 400c, and 400e, respectively. Valves 411a, 411c, and 411e are mounted on the pipes 415a, 415c, and 415e, respectively. The valves 411a, 411c, and 411e can adjust the flow amounts of the rinsing solutions 426 discharged from the rinsing nozzles 400a, 400c, and 400e, respectively.

The sucking nozzles 400b and 400d have sucking openings 417b and 417d, respectively. The sucking nozzles 417b and 417d are connected to drain reservoir portions 424b and 424d through pipes 415b and 415d, respectively. Bellows pumps 412b and 412d are mounted on the pipes 415b and 415d, respectively. Pressures of the bellows pumps 412b and 412d cause impurities, residual solution, and residual rinsing solution to flow to the drain reservoir portions 424b and 424d, respectively.

Next, how the wafer W is rinsed using the nozzles 400a to 400e will be described. The bellows pumps 412a, 412c, and 412e and a moving mechanism (not shown) are operated. While the rinsing nozzles 400a, 400c, and 400e are discharging the rinsing solution 426, they move on the wafer W. At that point, the discharging openings, the sucking openings, and the developing solution 360 coated on the wafer W are contacted. Thus, the impact against the wafer W can be suppressed. As a result, the pattern collapse can be prevented. In addition, since the rinsing nozzles 400a, 400c, and 400e are moved, the front portion of the developing solution 360 can push away the developing solution.

Since the bellows pumps 412b and 412d are operated while the rinsing nozzles 400a to 400e are being moved, the sucking nozzles 400b and 400d can suck impurities, residual developing solution, and residual rinsing solution on the wafer W.

As described above, impurities and so forth may drift in rinsing solution that is discharged from a rinsing nozzle and that resides on the wafer W. After time elapses, the impurities will deposit and reside on the front surface of the wafer W. However, since the impurities are sucked along with the rinsing solution, the impurities can be prevented from residing on the front surface of the wafer W. Thus, the wafer W can be effectively rinsed.

In addition, since rinsing nozzles and sucking nozzles are alternately disposed, developing solution, rinsing solution, impurities that deposit on the front surface of the wafer W, and impurities that are dispersed by discharged rinsing solution can be immediately sucked. Moreover, since the rinsing solution is sucked, the wafer W can be easily dried. Furthermore, since the rinsing nozzles and sucking nozzles are alternately disposed, the distance between the rinsing nozzles can be kept. Thus, processes can be effectively performed.

Figure 40:
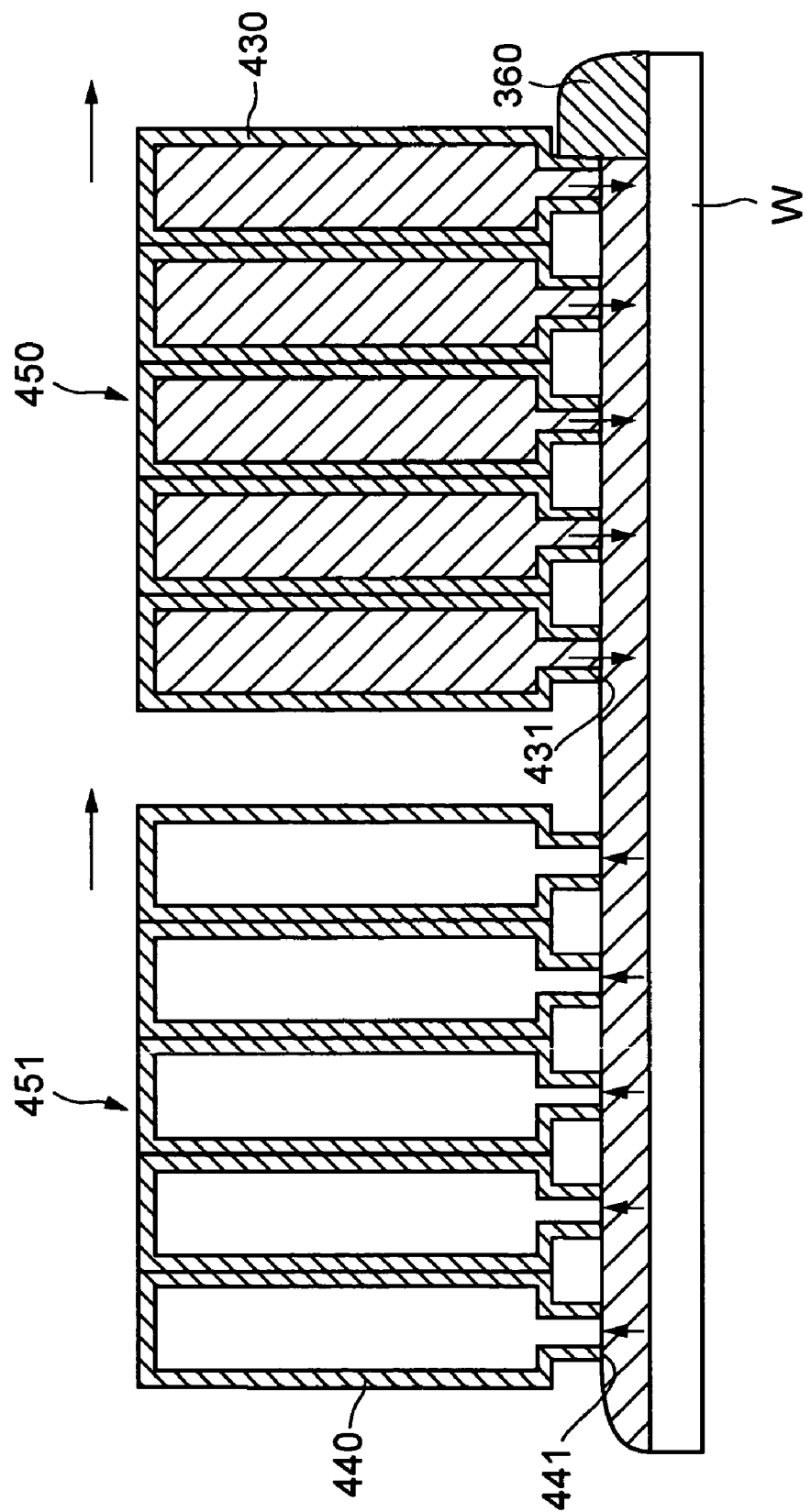
FIG. 40 is a schematic diagram showing a modification of the fifth embodiment of the present invention.

In addition, as shown in FIG. 40, a rinsing nozzle block 450 and a sucking nozzle block 451 may be disposed. The rinsing nozzle block 450 has only rinsing nozzles 430, for example five rinsing nozzles 430, disposed in the moving direction of the rinsing nozzle block 450. The sucking nozzle block 451 has only sucking nozzles, for example five sucking nozzles 440, disposed in the moving direction of the sucking nozzle block 451. In this case, the rinsing nozzle block 450 and the sucking nozzle block 451 are placed at the forward and backward positions in the moving direction thereof, respectively.

First of all, while the rinsing nozzle block 450 is being moved, the rinsing nozzle block 450 discharges the rinsing solution. At that point, discharging openings are contacted to the developing solution. In reality, it is preferred that the distance between each of the discharging openings and the front surface of the wafer W is 0.4 mm or less. Thus, the impact against the wafer W can be suppressed. As a result, the pattern collapse can be effectively prevented.

Rinsing solution or developing solution that resides on the wafer W is sucked by the sucking nozzle block 451. At that point, sucking openings 441 are contacted to the developing solution or rinsing solution that resides on the wafer W. Thus, impurities can be sucked. As a result, the wafer W can be easily dried. Consequently, processes can be effectively performed.

Likewise, according to the present embodiment, the flow amounts of rinsing solutions discharged from rinsing nozzles may be gradually increased in the moving direction thereof. Alternatively, the pH values of alkaline solutions discharged from the rinsing nozzles may be gradually decreased in the moving direction thereof. In addition, to weaken the surface tension of rinsing solution, dispersant such as non-ionic surfactant may be mixed therewith.

INDUSTRIAL APPLICABILITY

As described above, according to the present invention, development defects can be decreased. In addition, developing solution can be washed in a short time.

Moreover, when processing solution such as developing solution is washed away, rinsing solution can be equally supplied onto a substrate.

Furthermore, when processing solution contains for example dissolvable substance of resist or rinsing solution contains impurities, they can be prevented from adhering to a substrate.

The invention claimed is:

1. A substrate processing apparatus, comprising:
   an elongated washing nozzle that includes a discharge opening and that discharges a washing solution onto a front surface of a substrate on which a processing solution has been coated;
   distance keeping means for keeping a distance between the discharge opening and the front surface of the substrate constant so as to contact the discharge opening to the processing solution when the washing solution is discharged from the washing nozzle; and
   moving means for moving at least one of the washing nozzle or the substrate relative to the other one of the washing nozzle or the substrate such that the washing nozzle pushes away the processing solution and a discharge pressure of the washing solution sweeps out the processing solution.

2. The substrate processing apparatus as set forth in claim 1, wherein the distance keeping means is configured to keep the distance between the discharge opening and the front surface of the substrate at 0.4 mm or less.

3. The substrate processing apparatus as set forth in claim 1, wherein the moving means includes parallel moving means for moving the washing nozzle substantially in parallel with the front surface of the substrate and substantially perpendicular to the elongated washing nozzle while the washing nozzle is discharging the washing solution.

4. The substrate processing apparatus as set forth in claim 3,
   wherein the washing nozzle includes a plurality of washing nozzle members, and
   wherein the plurality of washing nozzle members are disposed at substantially constant intervals with respect to a direction in which the washing nozzle members are moved by the moving means.

5. The substrate processing apparatus as set forth in claim 4, further comprising:
   flow amount adjusting means for adjusting a flow amount of a washing solution discharged from respective ones of the plurality of washing nozzle members.

6. The substrate processing apparatus as set forth in claim 5, wherein the respective flow amounts of the respective washing solutions discharged from respective ones of the plurality of washing nozzle members are gradually increased in order from a forward washing nozzle member to a rearward washing nozzle member with respect to the direction in which the plurality of washing nozzle members are moved.

7. The substrate processing apparatus as set forth in claim 5, wherein pH values of the respective washing solutions discharged from respective ones of the plurality of washing nozzle members are gradually decreased in order from a forward washing nozzle member to a rearward washing nozzle member with respect to the direction in which the plurality of washing nozzle members are moved.

8. The substrate processing apparatus as set forth in claim 1, wherein a length of the washing nozzle is substantially the same as a diameter of the substrate.

9. The substrate processing apparatus as set forth in claim 3, further comprising:
   a sucking nozzle for sucking the washing solution that has been discharged by the washing nozzle and that resides on the substrate.

10. The substrate processing apparatus as set forth in claim 9,
    wherein the washing nozzle includes a plurality of washing nozzle members, and
    wherein the washing nozzle members and a plurality of sucking nozzles are alternately disposed with respect to a direction in which the plurality of washing nozzle members and the plurality of sucking nozzles are moved.

11. The substrate processing apparatus as set forth in claim 9,
wherein the washing nozzle includes a plurality of washing nozzle members,
wherein the plurality of washing nozzle members are disposed one in front of another with respect to a direction in which the washing nozzle members are moved, and
wherein the sucking nozzle is preceded by the washing nozzle members with respect to the direction in which the sucking nozzle and the plurality of washing nozzle members are moved.

12. The substrate processing apparatus as set forth in claim 2, wherein the washing solution contains non-ionic surfactant that weakens surface tension of the washing solution.

13. A developing apparatus that develops a substrate on which resist has been coated and an exposing process has been performed, comprising:
a substrate holding portion that horizontally holds the substrate;
a developing solution supplying nozzle that supplies a developing solution onto the front surface of the substrate held by the substrate holding portion;
a washing solution supplying nozzle that includes a discharge opening formed with a length equal to or larger than the width of an effective area of the substrate and that supplies a washing solution onto a front surface of the substrate on which the developing solution has been coated; and
a moving mechanism that moves the washing solution supplying nozzle from a first end side of the substrate to a second end side of the substrate in such a manner that a lower end portion of the discharge opening is lower than a top surface of the developing solution and a separation distance between the lower end portion of the discharge opening and the front surface of the substrate is 0.4 mm or less such that the washing solution supplying nozzle pushes away the developing solution and a discharge pressure of the washing solution sweeps out the developing solution.

14. A developing apparatus that develops a substrate on which resist has been coated and an exposing process has been performed, comprising:
a substrate holding portion that horizontally holds the substrate;
a developing solution supplying nozzle that supplies a developing solution onto the front surface of the substrate held by the substrate holding portion;
a washing solution supplying nozzle that includes a discharge opening formed with a length equal to or larger than the width of an effective area of the substrate and that supplies a washing solution onto a front surface of the substrate on which the developing solution has been coated;
a gas blowing opening that is disposed on a forward side portion of the washing solution supplying nozzle with respect to a direction in which the washing solution supplying nozzle is moved and that is inclined with respect to the front surface of the substrate; and
a moving mechanism that moves the washing solution supplying nozzle from a first end side of the substrate to a second end side of the substrate in such a manner that a lower end portion of the discharge opening is lower than a top surface of the developing solution such that the washing solution supplying nozzle pushes away the developing solution and a discharge pressure of the washing solution sweeps out the developing solution.

15. The developing apparatus as set forth in claim 13 or 14, wherein the washing solution supplying nozzle includes a plurality of discharging openings disposed one in front of another with respect to the direction in which the washing solution supplying nozzle is moved.

16. The developing apparatus as set forth in claim 15, wherein a flow amount adjusting portion is disposed at each of the discharging openings.

17. The developing apparatus as set forth in claim 13, wherein after the substrate on which the developing solution has been coated is rotated for a predetermined time period, the washing solution is supplied.

18. The developing apparatus as set forth in claim 13, wherein after the substrate is washed by moving the washing solution supplying nozzle from the first end side of the substrate to the second end side thereof while the washing solution is discharged from the discharge opening thereof, the substrate is washed by rotating the substrate while the washing solution is supplied to a center portion of the substrate.

19. A substrate processing apparatus, comprising:
means for supplying processing solution onto a substrate;
an elongated nozzle that discharges a rinsing solution containing a first processing agent that weakens surface tension of the rinsing solution onto the substrate; and
moving means for moving at least one of the elongated nozzle or the substrate relative to the other one of the elongated nozzle or substrate such that the elongated nozzle pushes away the processing solution and a discharge pressure of the rinsing solution sweeps out the processing solution.

20. The substrate processing apparatus as set forth in claim 19, wherein the first processing agent is non-ionic surfactant.

21. The substrate processing apparatus as set forth in claim 19, wherein the rinsing solution also contains a second processing agent that disperses impurities contained in the processing solution and the rinsing solution.

22. The substrate processing apparatus as set forth in claim 21, wherein the second processing agent is negative-ionic surfactant.

23. The substrate processing apparatus as set forth in claim 19, wherein the moving means includes a mechanism that moves the nozzle at least horizontally on the substrate in a direction perpendicular to a longitudinal direction of the nozzle,
wherein the rinsing solution is discharged while the nozzle is moved by the moving mechanism.

24. The substrate processing apparatus as set forth in claim 23, wherein a discharging amount of the rinsing solution is in the range from 40 ml to 500 ml per substrate.

25. The substrate processing apparatus as set forth in claim 23, wherein the length of the nozzle is substantially the same as the diameter of the substrate or larger than the diameter of the substrate.

26. The substrate processing apparatus as set forth in claim 23, wherein the nozzle is configured to discharge the rinsing solution while the nozzle is in contact with the processing solution.

27. The substrate processing apparatus as set forth in claim 26,
wherein the nozzle includes:
a right-angle portion that is formed on a forward side of the nozzle with respect to a direction in which the nozzle is moved and that upwardly extends from a lower end portion that is in contact with the processing solution on the substrate; and a curved portion that is formed on a rearward side of the nozzle with respect to the the direction in which the nozzle is moved and that upwardly extends from the lower end portion.

28. The substrate processing apparatus as set forth in claim 26, wherein the nozzle includes means for discharging the rinsing solution at an angle with respect to a direction in which the nozzle is moved.

29. The substrate processing apparatus as set forth in claim 19, wherein the moving means includes a mechanism that rotates the nozzle on a plane in parallel with the front surface of the substrate, and wherein the rinsing solution is discharged while the nozzle is rotated by the rotating mechanism.

30. The substrate processing apparatus as set forth in claim 29, wherein the length of the nozzle is substantially the same as the diameter of the substrate.

31. The substrate processing apparatus as set forth in claim 30, wherein the nozzle is configured so that a first discharging direction of the rinsing solution from a center portion of the nozzle to a first end portion of the nozzles and a second discharging direction of the rinsing solution from the center portion of the nozzle to a second end portion of the nozzle form an angle with respect to a rotation direction in which the nozzle is rotated.

32. The substrate processing apparatus as set forth in claim 30, wherein the nozzle includes means for discharging the rinsing solution so that a discharging angle between the rinsing solution and the substrate is gradually increased with respect to a direction that extends from a center portion of the nozzle to an end portion thereof.

33. The substrate processing apparatus as set forth in claim 30, further comprising:

means for discharging the rinsing solution so that a discharging amount of the rinsing solution is gradually decreased with respect to a direction that extends from the center portion of the nozzle to an end portion thereof.

34. A substrate processing apparatus, comprising:

a rotatably holding portion that rotatably holds a substrate;

means for supplying processing solution onto the substrate held by the rotatably holding portion;

an elongated nozzle that discharges rinsing solution that contains a first processing agent that weakens surface tension of the rinsing solution onto the substrate on which processing solution has been supplied and that is being rotated by the rotatably holding portion; and moving means for moving at least one of the elongated nozzle or the substrate relative to the other one of the elongated nozzle or the substrate such that the elongated nozzle pushes away the processing solution and a discharge pressure of the rinsing solution sweeps out the processing solution.

35. The substrate processing apparatus as set forth in claim 34, wherein the first processing agent is non-ionic surfactant.

36. The substrate processing apparatus as set forth in claim 34, wherein the rinsing solution also contains a second processing agent that disperses impurities that reside in the processing solution and the rinsing solution.

37. The substrate processing apparatus as set forth in claim 36, wherein the second processing agent is negative-ionic surfactant.

38. The substrate processing apparatus as set forth in claim 34, wherein a discharging amount of the rinsing solution is in the range from 40 ml to 500 ml per substrate.

39. The substrate processing apparatus as set forth in claim 34, wherein a length of the nozzle is substantially the same as a diameter of the substrate or smaller than the diameter of the substrate.

40. The substrate processing apparatus as set forth in claim 34, wherein a number of rotations of the substrate is 500 rpm or less.

41. The substrate processing apparatus as set forth in claim 40, wherein a number of rotations of the substrate is 100 rpm or less.

42. The substrate processing apparatus as set forth in claim 34, wherein the nozzle is configured to discharge the rinsing solution while the nozzle is in contact with the processing solution.

43. The substrate processing apparatus as set forth in claim 39, wherein the length of the nozzle is substantially the same as the diameter of the substrate, and wherein a first discharging direction of the rinsing solution from a center portion of the nozzle to an end portion thereof and a second discharging direction of the rinsing solution from the center portion of the nozzle to a second end portion of the nozzle form an angle with respect to a rotation direction in which the nozzle is rotated relative to the substrate.

44. The substrate processing apparatus as set forth in claim 39, wherein the nozzle includes means for discharging the rinsing solution so that a discharging angle between the rinsing solution and the substrate is gradually increased with respect to a direction that extends from a center portion of the nozzle to the end portion thereof, and wherein the length of the nozzle is substantially the same as the diameter of the substrate.

45. The substrate processing apparatus as set forth in claim 39, further comprising:

means for discharging the rinsing solution so that a discharging amount of the rinsing solution is gradually decreased with respect to a direction that extends from a center portion of the substrate to the periphery portion thereof, and wherein the length of the nozzle is substantially the same as the radius of the substrate.

46. The substrate processing apparatus as set forth in claim 39, further comprising:

means for discharging the rinsing solution so that a discharging amount of the rinsing solution is gradually decreased with respect to a direction that extends from a center portion of the nozzle to the end portion thereof, and wherein the length of the nozzle is substantially the same as the diameter of the substrate.

47. A substrate processing method, comprising the steps of:

supplying processing solution onto a substrate;

moving an elongated nozzle having a discharging opening relative to the substrate on which the processing solution has been supplied such that the elongated nozzle pushes away the processing solution; and discharging a rinsing solution containing a first processing agent that weakens surface tension of the rinsing solution through the discharging opening while moving the elongated nozzle such that a discharge pressure of the rinsing solution sweeps out the processing solution.

48. A substrate processing method, comprising the steps of:

supplying processing solution onto a substrate;

rotating the substrate on which the processing solution has been supplied; and discharging rinsing solution containing first processing agent that weakens surface tension of the rinsing solution onto the substrate through a discharging opening of an elongated nozzle such that the elongated nozzle pushes away the processing solution and a discharge pressure of the rinsing solution sweeps out the processing solution.

49. The developing apparatus as set forth in claim 14, wherein after the substrate on which the developing solution has been coated is rotated for a predetermined time period, the washing solution is supplied.

50. The developing apparatus as set forth in claim 14, wherein after the substrate is washed by moving the washing solution supplying nozzle from the first end side of the substrate to the second end side thereof while the washing solution is discharged from the discharge opening thereof, the substrate is washed by rotating the substrate while the washing solution is supplied to a center portion of the substrate.

* * * * *